United States Patent

Saitoh et al.

[11] Patent Number: 6,154,719
[45] Date of Patent: *Nov. 28, 2000

[54] LOGIC SIMULATION SYSTEM AND METHOD

[75] Inventors: Minoru Saitoh; Akiko Satoh, both of Kawasaki, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/985,743

[22] Filed: Dec. 5, 1997

Related U.S. Application Data

[63] Continuation of application No. 08/402,658, Mar. 13, 1995, abandoned.

[30] Foreign Application Priority Data

Mar. 11, 1994 [JP] Japan ................ 6-041163
Mar. 7, 1995 [JP] Japan ................ 7-46780

[51] Int. Cl.⁷ ............................................. G06F 17/50
[52] U.S. Cl. ........................... 703/13; 703/14; 703/15
[58] Field of Search ................... 364/578, 489, 364/572; 395/500.34, 500.36; 703/13–15, 22; 716/1, 16

[56] References Cited

U.S. PATENT DOCUMENTS

| | | |
|---|---|---|
| 4,967,386 | 10/1990 | Maeda et al. . |
| 4,970,664 | 11/1990 | Kaiser et al. . |
| 5,111,143 | 5/1992 | Lazansky et al. ............ 364/578 |
| 5,111,413 | 5/1992 | Lazansky et al. . |
| 5,220,512 | 6/1993 | Watkins et al. . |
| 5,251,159 | 10/1993 | Rowson ...................... 364/578 |
| 5,287,289 | 2/1994 | Kageyama et al. . |
| 5,473,546 | 12/1995 | Filseth ........................ 364/489 |
| 5,555,201 | 9/1996 | Dangelo et al. ............. 364/489 |
| 5,801,958 | 9/1998 | Dangelo et al. ............. 364/489 |
| 5,831,869 | 11/1998 | Ellis et al. .................. 364/490 |

FOREIGN PATENT DOCUMENTS

| | | | |
|---|---|---|---|
| 0 598 476 A2 | 9/1993 | European Pat. Off. ........ G06F 15/60 |
| 0598476A2 | 9/1993 | European Pat. Off. ........ G06F 15/60 |

OTHER PUBLICATIONS

The Essence of Digital Design, Barry Wilkinson, ISBN 0–13–570110–4, pp. 30–35, 47–49, 106–109, 112–113, 1998.

*Primary Examiner*—Kevin J. Teska
*Assistant Examiner*—Lonnie A. Knox
*Attorney, Agent, or Firm*—Staas & Halsey, LLP

[57] ABSTRACT

Data in a data base that describe a logic circuit are converted to a simulation model, and simulations are performed based on them. When it is desired to change a part of the circuit while a simulation is in progress, a tentative correction is made by directly changing the simulation model without entering logics to the data base again. Simulation is continued based on the changed simulation model, then, after the action has been confirmed, the contents of the change are reflected on the data base. In this way, a circuit can easily be changed while simulation is in progress.

4 Claims, 57 Drawing Sheets

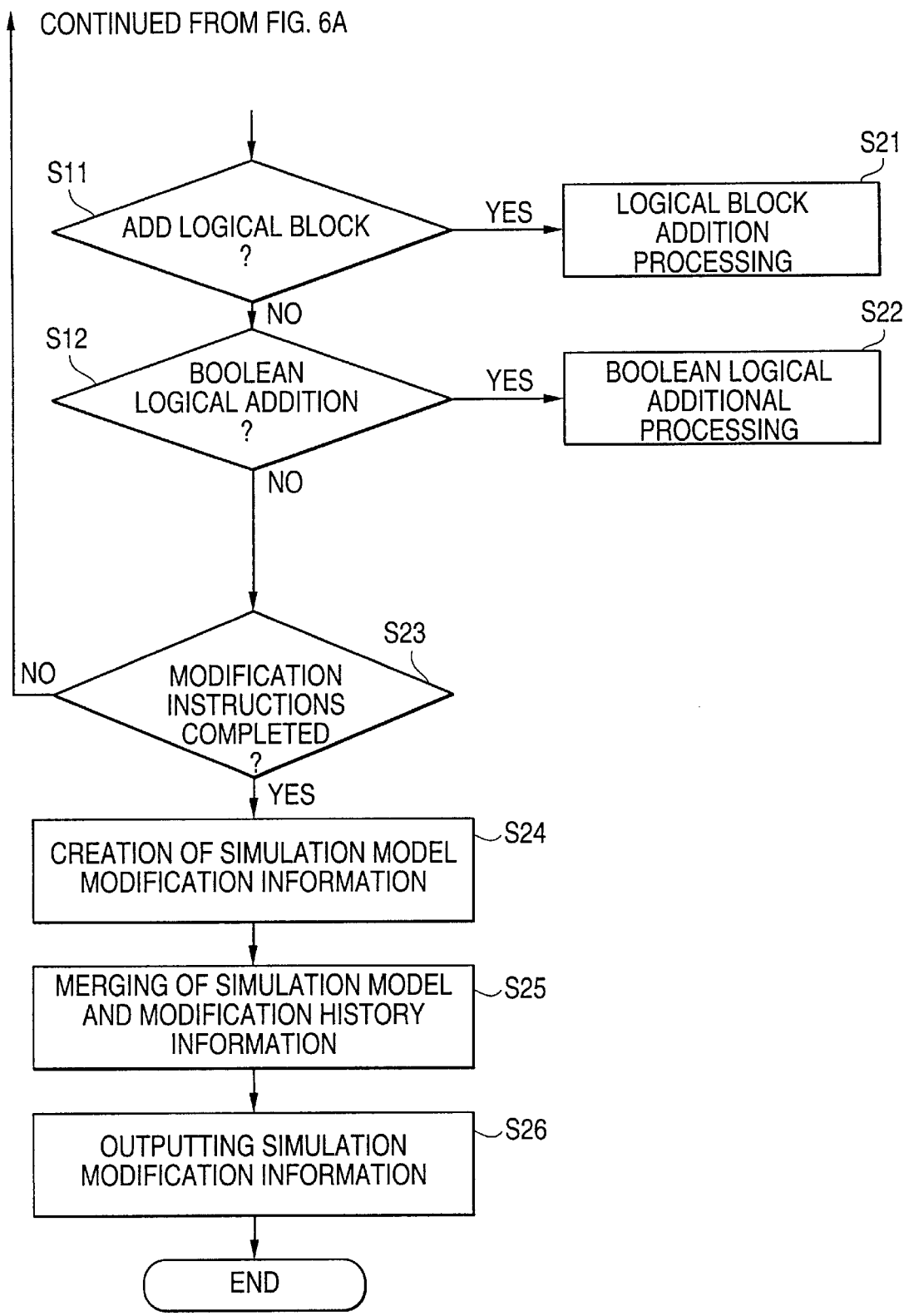

FIG. 10

| FS | MD | CL | RF | FBLK01 |

PATH: /          1)
LINE( 1/71)      2)
 3)         4)         5)

▼  ▲  UP  CMD

| 1  6)  | +CHO 7)       |
|--------|---------------|
| 2      | +DI           |
| 3      | +DO0          |
| 4      | +DO1          |
| 5      | +DO2          |
| 6      | +DO3          |
| 7      | +SET          |
| 8      | +S0           |
| 9      | -CLK          |
| 10     | -CS1          |
| 11     | -DO0          |
| 12     | -DO1          |
| 13     | -DO2          |
| 14     | -DO3          |
| 15     | -LA6          |
| 16     | -LA7          |
| 17     | -S1           |
| 18     | %AAA6A11%DI   |
| 19     | %AAA6D11%DI   |
| 20     | %AAA6G11%DI   |
| 21     | %AAA6K11%DI   |
| 22     | %ILCADD       |
| 23     | %MONSTB       |
| 24     | AAAXA         |
| 25     | AAAXD         |
| 26     | AAAXG         |
| 27     | AAAXK         |
| 28     | AAAXN         |
| 29     | AAA3E         |
| 30     | AAA3G         |

NOTE:
1) CURRENT PATH NAME
2) FIRST DISPLAY LINE NUMBER/TOTAL NUMBER OF LINES
3) SCROLL SYMBOL
4) FBLK COMMAND TO HIGHER HIERARCHICAL LEVEL
5) FBLK COMMAND MENU
6) LINE NUMBER
7) BLOCK NAME

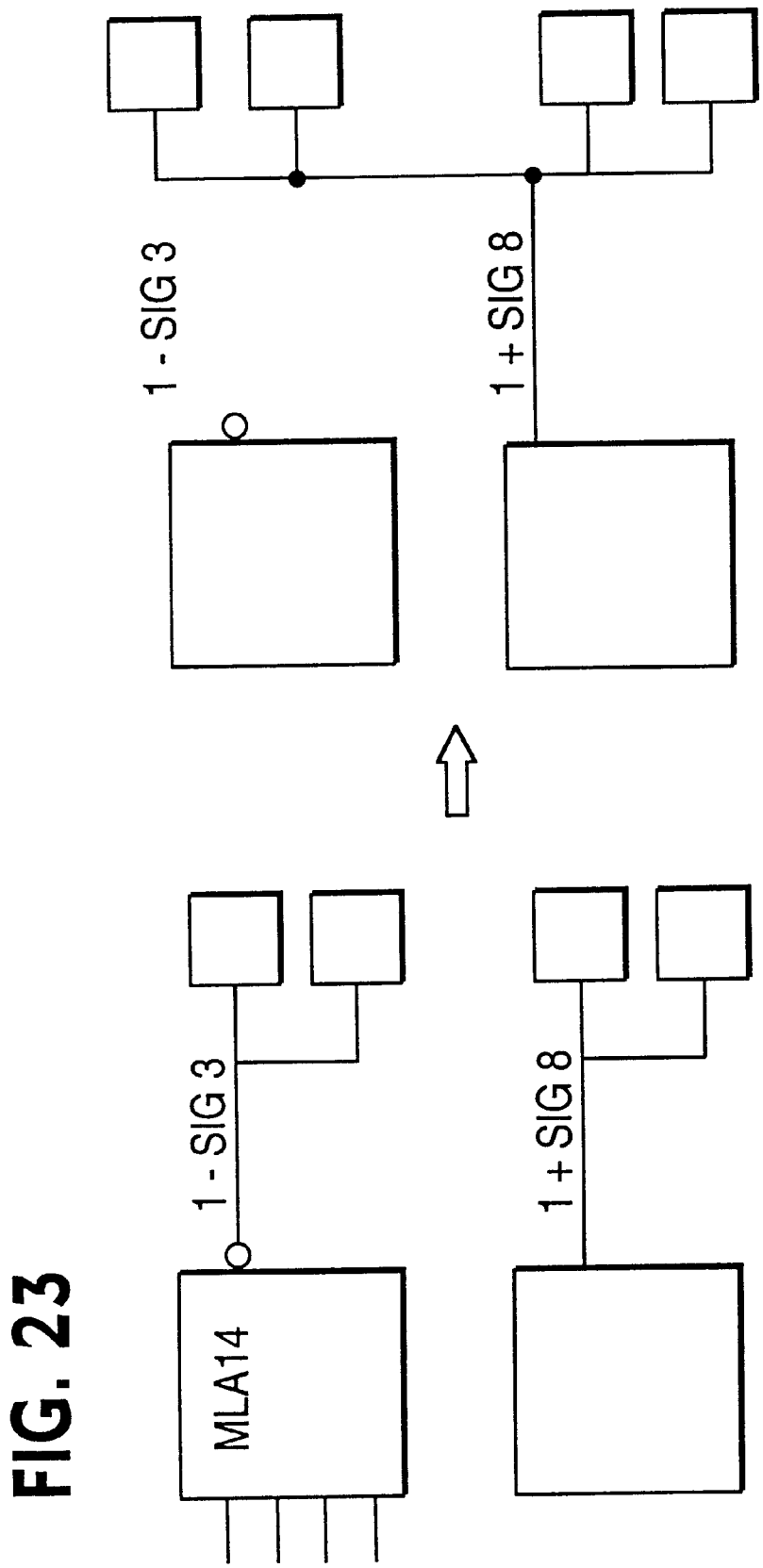

FIG. 26

| FUNCTION | AND / NAND | OR / NOR | EOR / ENOR |
|---|---|---|---|
| MACRO NAME | IAND | IOR | IEOR |
| EXTERIOR VIEW OF MACRO | DI1 DI2 DI3 DI4 −DO +DO | DI1 DI2 DI3 DI4 −DO +DO | DI1 DI2 DI3 DI4 −DO +DO |
| OPEN | CONNECTED TO 1% | CONNECTED TO 0% | CONNECTED TO 0% |

| FUNCTION | ILATCHS (SET) | ILATCHR (RESET) |
|---|---|---|
| EXTERIOR | ILATCHS | ILATCHR |
| EXTERIOR VIEW OF MACRO | CLK DI SET/RESET +DO | CLK DI SET/RESET +DO |
| OPEN | CONNECTED TO 0% | CONNECTED TO 0% |

%: CONSTANT

FIG. 30

```
<< LOGIC MENU >>                                    SCRL ⇄ CUR
0001  (BOOL) 'BOOL01' BEGIN:
0002    <INPUTS> I1, I2, I3, I4;
0003    <OUTPUTS> O1, O2;
0004    <LOGIC>
0005      ¬110=I1,
0006      ¬120=I2,
0007       210=I1 & I20,
0008       220=110 & I2,
0009      ¬130=I3,
0010      ¬140=I4,
0011       230=I3 & I30,
0012       240=I30 & I4,
0013       O1= 210   220   230   240,
0014    ¬  O2= 210   220   230   240;
0015  END;
0016
0017
-------------------------------------------------
PRESS ENTER KEY  : EXEC     PF7 KEY  : UP
      PP3 KEY    : CANCEL   PF8 KEY  : DOWN
```

```
(BOOL) 'BOOL_EXPO1' BEGIN;
  < INPUTS > OA, OB, OC, OD;
  < OUTPUTS > O5, O6;
  < LOGIC >   ¬200 = OA & OB,
              ¬100 = OA,
               210 = 100 & OC,
               O5 = 200 | 210,
              ¬O6 = OD;
END;
```

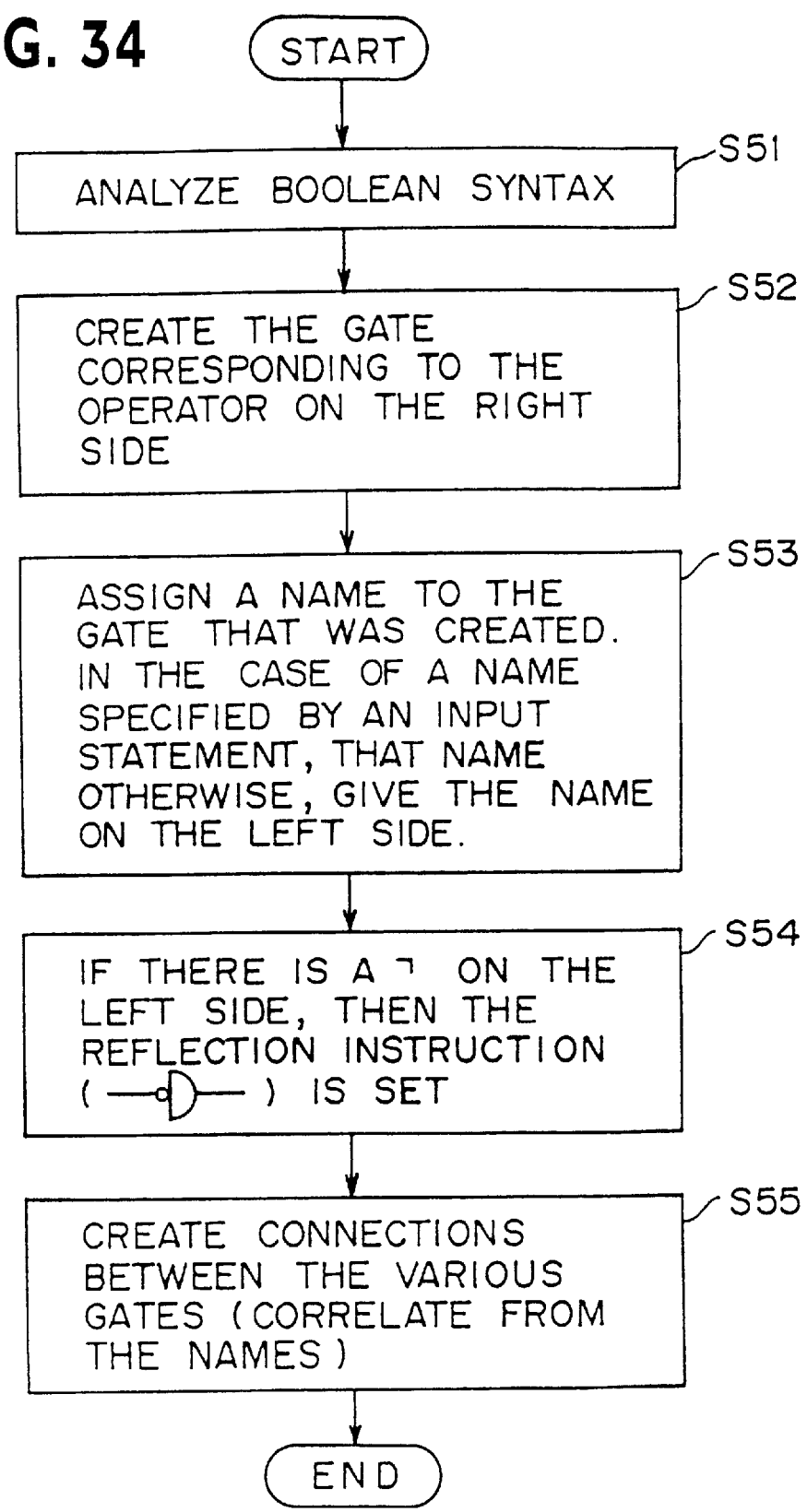

FIG. 37

| GATE NO. | GATE TYPE | FANIN-1 | FANIN-2 | FANIN-3 | FANIN-4 | FANOUT POINTER | | FANOUT MEMORY | END-BIT |
|---|---|---|---|---|---|---|---|---|---|
| 0 | CONST0 | 0 | 0 | 0 | 0 | 0 | 0 | 0 | 1 |
| 1 | CONST1 | 0 | 0 | 0 | 0 | 0 | 1 | 5 | 1 |
| 2 | AND | 1 | 1 | 1 | 1 | 1 | 2 | 6 | 0 |
| 3 | AND | 1 | 1 | 1 | 1 | 1 | 3 | 7 | 1 |
| 4 | AND | 1 | 1 | 1 | 1 | 0 | | | |
| 5 | AND | 2 | 3 | 1 | 1 | 2 | | | |
| 6 | AND | 5 | 1 | 1 | 1 | 0 | | | |
| 7 | AND | 5 | 1 | 1 | 1 | 0 | | | |
| 8 | | | | | | | | | |
| 9 | | | | | | | | | |

FIG. 39

| GATE NO. | GATE TYPE | FANIN-1 | FANIN-2 | FANIN-3 | FANIN-4 | FANOUT POINTER | | FANOUT MEMORY | END-BIT |
|---|---|---|---|---|---|---|---|---|---|
| 0 | CONST0 | 0 | 0 | 0 | 0 | 0 | 0 | 0 | 1 |
| 1 | CONST1 | 0 | 0 | 0 | 0 | 0 | 1 | 5 | 1 |
| 2 | AND | 1 | 1 | 1 | 1 | 0 | 2 | 6 | 0 |
| 3 | AND | 1 | 1 | 1 | 1 | 4 | 3 | 7 | 1 |
| 4 | AND | 1 | 1 | 1 | 1 | 4 | 4 | 8 | 1 |
| 5 | AND | 11 | 1 | 1 | 1 | 0 | 5 | | |
| 6 | AND | 8 | 1 | 1 | 1 | 0 | 6 | | |
| 7 | AND | 8 | 1 | 1 | 1 | 0 | 7 | | |
| 8 | OR | 3 | 4 | 0 | 0 | 2 | 8 | | |
| 9 | | | | | | | 9 | | |

FIG. 47
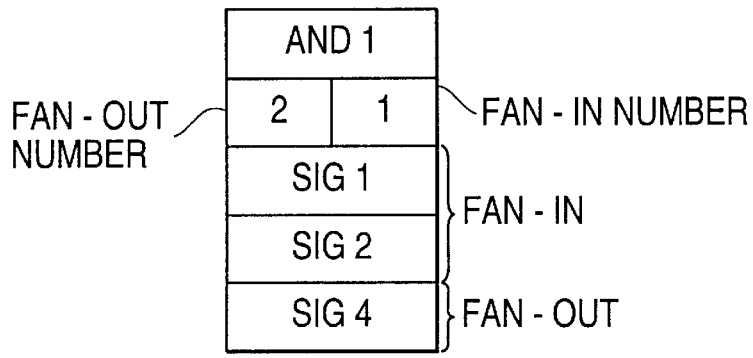
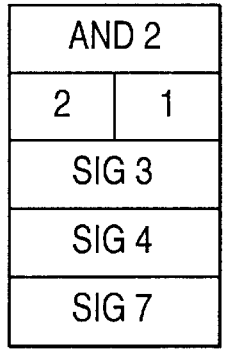
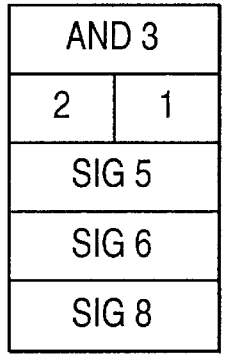
FIG. 49
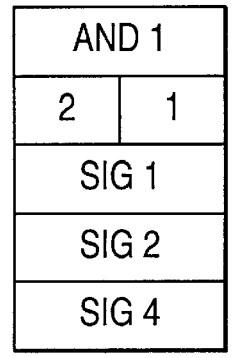
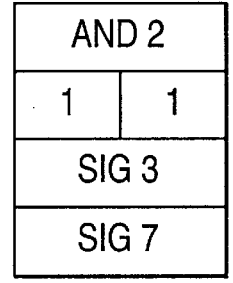
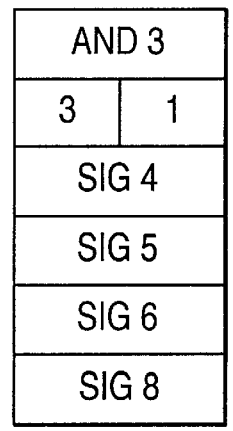

FIG. 48
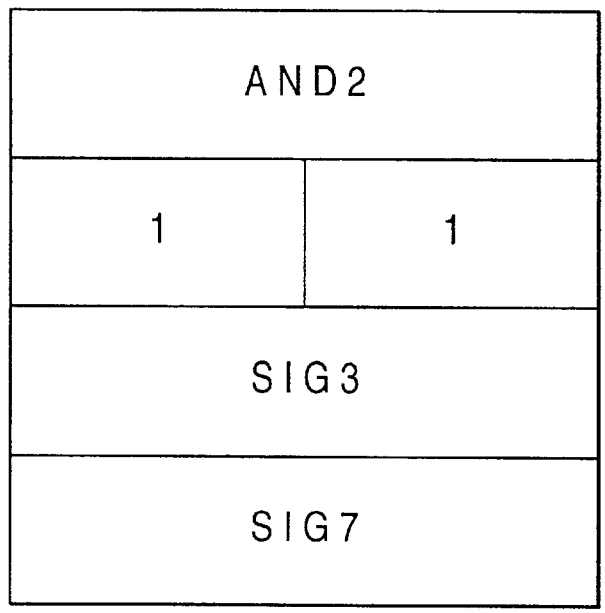
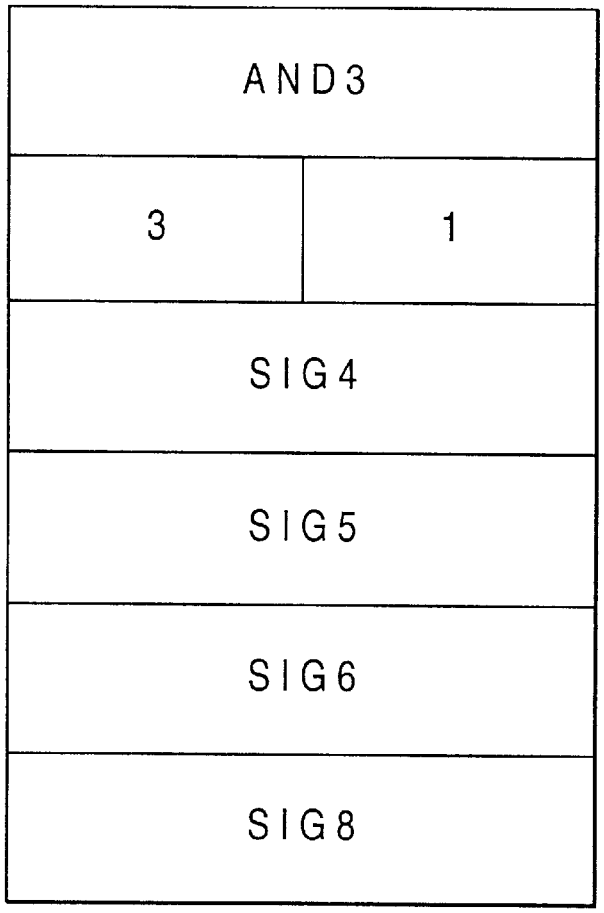

FIG. 52

| | C \* |
|---|---|
| | L 00000000001000000000200000000030000000000400000000050000000000 |
| | K 012345678901234567890123456789012345678901234567890123456789 |
| | L 000000000000000000000000000000000000000000000000000000000000 |
| | V 999999999999999999999999999999999999999999999999999999999999 |
| ⇧ ⇩ ⇐ ⬭ ⇒ ◇ | L 999999999999999999999999999999999999999999999999999999999999 |
| SIG1 | 000 |
| SIG2 | 111 |
| SIG3 | 111 |
| SIG4 | 000 |
| SIG5 | 111 |
| SIG6 | 111 |
| SIG7 | 000 |
| SIG8 | 111 |

FIG. 53

| | C \* |
|---|---|
| | L 00000000001000000000200000000030000000000400000000050000000000 |
| | K 012345678901234567890123456789012345678901234567890123456789 |
| | L 000000000000000000000000000000000000000000000000000000000000 |
| | V 999999999999999999999999999999999999999999999999999999999999 |
| ⇧ ⇩ ⇐ ⬭ ⇒ ◇ | L 999999999999999999999999999999999999999999999999999999999999 |
| SIG1 | 000000 |
| SIG2 | 111111 |
| SIG3 | 111111 |
| SIG4 | 000000 |
| SIG5 | 111111 |
| SIG6 | 111111 |
| SIG7 | 000111 |
| SIG8 | 111000 |

| | |
|---|---|
| SIGa | 000000 |
| SIGb | 111111 |
| SIGc | 111111 |
| SIGd | 111111 |
| SIGe | 000000 |
| SIGf | 111111 |
| SIGg | ...000 |

SIGa       000000
SIGb       111111
SIGc       111111
SIGd       111111
SIGe       000000
SIGf       111111
```

⇨ ONSTB 99

SIGa       00000000000
SIGb       11111111111
SIGc       11111111111      ┌─────────────────────┐
SIGd       11111111111      │ MESSAGE             │
SIGe       00000000000      │ << AT 10.99 >>      │
SIGf       11111111111      │ UNSTABLE            │
                            │     SIGz    0       │
                            └─────────────────────┘
```

LOGIC SIMULATION SYSTEM AND METHOD

This is a continuation of U.S. patent application Ser. No. 08/402,658, filed Mar. 13, 1995, now abandoned.

BACKGROUND OF THE INVENTION

1. Field of the Invention

This invention is related to a method of designing logical circuits. More specifically, it is related to a logical simulation system which simulates the action of a logical circuit, and a method of changing the logic in a logical simulation system.

2. Description of the Prior Art

In recent years devices made up of logical circuits such as digital computers have been becoming larger in scale and more complicated, and logical simulation has been becoming increasingly important in testing the design of those devices. In addition, as the devices become larger in scale, there is a demand for the logical simulation to become faster; for this reason, specialized hardware has been developed for the purpose of simulating large scale circuits at high speed.

By using this hardware, the simulation has become faster, but as before it remains necessary to produce the simulation model itself on a general purpose computer, raising the problem that the time required to create the model increases. In particular, when part of a logical circuit is modified, it is usual for the contents of the logical data base in which the logical circuit data are stored to be changed, meaning that the simulation model must be recreated.

FIG. 1 shows the concept of a conventional conversational type simulation. The designer first creates data base for the logical circuit which is to be the object of the simulation; then the computer models that data base to create the simulation model. Then the computer executes the simulation model while conversing with the designer. When a circuit is modified, the designer must re-input part of the data base.

FIG. 2 is a flow chart of the conventional conversational type simulation. In FIG. 2, the designer first investigates whether or not there is an error in the circuit (step ST1); if an error is discovered, that fact is input into the computer. The computer inquires of the designer whether or not to execute the simulation (step ST2); if the answer is YES, the simulation is executed(step ST3). Then, if there is an instruction to end the simulation (step ST4, YES), the processing is ended.

If an error is not discovered in step ST1, then the processing in step ST3 and subsequent steps is performed; if it does not end with step ST4, then the processing is repeated starting with step ST1. Also, if it is desired to modify the location in the circuit where the error was discovered, the designer answers NO in step ST2 and YES in step ST4 to temporarily halt the simulation. Then part of the data base is changed, the conversational type simulation is restarted and the simulation model is recreated.

In this method, as the scale of the circuit becomes larger, the time required to recreate the model increases, and the turnaround time required to make a logical correction and check the result by repeating the simulation becomes longer.

One method that has been available to solve this kind of problem is that when a simulation model that has been created is partially modified, only the hierarchical block containing the part that has been modified is recompiled and then linked to the other parts, thus shortening the processing time. However, even in this method considerable time is required to recompile the hierarchical block and link it to the other parts, and in the case of a large system the processing time is not sufficiently shortened. In addition, it is necessary for the simulation model to contain hierarchical information, producing the problem that the model becomes more complicated as the scale of the file becomes larger. Also, if an error that has been discovered in the simulation is to be corrected, it is generally desired to modify the contents of the logical data base after a tentative correction has been made and normal operation confirmed by means of a simulation. That is to say, since the logical data base is master information for performing unified management of the design information and has a file that several designers will refer to, it is better that the change is made after the appropriateness of the logic has been confirmed.

SUMMARY OF THE INVENTION

This invention has the purpose of attempting to solve 2 major problems. The first problem is to reduce the time required to change a simulation model for a large scale circuit. The second problem is to, when a logical circuit is to be changed, tentatively modify the simulation model without changing the logical data base, and then change the logical data base only after the appropriateness of the change has been confirmed by simulation.

This invention, when a logical circuit is to be modified, does not start with entry of changes to the logical data base, but rather performs a temporary modification by changing a previously created simulation model, for the purpose of shortening the turnaround time until the logical simulation is performed and the result is checked.

In the logical simulation system of this invention, the logical circuit data stored in the logical data base are, for example, divided into a number of levels in a hierarchical format; for performing an actual simulation, those circuit data are converted into a gate level simulation model that is not divided into levels and permits the simulation to be executed immediately, and then the simulation is executed.

This logical simulation system has a display section to display the logical circuit corresponding to the simulation model and a simulation model changing section that directly changes the simulation model without changing the logical circuit data. The simulation model itself is described at gate level and is difficult for the designer to understand, so the display section, for example a graphic display, displays a macro level simulation model that includes 1 or more logical gates. The designer converses with the display section, gives instructions for changes to be made in the simulation model that is displayed, and the display section transmits the contents of those instructions to the simulation model changing section. The simulation model changing section consists of a graphic screen display and change instruction section, and a new simulation model creation section. The graphic screen display and change instruction section receives the contents of change instructions from the display section, and outputs information on changes to be made in the old simulation model to the new simulation model creation section. The new simulation model creation section creates a new simulation model based on simulation model correction information given to it by the graphic screen display and change instruction section, and the old simulation model. After the change is made, the simulation by the new simulation model is executed.

The logical simulation system has a software simulator and a hardware simulator to perform simulation, and a simulation model storage section to store the simulation models.

There are 3 methods of giving instructions to change a simulation model. The 1st method is for the designer to give logical change instructions conversationally using a circuit diagram on the display section screen. The 2nd method is to give logical change instructions using historical information on logical changes that have been made in the past. In the 2nd method, the results of making a number of changes are merged to make them all at once; if similar changes are to be made repeatedly, the historical information can be edited, for example by an editor, so that change instructions can be given more rapidly. The 3rd method is to recognize change instructions for logical circuit data in the logical data base as change instructions for the simulation model, and use them to change the simulation model directly.

In addition, there are the following 4 methods for a simulation model to be changed by the simulation model change section. The 1st method is to rewrite the contents of the file of a simulation model already stored in the simulation model storage section. The 2nd method is to store the simulation model after the change in the simulation model storage section as another file. The 3rd method is to directly change a simulation model written onto the main memory in the software simulator execution section from the simulation model storage section. The 4th method is to directly change a simulation model loaded into specialized simulation hardware.

After a simulation model is changed and the circuit action after the change is checked, the change is reflected in the logical data base. Thus, according to this invention a simulation model being executed can be tentatively changed and its action can be checked without changing the logical circuit data stored in the logical data base. In addition, the simulation can be continued and the logical data base can be changed only after the simulation has proceeded to the end.

BRIEF EXPLANATION OF THE DRAWINGS

FIG. 6B is a flow chart (2 of 2) showing the overall processing of the graphic screen display and change instruction section.

FIG. 10 is a figure showing an example of a screen display in the case of a search for the names of constituent elements of a 7-layer hierarchical structure.

FIG. 23 is a diagram explaining the fan-out connection change processing for FIG. 21.

FIG. 26 is a figure showing an exterior view of a macro that can be added onto a simulation model.

FIG. 30 is a figure showing a descriptive example of the logic inside a Boolean block.

FIG. 34 is a flow chart of the interpretation processing of a Boolean block.

FIG. 37 is a figure showing the format of a simulation model expression data storage table.

FIG. 39 is a figure showing the change in table storage contents when a simulation model is changed.

FIG. 47 A figure showing an example of circuit data information.

FIG. 48 A figure showing an example of a circuit change information table.

FIG. 49 A figure showing circuit data information after a change.

FIG. 52 A figure showing an example of a screen display of a simulation result.

FIG. 53 A figure showing an example of a screen display of a simulation result.

FIG. 57 A figure showing an example of a screen display of a simulation result.

FIG. 59 A figure showing an example of a screen display of a simulation result.

FIG. 60 A figure showing an example of display of a message describing an unstable condition.

DESCRIPTION OF THE PREFERRED EMBODIMENTS

Preferred embodiments of this invention are explained below, with reference to the drawings.

Figure 3:
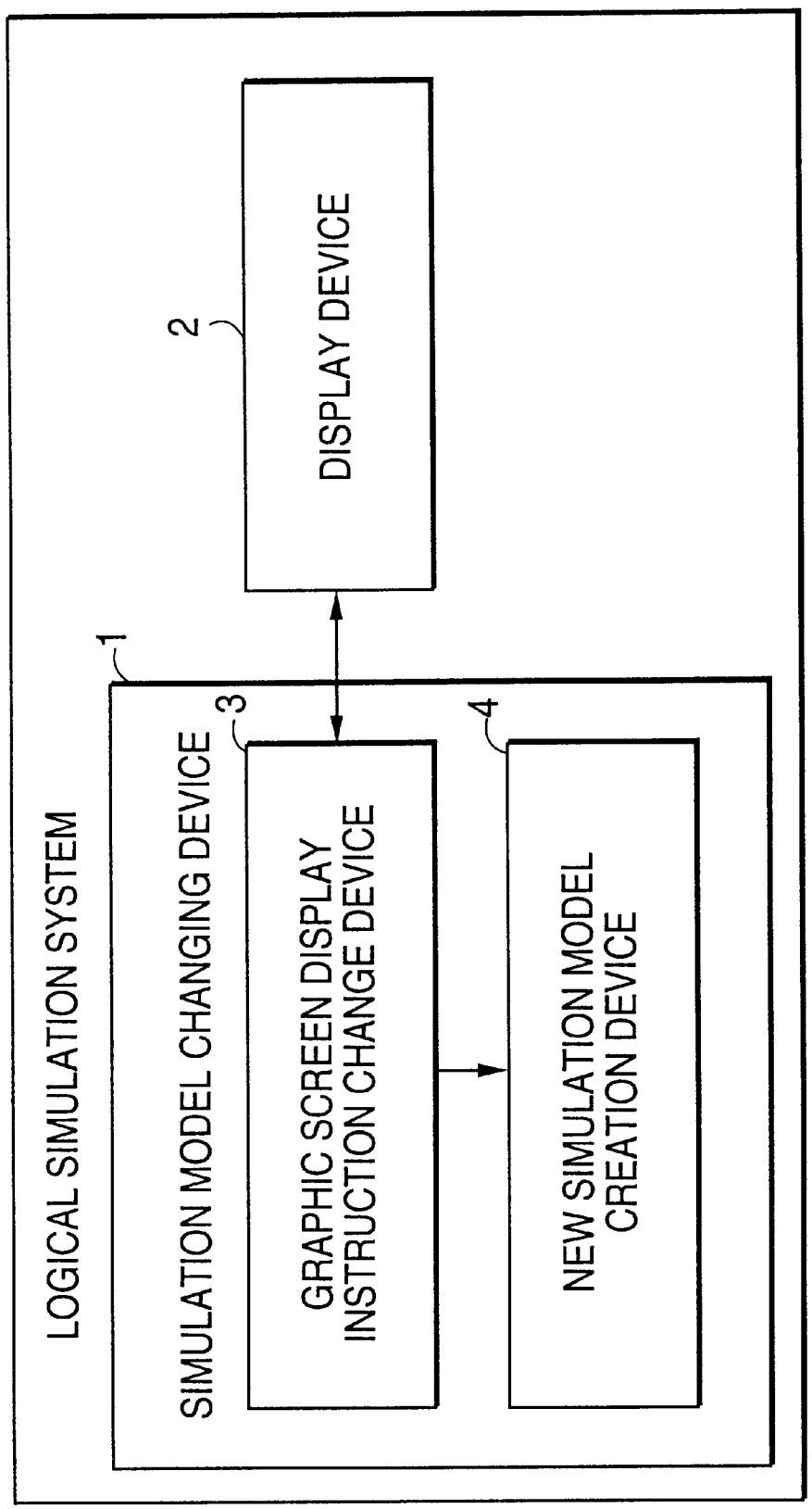
FIG. 3 is a block diagram illustrating the principle of an embodiment of this invention.

FIG. 3 is a block diagram showing the principle of an embodiment of this invention. FIG. 3 is a block diagram showing the principle of a logical simulation system that performs logical simulations by converting logic circuit data in a logical data base into a simulation model.

In FIG. 3, when the simulation model changing device 1 attempts to change part of a logic circuit, the logical simulation model formed by the conversion is changed directly without changing the data in the logical data base.

This simulation model changing device 1 consists of, for example, the graphic screen display and change instruction device, or as illustrated in FIG. 3, graphic screen display instruction change device, 3 and the new simulation model creation device 4. Within this system there is, for example, a display device 2 that displays the simulation model and permits the designer to conversationally input change instructions for that simulation model. The graphic screen display and change instruction device 3 controls the display of the display device 2, and, at the same time, receives change instructions for the simulation model from the designer and outputs simulation model modification information for the old simulation model to the new simulation model creation device 4. The new simulation model creation device 4 creates a new simulation model based on the simulation model modification information output from the graphic screen display and change instruction device 3 and on the old simulation model.

In this invention, the logic circuit data stored in the logical data base is, for example, expressed in a hierarchical format divided into several hierarchical levels. In order to perform an actual simulation, the logic circuit data are converted to a gate level simulation model that permits a simulation to be executed immediately, and then the simulation is executed.

However, it is in general not possible for the designer to understand this kind of gate level simulation model itself, so when this kind of simulation model is displayed in the display device 2, it is converted to the macro level, including 1 or more logical gates, and then displayed.

The designer for example gives instructions for changes in the simulation model that has been thus displayed conversationally, via, for example, the display device 2. Those instructions are interpreted by the graphic screen display and change instruction device 3, which then gives modification information for the simulation model to the new simulation model creation device 4, which creates a new simulation model. Then the simulation for that new simulation model is executed.

The logical simulation system has, for example, a software simulator and hardware simulator which perform simulations, and a simulation model storage section which stores simulation models. When a simulation model is changed, the simulation model modification information is read in, logical change data corresponding to that modification information are created, and then, depending on whether it is the data for the software simulator, data for the hardware simulator, or the simulation model stored in the simulation model storage section that is/are to be changed, for example the data on a main memory for the software simulator are changed, or the data loaded into the hardware simulator are changed, or the simulation model stored in the simulation model storage section is changed.

Thus, according to this invention a simulation model can be changed directly without changing the logic circuit data stored in the logical data base.

Figure 4:
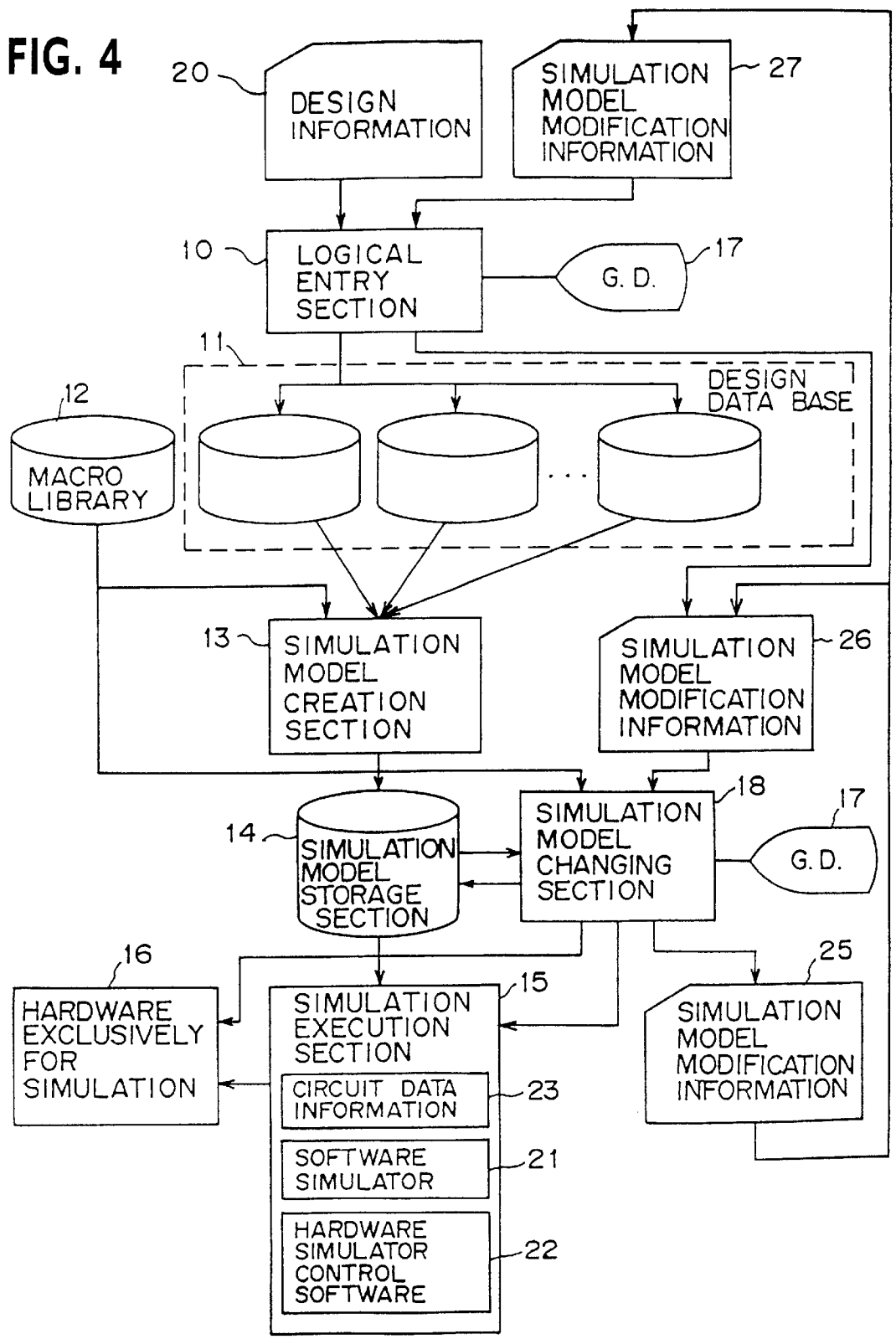
FIG. 4 is a block diagram showing the configuration of the logical simulation system in this invention.

FIG. 4 is a structural block diagram showing the details of the logical simulation system of this invention. In FIG. 4, the simulation system consists of a logical entry section 10 which is for the purpose of logical input; a design data base 11 where design data input through the logical entry section 10 are stored; a macro library 12 where, for example, data concerning macros which each consist of a number of logical elements are stored; a simulation model creation section 13, which uses the contents of the macro library 12 and the design data base 11 and further unfolds the macros to the AND gate and OR gate level to create a simulation model; a simulation model storage section 14, where simulation models created by the simulation model creation section 13 are stored; a simulation execution section 15, which executes simulations using the simulation models stored in the simulation model storage section 14; specialized simulation hardware 16 for the purpose of performing hardware simulations based on instructions from the simulation execution section 15; a graphic display 17 which displays simulation models; and a simulation model changing section 18 which changes simulation models stored in the simulation model storage section 14, based on, for example, conversation with the designer through the graphic display 17.

In FIG. 4, the system stores design information for each hierarchical block in a data base, based on design information which is described in for example VHDL (VHSIC Hardware Description Language), which is a world standard design language, and is read in through the logical entry section 10, or on logical input of a circuit diagram image by the designer using the graphic display 17. The result is output to the design data base 11 which consists of a number of files.

The simulation model creation section 13 expands (unfolds) the hierarchical data until they are flat, based on the contents of the said design data base 11 and macro library 12, and at the same time expands the macros to the level of primitive gates such as AND and OR to create the simulation model.

The simulation execution section 15 contains, in its interior, the software simulator 21 which expands the simulation model onto the general purpose computer main memory and executes the simulation; and hardware simulator control software 22, for the purpose of loading the simulation model into the specialized simulation hardware 16 and executing the simulation. Either a software simulation or hardware simulation is executed using the simulation model stored in the simulation model storage section 14. The simulation model expanded by the software simulator 21 is saved on main memory as the circuit data information 23 for example.

The simulation model changing section 18 is the most characteristic part of this invention. It has the function of directly changing the simulation model. There are the following 3 methods of giving change instructions to this simulation model changing section 18. The 1st method is for the designer to use a circuit diagram on the screen of the graphic display 17 to give logical change instructions conversationally; logical corrections are easy for the designer to make since the modification instructions can be given using the circuit diagram image.

The 2nd method is to input historical simulation model modification information 25, 26 obtained as the results of past logical modifications either as it is, or merged or edited. This method permits modifications to be made quickly when, for example, the results of a number of modifications are to be merged and made at one time or similar modifications are to be made repeatedly, since the modification information can, for example, be edited using an editor.

The 3rd method is to input the simulation model modification information 26 output from the logical entry section 10 either as it is or after merging or editing. This method permits the simulation model to be changed directly when modification is to be made using the logical entry section, by giving the modification information to the simulation model changing section 18 without changing the logical data base. In this case, as seen from the designer it is not necessary to be conscious of changing the simulation model; but since the design data base 11 stores data in a separate file for each hierarchical level, when, for example, the connections among a number of LSIs are changed, it is in some cases necessary to input the contents of the files for each LSI and the printed circuit board that connects the LSIs at the same time.

There are the following 4 methods by which the simulation model changing section 18 can change simulation models. The 1st method is to rewrite the contents of a file already stored in the simulation model storage section 14. In this method, it is not necessary to prepare a separate simulation model file to be used for the output, which saves discs.

The 2nd method is to output the changed simulation model file to the simulation model storage section 14 as a separate file. In this method, it is necessary to prepare a new file, but the original simulation model can be changed any number of times, and the result each time stored as a separate file.

The 3rd method is for the software simulator 21 to directly change a simulation model, read onto main memory. The 4th method is for the hardware simulator control software 22 to directly change a simulation model loaded into the specialized simulation hardware 16. These 2 methods save file output time as compared to the first 2 methods so that simulation model changes can be executed more quickly, but, if for example it is necessary to execute a number of simulations for the same simulation model, then the simulation model has to be changed each time; if the number of times is large then it is possible that the total overhead will be larger than for the 1st and 2nd methods, making the processing time long.

Whichever of these 4 methods is used, whenever a simulation model is changed the simulation model modification information 25 is output; this is used as the simulation model modification information 26 for the simulation model changing section 18 and as the simulation model modification information 27 for the logical entry section 10. The designer can select whichever of these 4 methods is most advantageous to use in a given situation.

When a simulation model is changed, the design data base 11 is only changed after the appropriateness of the logical correction has been demonstrated by a simulation. At this time the simulation model modification information 27 is input to the logical entry section 10; the design data base 11 is automatically changed by means of the logical entry section 10 changing the format of the simulation model modification information 27 to the input data format for the design data base 11.

Figure 5:
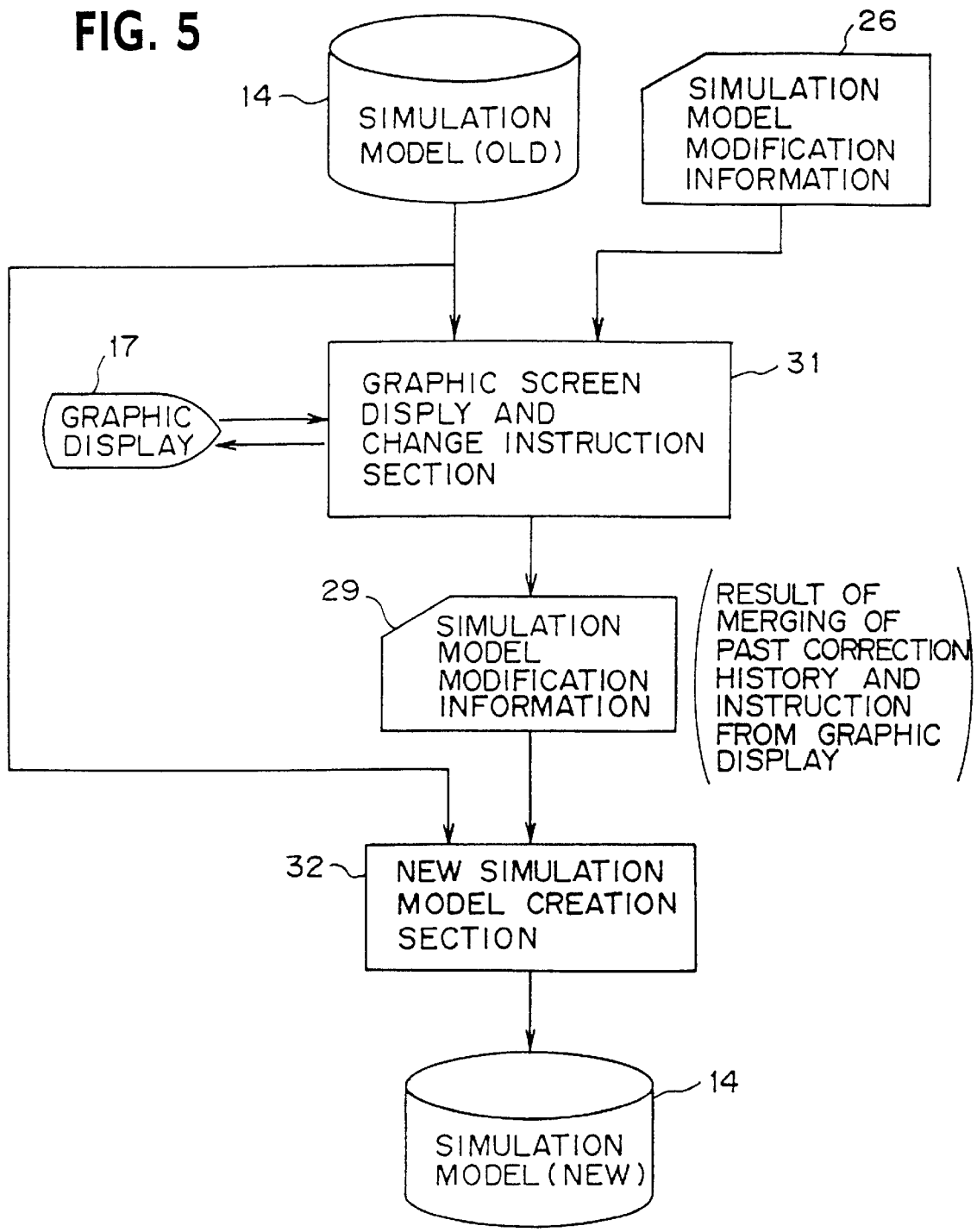
FIG. 5 is a block diagram showing the detailed configuration of the simulation model changing section.

FIG. 5 is a detailed structural block diagram showing one example of a simulation model changing section 18. In FIG. 5, the simulation model changing section 18 consists of a graphic screen display and change instruction section 31 and a new simulation model creation section 32, and automatically creates new simulation models.

The graphic screen display and change instruction section 31 uses the change instructions that the designer inputs through the graphic display 17, the old simulation model stored in the simulation model storage section 14 and the simulation model modification information 26, that is to say the past modification (correction) history, merges them and as a result newly creates the simulation model modification information 29; this is output to the new simulation model creation section 32. The new simulation model creation section 32 creates the new simulation model using the new simulation model modification information 29 output from the graphic screen display and change instruction section 31, and the old simulation model, and stores it in the simulation model storage section 14.

Figure 6A:
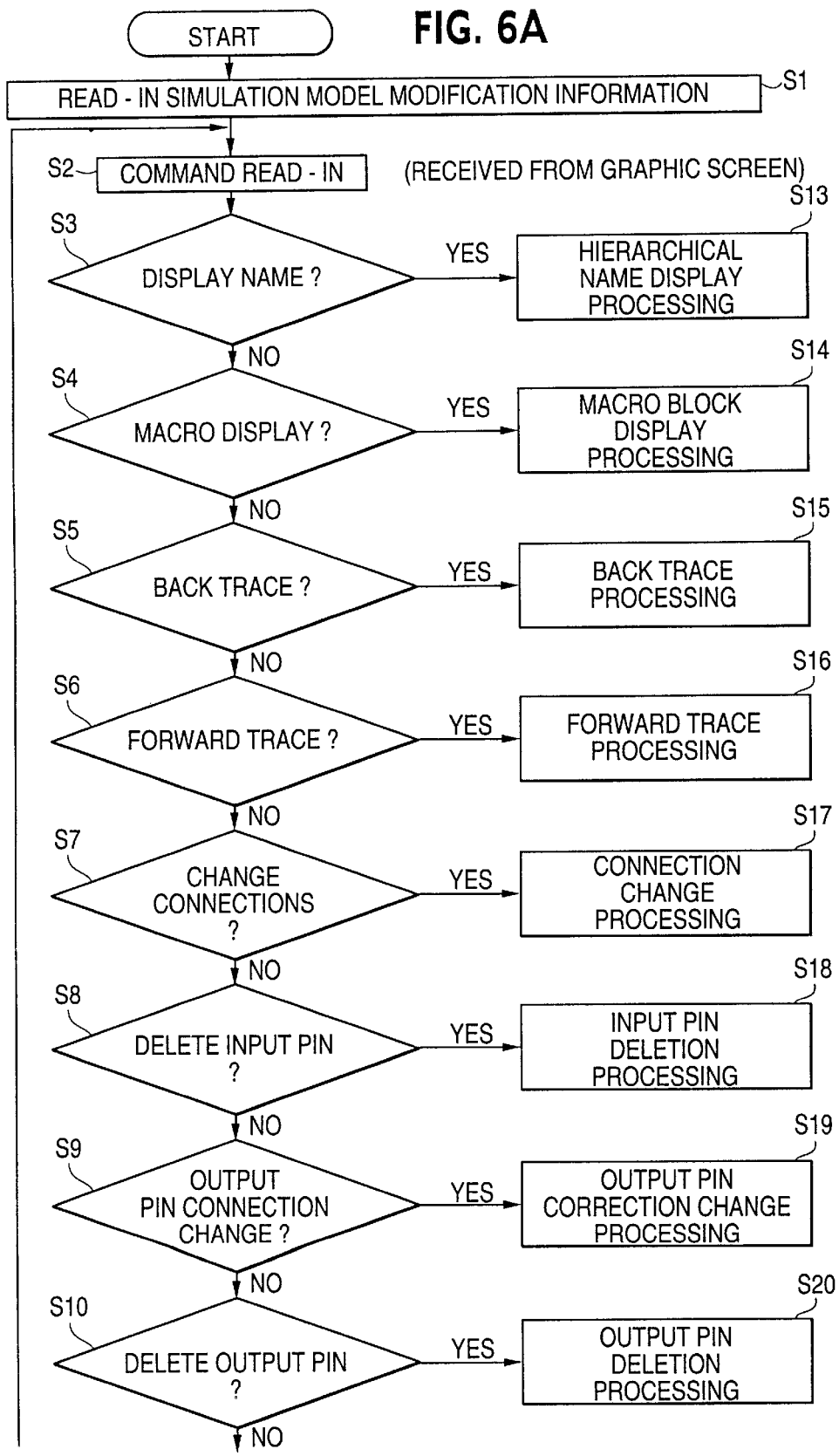
FIG. 6A is a flow chart (1 of 2) showing the overall processing of the graphic screen display and change instruction section.

FIGS. 6A and 6B are flow charts of the overall processing in the graphic screen display and change instruction section. In this flow chart, when the processing starts first, as explained in FIG. 5, for example simulation model modification information which gives the past modification history is read in as in step S1; next, in step S2, commands given by the designer through the graphic display 17 are read in. In steps S3 to S12, it is judged, based on the command contents, whether or not to display the name, whether or not to display the macro, whether or not to perform a back trace, whether or not to perform a forward trace, whether or not to change connections, whether or not to delete input pins, whether or not to change connections to output pins, whether or not to delete output pins, whether or not to add a logical block and whether or not to perform Boolean logical addition. If the name is to be displayed, hierarchical name display processing is performed in step S13; if the macro is to be displayed, macro block display processing is performed in step S14; if a back trace is to be performed, back trace processing is performed in step S15; if a forward trace is to be performed, forward trace processing is performed in step S16; if connections are to be changed, connection change processing is performed in step S17; if input pins are to be deleted, input pin deletion processing is performed in step S18; if connections to output pins are to be changed, output pin connection change processing is performed in step S19; if output pins are to be deleted, output pin deletion processing is performed in step S20; if a logical block is to be added, logical block addition processing is performed in step S21; if Boolean logical addition is to be performed, Boolean logical addition processing is performed in step S22. The details of this processing are described below.

If it is judged in step S12 that the command contents do not include Boolean logical addition, then in step S23 it is judged whether or not the modification instructions have been completely carried out. If the instructions have not been completely carried out, then the processing starting with command read-in in step S2 is repeated. If the modification instructions have been completely carried out, then new simulation model modification information related to the modification instructions is created in step S24; the old simulation model and the old simulation model modification information 26, which is a history of past modifications, are merged in step S25; and the new simulation modification information, that is to say the simulation model modification information 29 in FIG. 5, is output in step S26 to complete the processing.

Figure 6C:
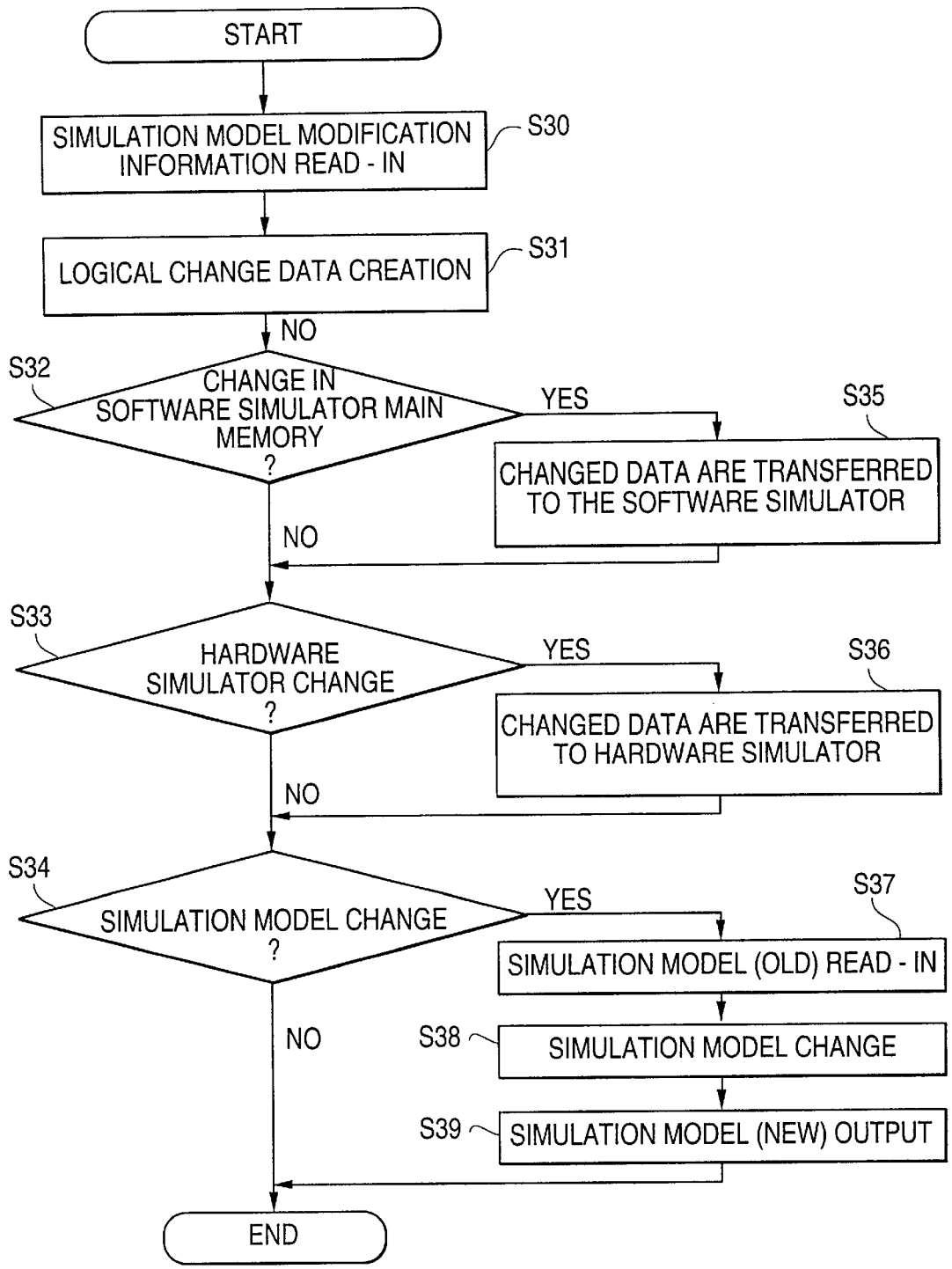
FIG. 6C is a flow chart showing the processing in the new simulation model creation section.

FIG. 6C is a flow chart of the processing in the new simulation model creation section. In FIG. 6C, when the processing starts, first, in step S30, the new simulation model modification information 29 in FIG. 5 is read in; logical change data are created based on that modification information in step S31. This logical change data creation will be described later.

Figure 1:
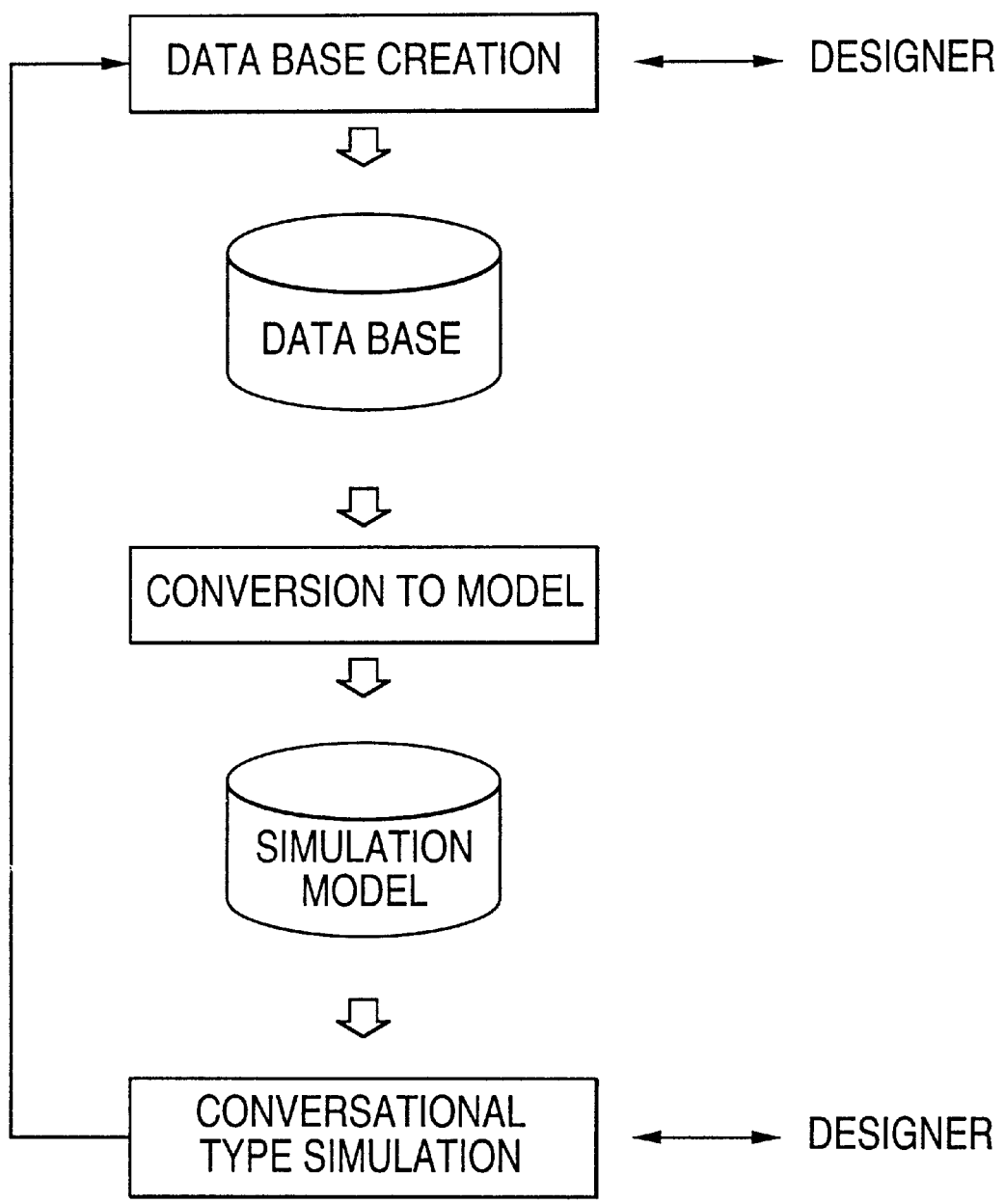
FIG. 1 is a diagram showing a conventional conversational type simulation.
Figure 2:
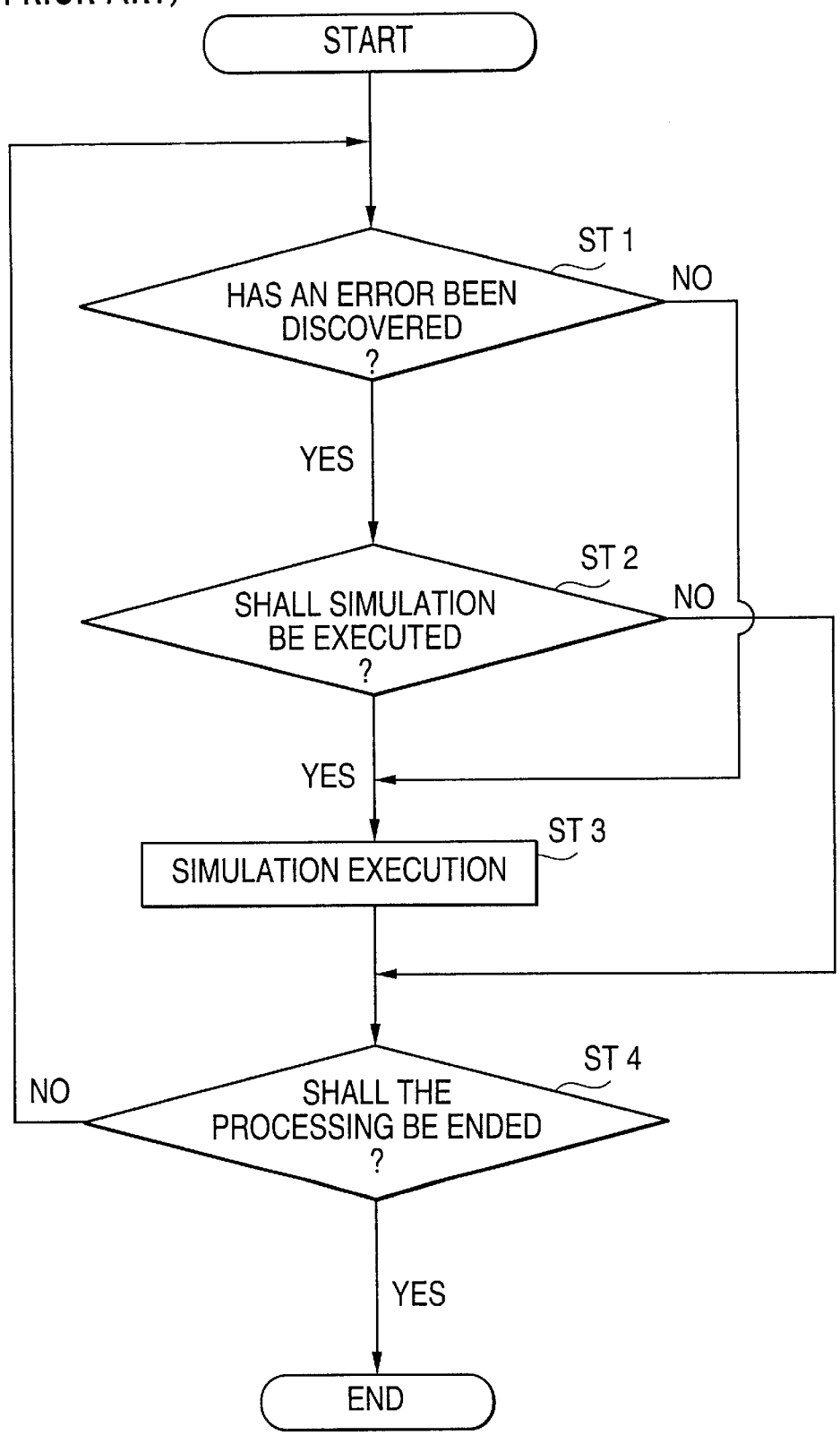
FIG. 2 is a flow chart of a conventional simulation.

After logical change data are created in step S31, it is judged in steps S32, S33 and S34, respectively, whether or not software simulator main memory data are to be changed, whether or not hardware simulator data are to be changed, and whether or not the simulation model is to be changed. If the data on the software simulator main memory are to be changed, the change data are given to the software simulator 21 in FIG. 2 in step S35. If the hardware simulator data are to be changed, the change data are given to the specialized simulation hardware 16 in FIG. 4, that is the hardware simulator, in step S36. If the simulation model is to be changed, the old simulation model is read-in in step S37, the simulation model is changed in step S38, and the new simulation model is output in step S39 to complete the processing.

Even if, for example, the hardware simulator data are to be changed, the simulation model would be changed as necessary. It is possible that, for example, a simulation can be performed with one set of test data; if the result is good, the simulation model is then changed and another simulation performed with a different set of test data.

In addition, if the simulation model is changed, as a rule the result of that change will be reflected in the design data base 11 via the logical entry section 10 in FIG. 4, but there are also some cases in which the data base will not be changed; that judgment is made by the designer. Decisions as to whether or not the simulation model is to be changed and whether or not the data base is to be changed are made in accordance with instructions from the designer; any of the combinations can occur in practice.

Figure 7:
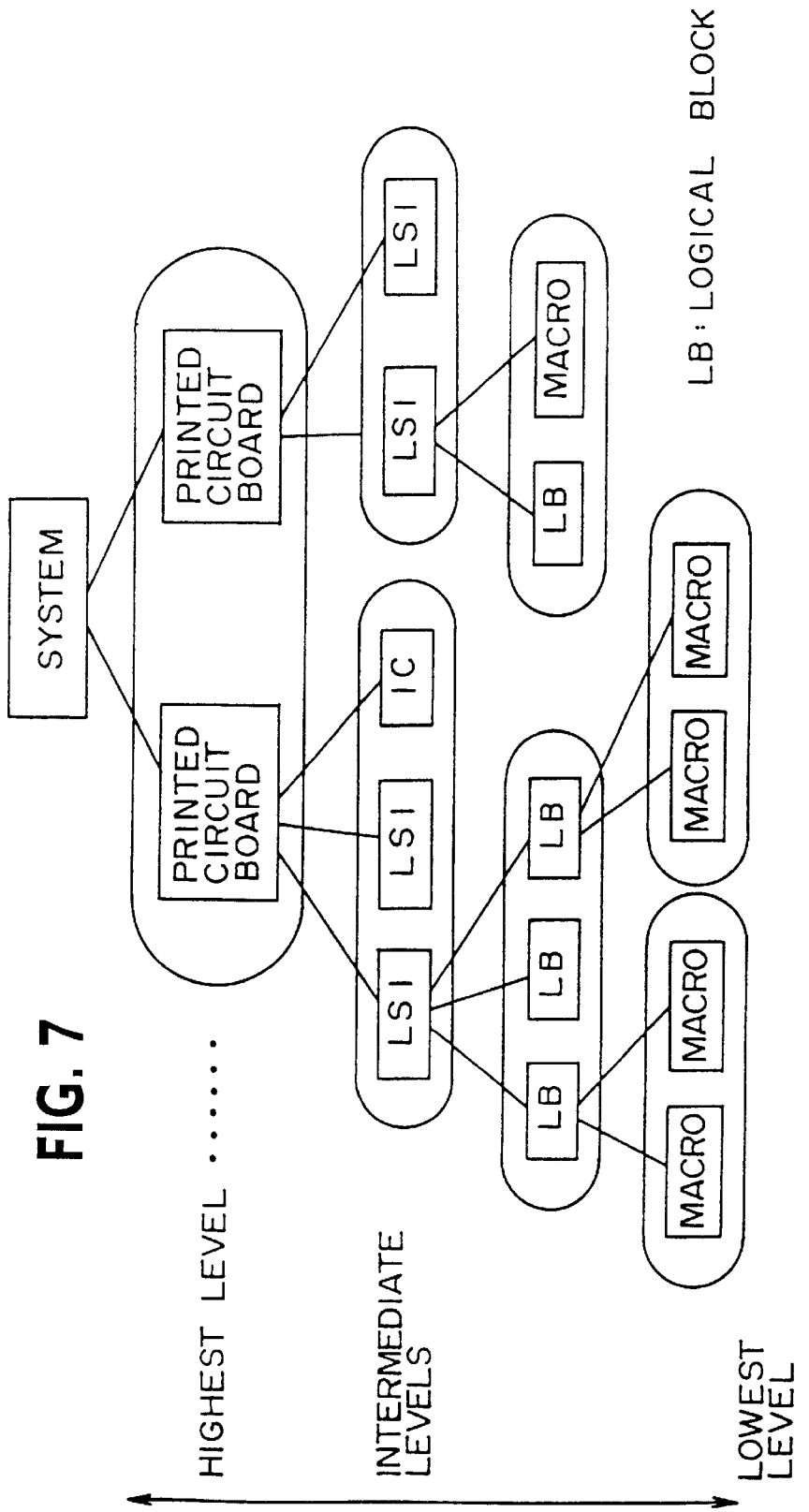
FIG. 7 is a figure explaining a specific example of a logical circuit design hierarchy.

In this invention, as stated above the design data base 11 in FIG. 4 consists of files on each hierarchical level. FIG. 7 shows a specific example of a design hierarchy that illustrates this hierarchy concept. In FIG. 7, among the constituent elements of the system the printed circuit board, for example, belongs to the highest hierarchical level; a macro belongs to the lowest hierarchical level. The macro level is the lowest hierarchical level that the designer can understand; its interior sometimes consists only of a single gate and sometimes of plural gates. It is not necessary for the designer to know the detailed structure of gates inside a macro. The logical block (LB) in FIG. 7 in general consists of 2 or more macros.

There are several intermediate hierarchical levels between the highest printed circuit board level and the lowest macro level. These intermediate levels generally consist of logical blocks (LBs) or large-scale integrated circuits (LSIs); there are cases in which there are both logical blocks and macros on the same level.

Figure 8:
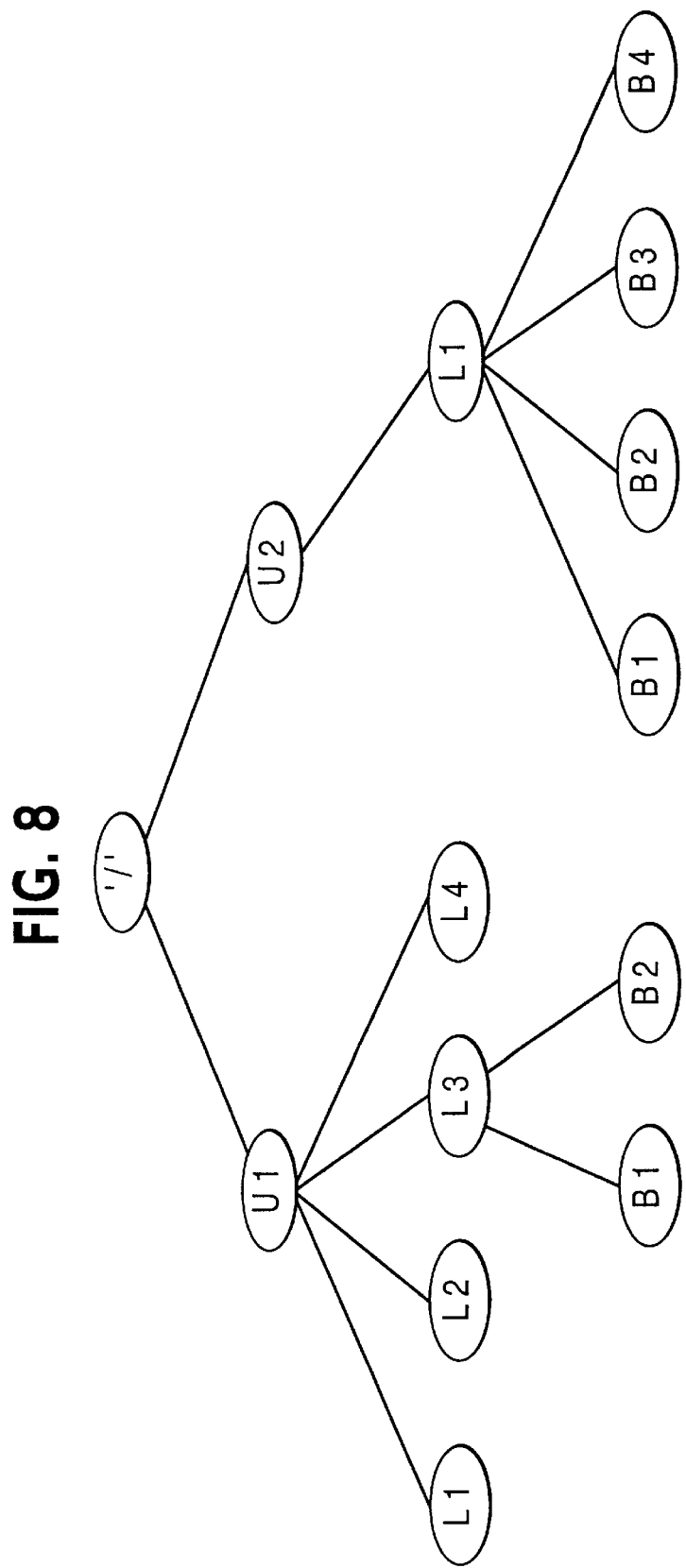
FIG. 8 is a diagram showing the tree structure of names of blocks etc. in a hierarchical structure.
Figure 9:
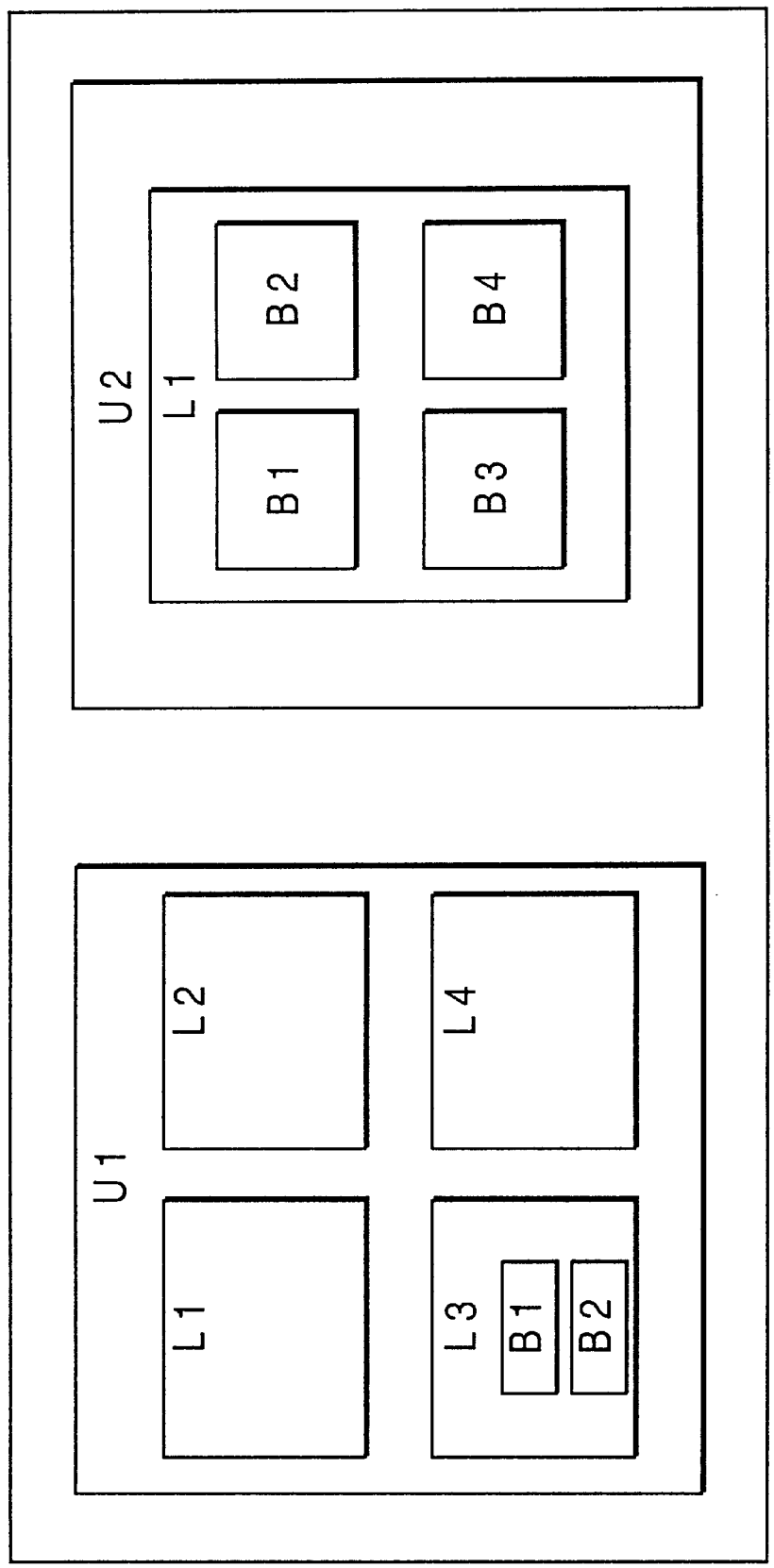
FIG. 9 is a figure showing a system image for the tree structure in FIG. 8.

FIG. 8 and FIG. 9 show images of the hierarchical structure of the design data inside a design data base.

FIG. 8 shows a tree structure with the printed circuit boards, logical blocks, macros etc. on the various hierarchical levels identified.

FIG. 9 shows a system image corresponding to the tree structure in FIG. 8. "/" in FIG. 8 indicates the highest hierarchical level, for example the system. The level below the system consists of, for example, the printed circuit boards U1 and U2. Below the printed circuit board U1 is a level with LSIs identified as L1 to L4. Below L3 is for example a level with logical blocks (or macros) B1 and B2.

FIG. 10 shows an example of a screen display when searching for the names of constituent elements in the hierarchical levels of the tree structure explained in FIG. 7. This example shows the screen when it is judged that the command contents call for a name display in step S3 in FIG. 4, and the result of the hierarchical name display processing in step S13 is being displayed. When a certain name within this display is specified, for example using the cursor, the names of the hierarchical nodes below the node corresponding to that name are displayed; in this way the names of the nodes making up each hierarchical level can be searched for.

FIG. 10 explains the meanings of the notes written below the display screen. Note 1), the current path name, is the name of the path from the highest hierarchical level to the node immediately above the current hierarchical level. For example, for the current path name "/U1" in FIG. 8, the names L1 to L4 of the nodes comprising the level below U1 are displayed.

Note 4) indicates the key (a find block command) used to search for the block on the higher hierarchical level. Using this key it is possible to, for example, change the display from the display for the current path name "/U1/L3" in FIG. 8 to the display for the current path name "/U1". Note 5) is the key used to display the find block command menu. This command menu will be described later. The block name of note 7) is a name of a node L1, or L2, etc. in FIG. 7. Hereafter macro, a logical block, etc. of each node will be called simply a block.

Figure 11:
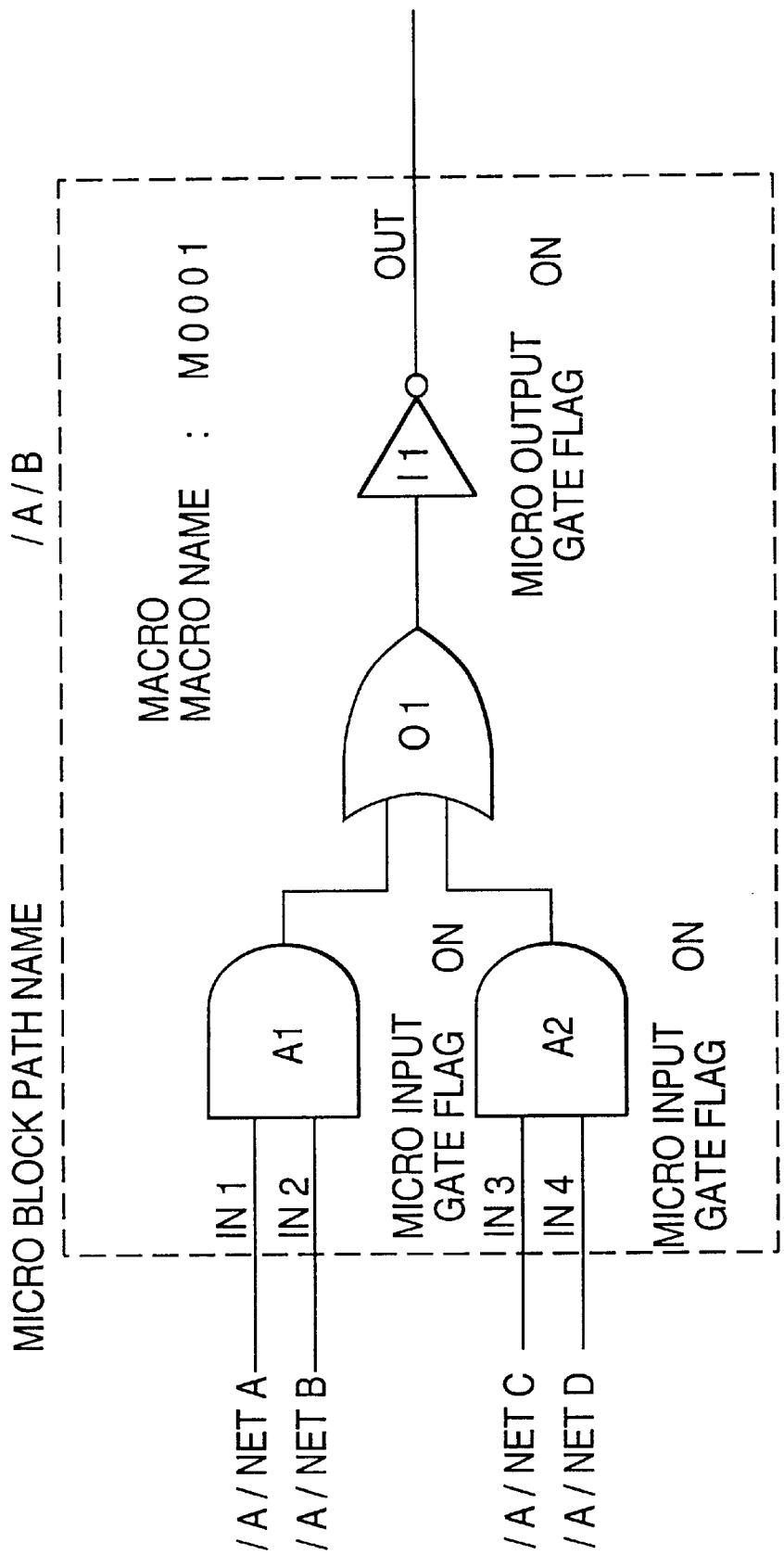
FIG. 11 is a figure showing an example of the internal structure of a macro block positioned at the lowest level of a hierarchical structure.

FIG. 11 shows the internal composition of the macro block corresponding to the node located at the highest hierarchical level of a general hierarchical structure. This macro consists of 2 AND gates, 1 OR gate and 1 inverter; this macro is named "M0001".

Figure 12:
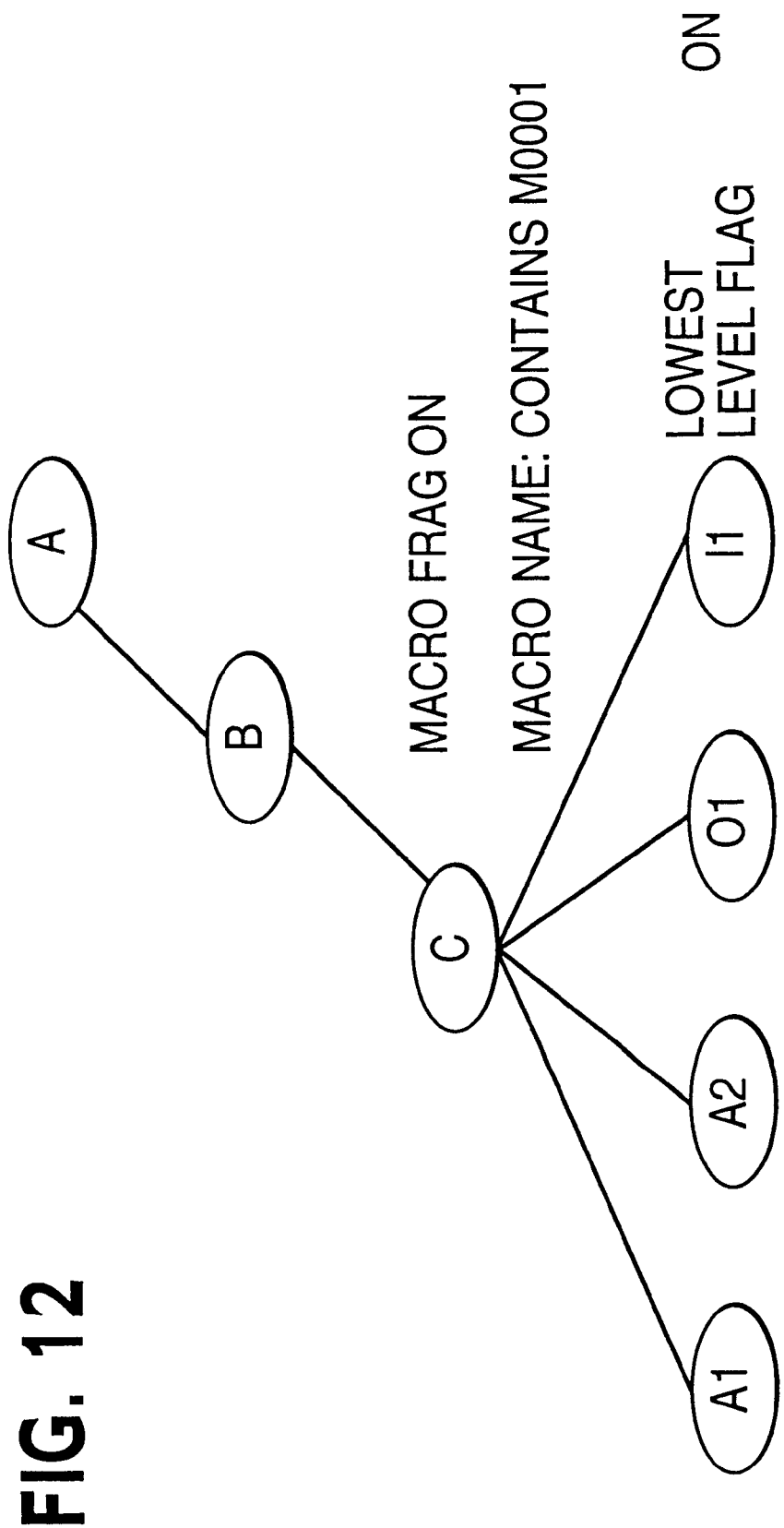
FIG. 12 is a figure showing the display of a tree structure of a hierarchical structure that has a macro block at its lowest level.

FIG. 12 shows a hierarchical tree structure having gates inside the macro blocks in FIG. 11 at its lowest level. Here, for example 4 nodes that have the names of gates are shown on the lowest hierarchical level for convenience in explanation, but these 4 gates actually form a macro block. This macro block path name becomes "/A/B" as shown in FIG. 11, corresponding to this tree structure. In the data that express the naming tree in FIG. 12, the macro output gate flag for the gate located at the macro exit, that is the inverter I1, is ON; in addition the macro input gate flags for the gates located at the macro entrances, that is the 2 AND gates A1 and A2, are also ON.

Figure 13:
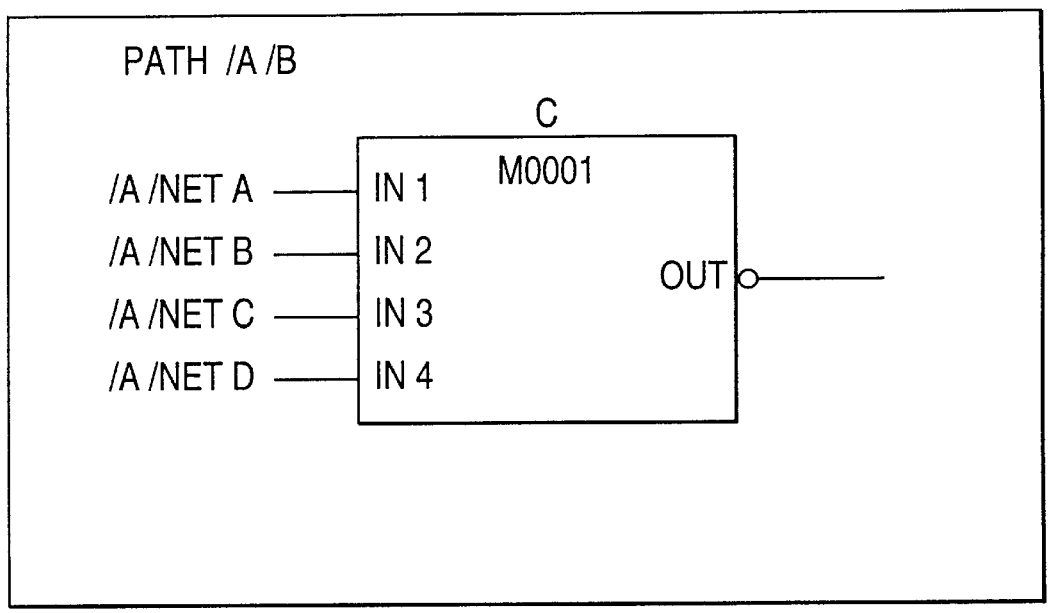
FIG. 13 is a figure showing an example of a display of a macro block on the display screen.

FIG. 13 shows an example of a display of the macro shown in FIG. 11 on the display screen. If for example the macro in FIG. 11 for the example of the block name search screen shown in FIG. 10 is specified, all of the gates that make up this macro are listed, the connections among the gates are traced, and the macro shape is reproduced based on the results of reference to the macro input flags and macro output flags, and shown in a format such as that in FIG. 13. Here the signal on the macro input side, for example "/A/NETA", gives the name of the net below block A. A net is a set of pins and wires at the same electrical potential level.

As stated above, the designer recognizes the logic circuit that is the object of the simulation from the level of the shape of the macro shown in FIG. 13; he knows only the functional relationship between the input and output of that macro. In contrast, in an actual simulation model, that is to say a model stored in the simulation model storage section 14 in FIG. 2, the interior of the macro is expanded to the single gate level as shown in FIG. 11. In this invention, in changing a simulation model expanded to the gate level, the macro that is the object of the change is displayed, for example on a graphic display, for example at the level shown in FIG. 13, and change instructions from the designer are received at this level.

When the command contents are judged to call for a macro display in step S4 in FIG. 4, then the macro display such as the one shown in FIG. 13 is in the format determined in the macro block display processing performed in step S14.

Figure 14:
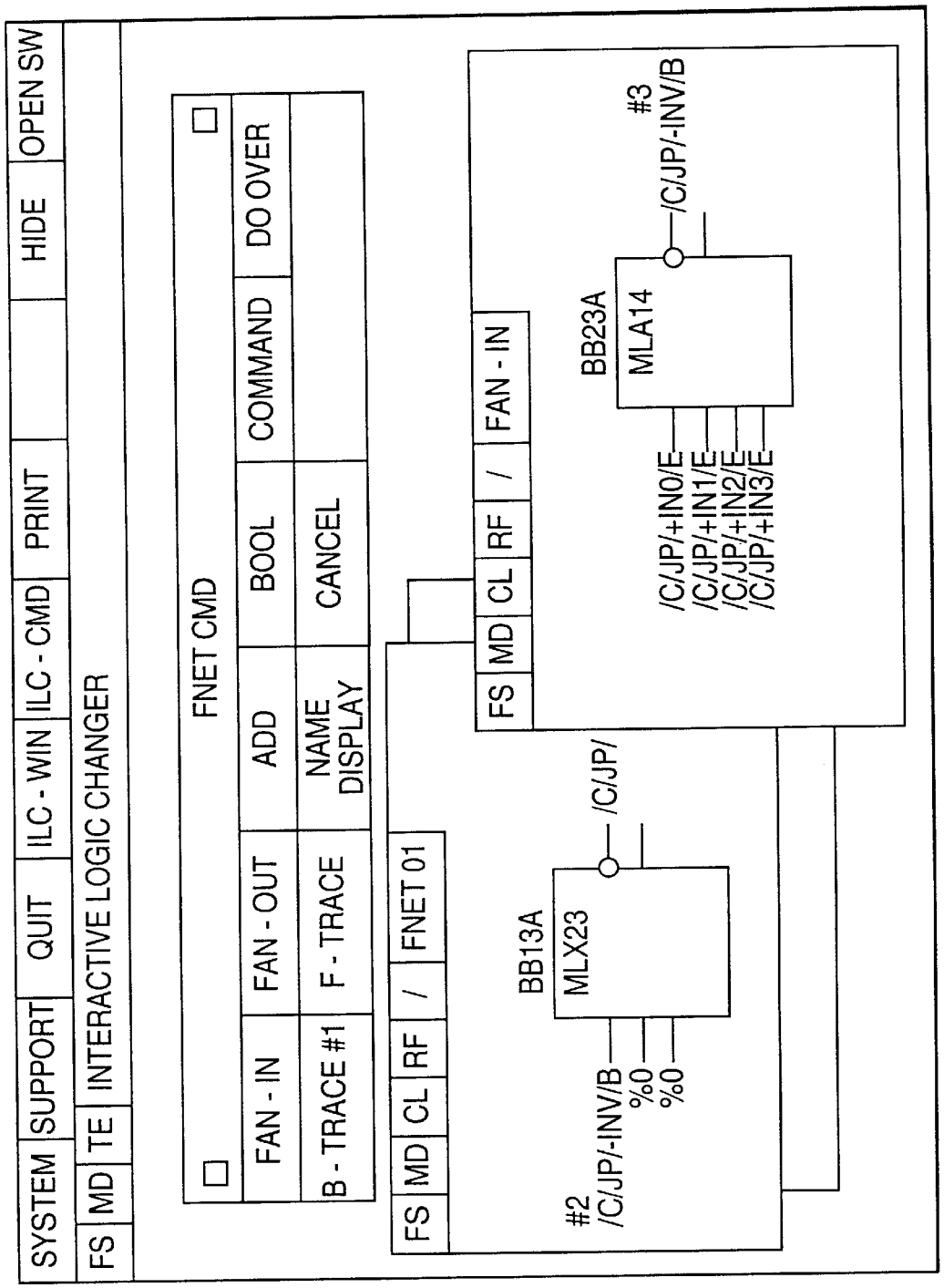
FIG. 14 is a diagram explaining back trace processing.

When the contents of a command are judged to call for a back trace in step S5 in FIG. 4, then back trace processing is performed in step S15; this back trace processing is explained in FIG. 14. In the back trace processing, the macro connected to a certain macro input terminal is searched for, and that macro is displayed.

Back trace processing is started when "back trace" indicated by #1 in the FNET CMD (find net command) menu in FIG. 14 is selected. The names of the input signal terminals that can be selected to be objects of the back trace are highlighted, for example by turning yellow. This input signal terminal name is specified on, for example, the FNET window or the FAN-IN window. The back trace can be aborted by selecting "cancel" on the command menu.

When the name of the signal terminal that is the object of a back trace, that is to say the name of the signal terminal that is the starting point of a back trace, is selected as shown by #2, that signal terminal name is highlighted, for example by turning red. Then the macro that is connected to the selected input terminal, that is to say the driver block, is displayed as (in) the FAN-IN window; in this display, this macro is highlighted, for example by appearing in red.

Figure 15:
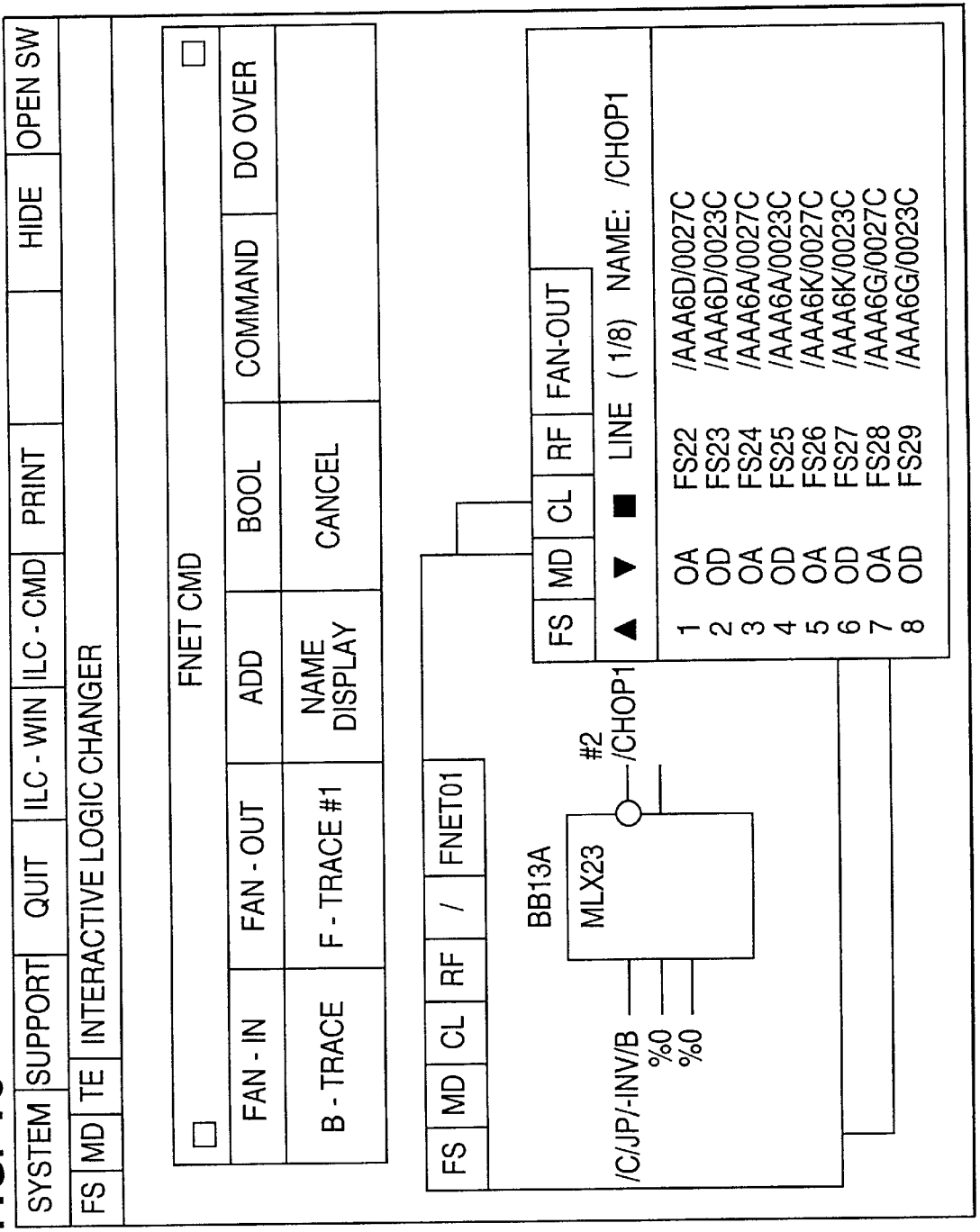
FIG. 15 is a diagram explaining forward trace processing.

FIG. 15 is an explanatory diagram showing the forward trace processing performed in step S16 in FIG. 4. In this forward trace processing, in contrast to the back trace processing described above, the macro connected to a certain macro output terminal is searched for, and the name of that macro is displayed.

In FIG. 15, the forward trace processing is started by selecting "forward trace" from the FNET CMD menu. The names of signal terminals that can be selected as starting points of the forward trace are highlighted by, for example, changing from yellow to red on the FNET window or the FAN-IN window. To abort the forward trace, select "cancel" on the command menu.

When the name of a signal terminal that is to be the starting point of a forward trace is selected, as indicated by #2, that signal terminal name is highlighted, for example by turning red. Then the macro that is connected in front of that signal terminal, that is to say the receiver block, is displayed on the FAN-OUT window. In FIG. 15, there are 8 receiver blocks that are fan-out destinations of the signal terminal "/CHOP1". That path name is "/AAA6 D/0027C"; it is shown that fan-out destination input pin is "0A".

Figure 16:
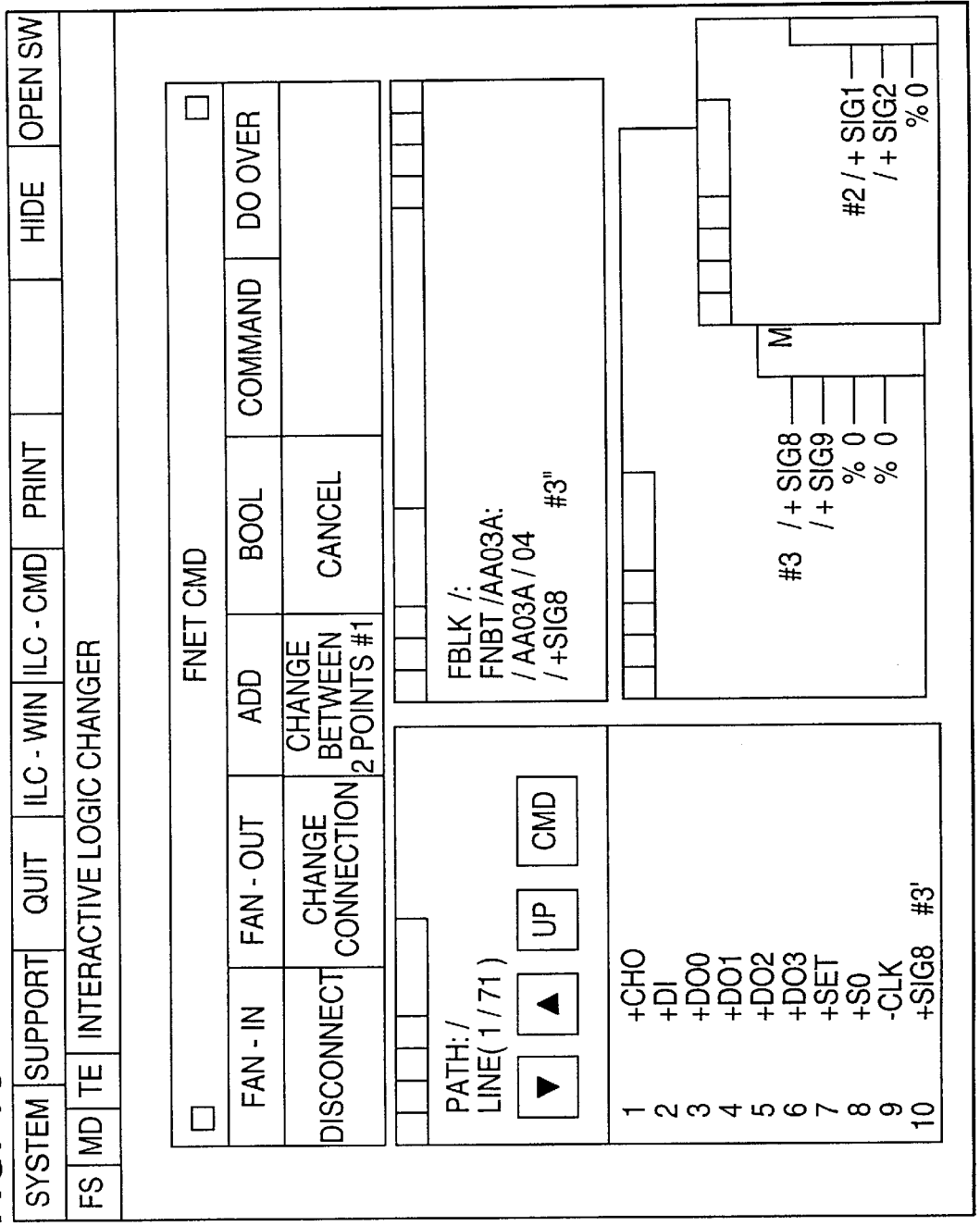
FIG. 16 is a diagram showing processing to change the fan-in between 2 points.

FIG. 16 is an explanatory diagram of fan-in 2-point change processing. The name of a macro input signal for which there is a change between 2 points, that is to say a fan-in signal, is changed using the signal terminal displayed in the window. This processing is started by selecting "change between 2 points" on the FNET command window. The signal terminals that can be specified in place of the present input signal terminal are the signal terminals the names of which appear in turquoise in the list of path names in the FBLK (find block) window, and the signal terminals the names of which are displayed in the FNET window and the MONITOR window. The names of these signal terminals that can replace the present signal terminal are highlighted, for example by appearing in yellow.

Among these signal terminal names that are highlighted by appearing in yellow to indicate that they can be selected, when the location at which it is desired to change to a new signal terminal name is specified, as shown by #2, the specified signal terminal name is additionally highlighted, for example by turning turquoise. If a mistake is made in the specification, the specification of that location can be canceled by selecting "cancel" on the command menu. After that a signal terminal name that indicates a new fan-in signal can be selected from among the new signal terminal names in the window, as indicated for example by #3, #3' and #3". This completes the operation for making a change between 2 points.

Figure 17:
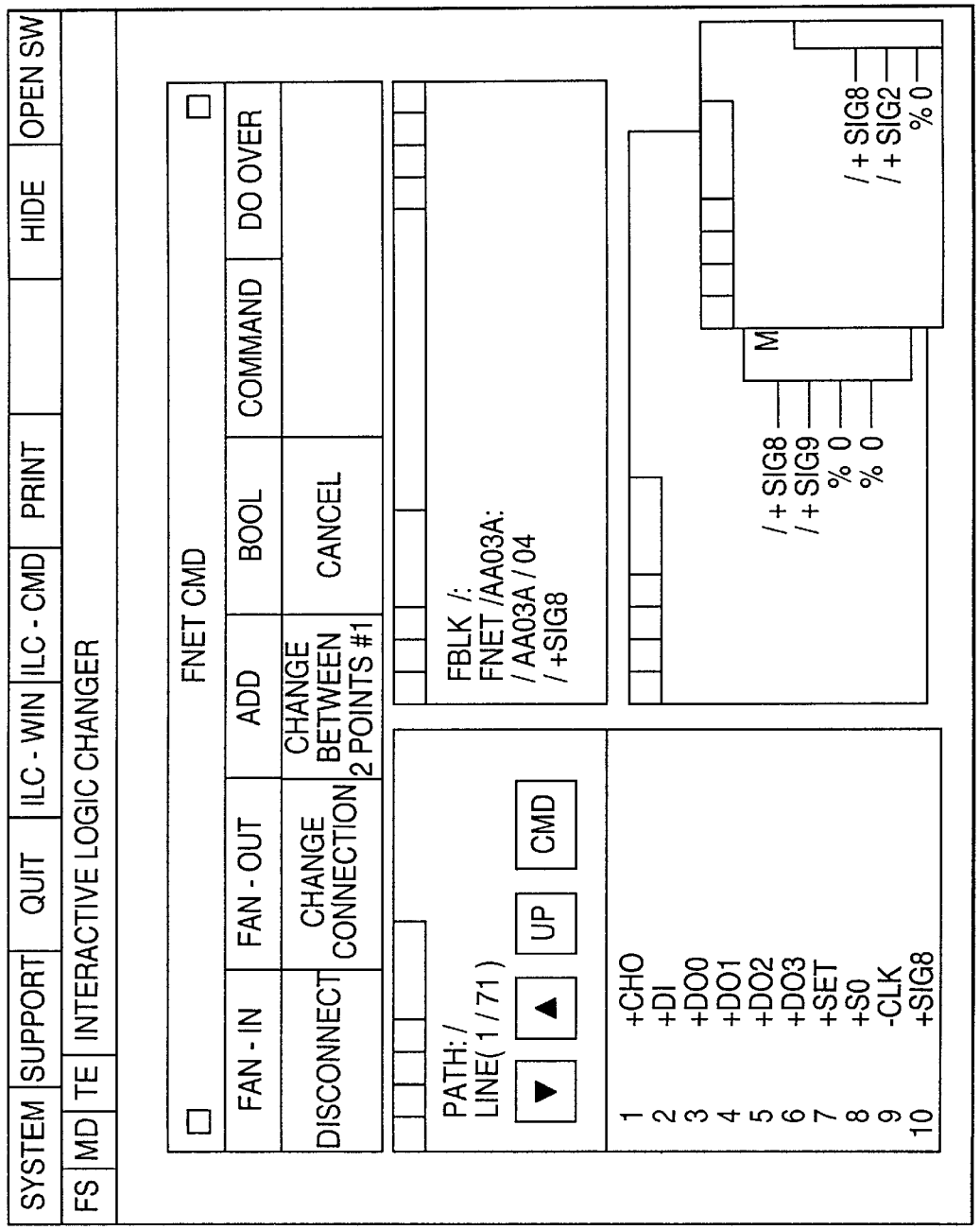
FIG. 17 is a figure showing an example of a display after the processing to change the fan-in between 2 points.

FIG. 17 shows an example of a display after the processing for a change between 2 points has ended. When FIG. 16 and FIG. 17 are compared, it is seen that the uppermost input signal terminal name of the macro displayed in the lower right window has changed to the new signal terminal name indicated by #3 in FIG. 16. Note that this processing for a change between 2 points corresponds to the connection change processing performed in step S17 when the contents of a command are judged to call for a connection change in step S7 in FIG. 4.

Figure 18:
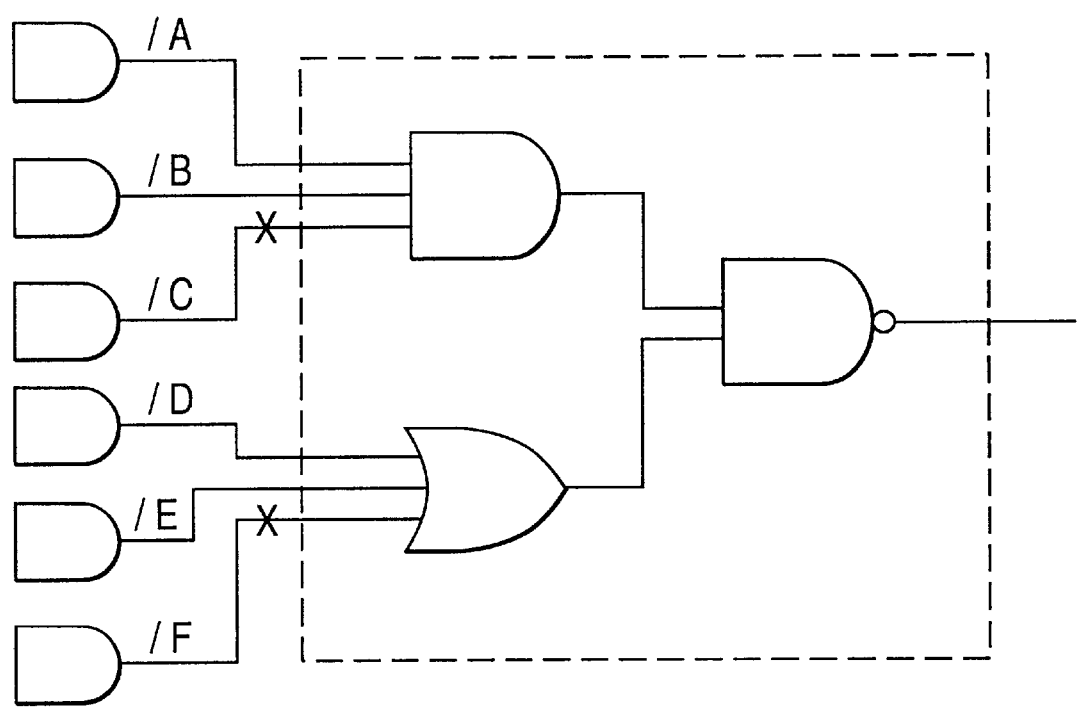
FIG. 18 is a figure explaining the content of input pin deletion processing.

When it is judged that the contents of a command call for an input pin to be deleted in step S8 in FIG. 4, input pin deletion processing is performed in step S18. The contents of this input pin deletion processing will be explained referring to FIG. 18. In FIG. 18, inside the macro indicated by the dotted lines it is conceivable that one might wish to delete the 3rd input pin from the top for the AND gates and the 3rd input pin from the top for the OR gates. This means that the input pins connected to output "/C" of the 3rd AND gate from the top on the left side and the output "/F" of the 6th AND gate are to be deleted.

Figure 19:
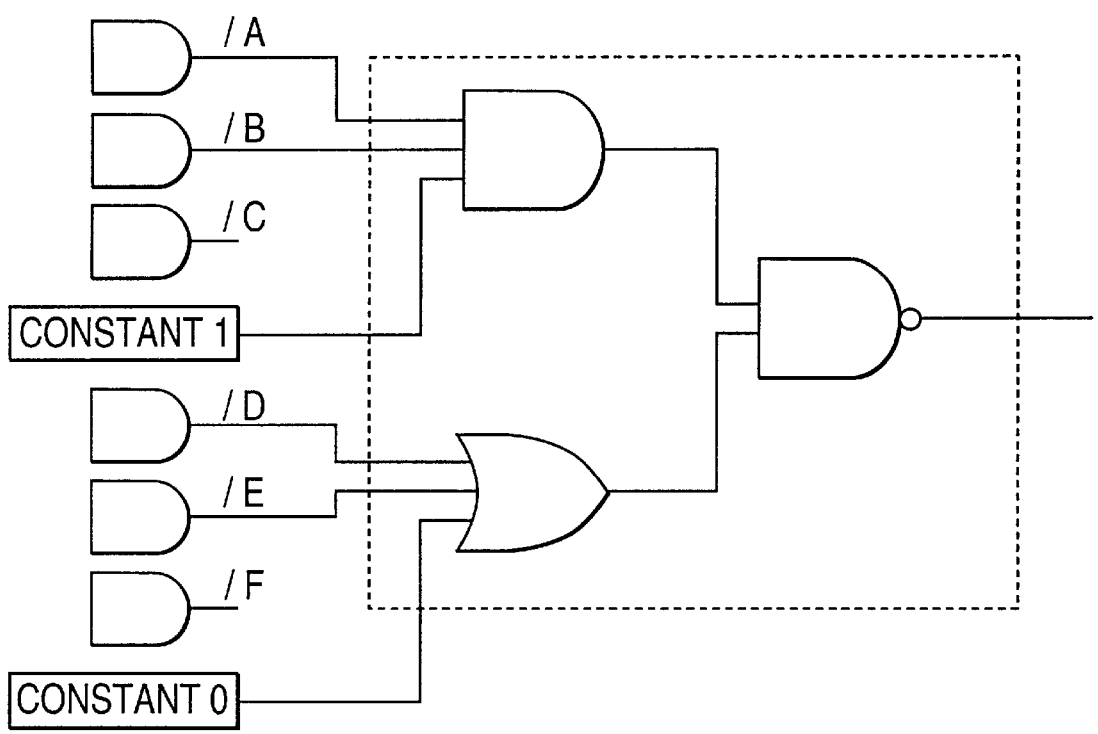
FIG. 19 is a figure showing the block connection method for constant 1 or constant 0.

In this invention, when an input pin is deleted, that is to say an input signal is cut off, a block of constant 1 or constant 0 is connected in place of the block that is cut off so that the cutoff does not result in a change of the function of the AND gate or OR gate; that is to say the gate continues to function correctly with respect to input signals that are not cut off. This connection method is explained in FIG. 19. In FIG. 19, blocks of constant 1 are connected to those AND gate input pins from which the input signals are to be cut off and blocks of constant 0 are connected to those OR gate input pins from which the input signals are to be cut off. In this way the AND gates and OR gates continue to function correctly in response to the 2 remaining input signals.

Thus, it is possible for a block of constant 1 or constant 0 to be connected upon instruction from the designer, but in the case of the cutoff of the input pin connections explained in FIG. 18 and FIG. 19, the system automatically connects a block of constant 1 or constant 0 corresponding to the cutoff instruction. Whether to connect a block of constant 1 or constant 0 is predetermined by the function of the gate to which the signal from the input pin is to be cut off. By storing information as to which is to be connected in a table, the cutoff can be done automatically.

Figure 20:
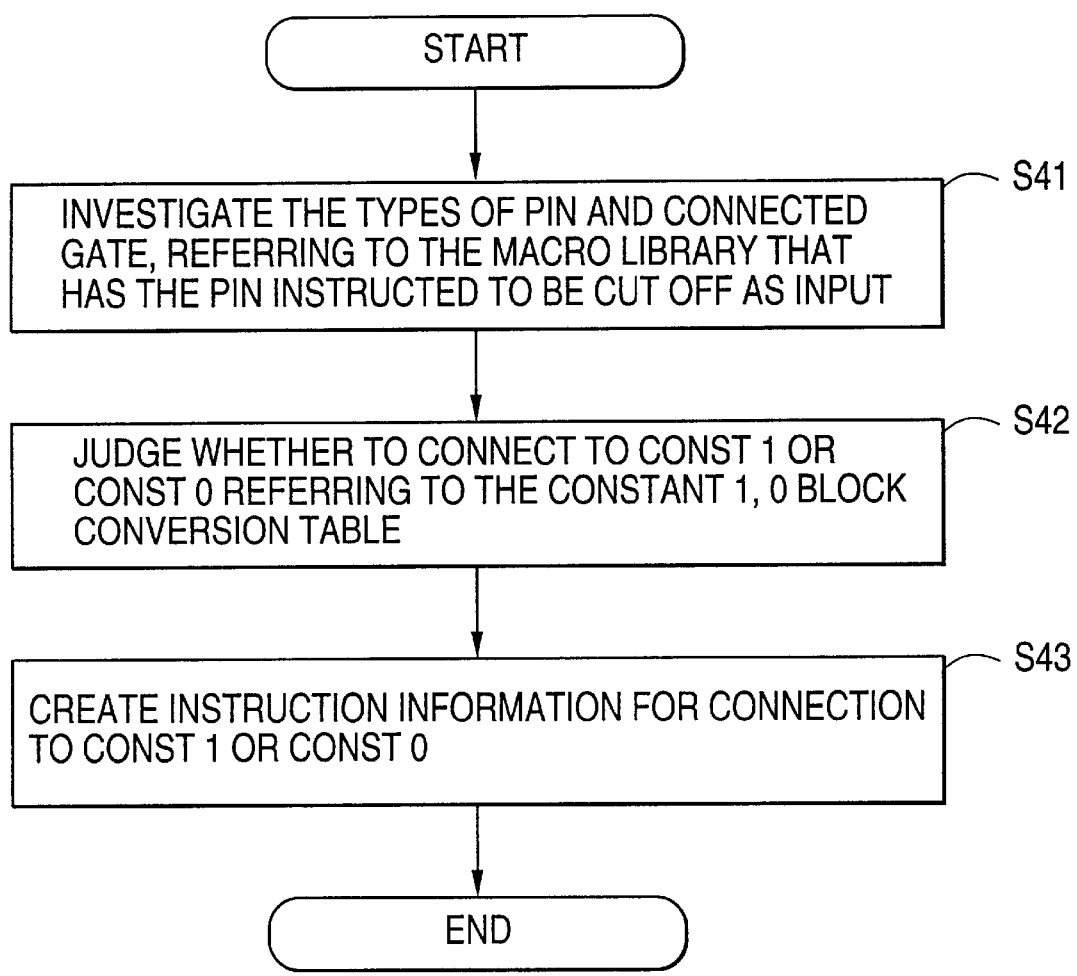
FIG. 20 is the flow chart for constant 1 or constant 0 block connection processing.

FIG. 20 is a flow chart of the connection of a block of constant 1 or constant 0. When the processing shown in FIG. 20 is started, first the system investigates the macro to which the pin to be cut off provides input to determine the type of gate that the input pin in question belongs to, referring to the macro library in step S41. In step S42, the conversion table is referred to determine whether a block of constant 1 or constant 0 is to be connected. Then in step S43 block connection information for a block of constant 1 or constant 0 is created to complete the processing. The designer starts this processing by, for example, selecting the FNET CMD "cutoff" in FIG. 16 and specifying the macro input pin.

Figure 21:
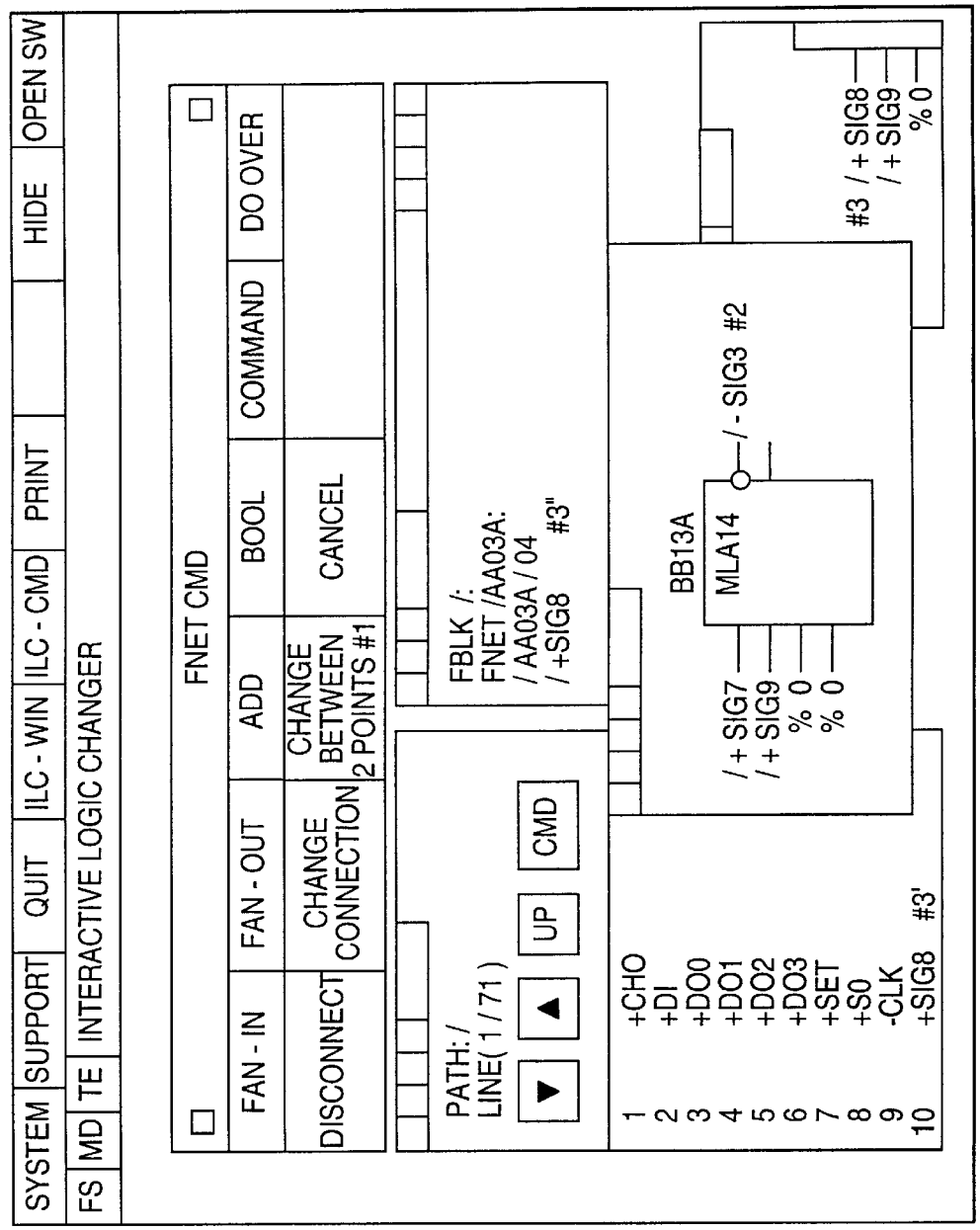
FIG. 21 is a figure explaining output pin connection change processing.

In FIG. 6A, if it is judged that the contents of a command call for an output pin connection to be changed in step S9, then output pin connection change processing is performed in step S19. FIG. 21 explains this output pin connection change processing, that is to say fan-out connection change processing.

Fan-out connection change processing is started by selecting "connection change" on the command menu. Among the output pins of a given macro, the names of the signal terminals that can be selected to change the fan-out destination are highlighted by turning yellow. The signal terminal names displayed in the window can be used to specify the name of the signal terminal to be changed, from among the present signal terminals, as the connection change destination. The signal terminal names displayed in the window are the same as those explained in FIG. 16.

Among the output pins of a given macro, the signal terminal name that is specified to change the fan-out destination is highlighted by changing from yellow to turquoise, as indicated by #2. If a mistake is made in the specification, the specification can be canceled by selecting "cancel" on the command menu. When the reconnection destination signal terminal name is selected as indicated by #3, #3' or #3", the operations necessary for reconnection are completed.

Figure 22A:
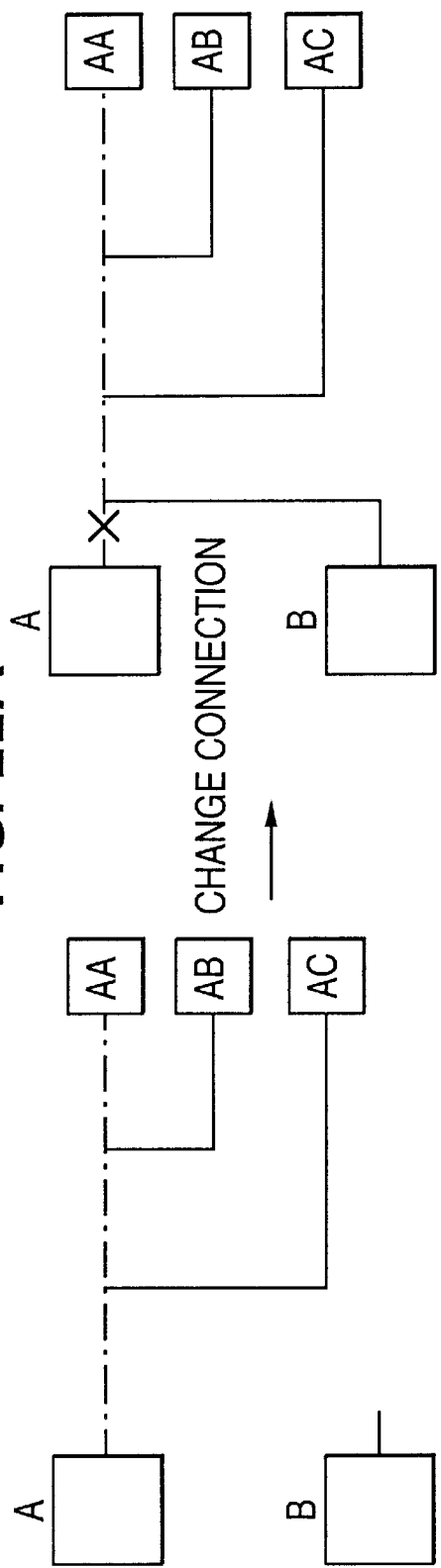
FIG. 22A is a diagram explaining a specific example of processing to change fan-out connections.
Figure 22B:
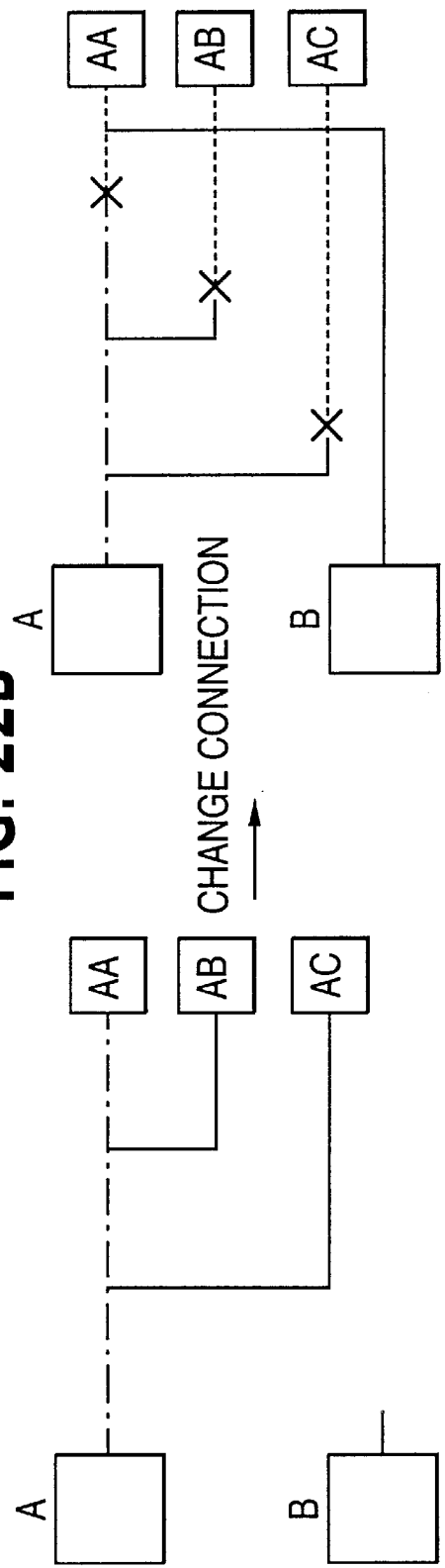
FIG. 22B is a diagram explaining a specific example of processing to change fan-out connections.

In this invention, fan-out reconnection is performed by means of fan-in reconnection processing for the fan-out destination block. This processing is explained in FIG. 22A and FIG. 22B. If for example the connection to the fan-out destination of block A is to be cut off and changed to the fan-out destination of block B, rather than cut the connection immediately after block A and connect the output of block B as shown in FIG. 22A, the connections are cut immediately before the fan-out destination blocks, in this case AA, AB and AC, and the output of block B is connected here as shown in FIG. 22B, so that the fan-out reconnections are done all at once.

FIG. 23 explains the fan-out reconnection processing corresponding to FIG. 21. In FIG. 23, the signal terminal fan-out destination selected by #2 is changed to, for example, the signal terminal fan-out destination selected by #3.

Figure 24:
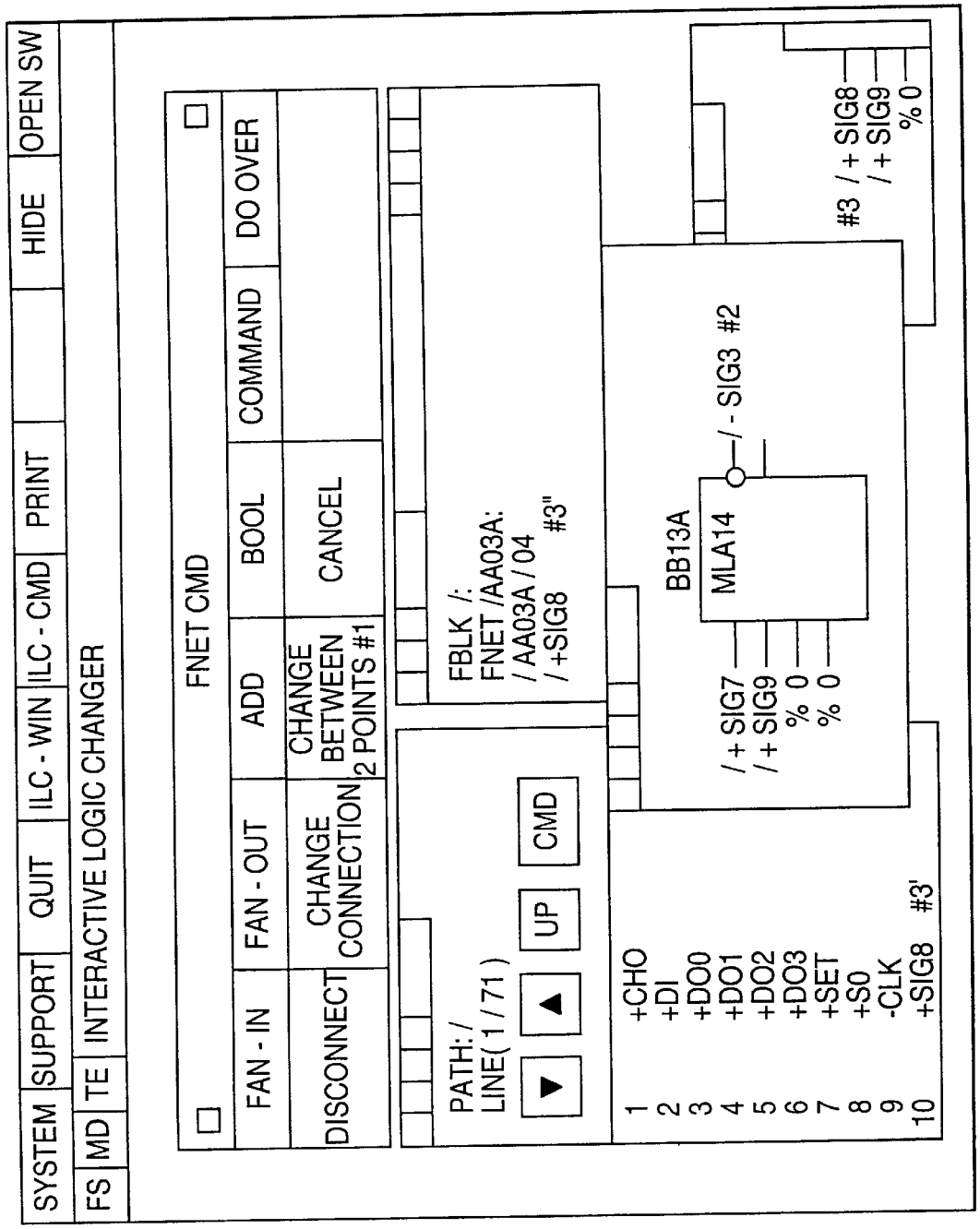
FIG. 24 is a diagram explaining fan-out interchange processing.

FIG. 24 is a diagram that explains fan-out interchange processing. This processing is also performed in step S19 in FIG. 6A. The operation for this processing is similar to that for the fan-out reconnection processing explained in FIG. 21. Fan-out interchange is performed between the signal terminal the name of which is selected by #2 and the signal terminals the names of which are selected by #3, #3' and #3".

Figure 25:
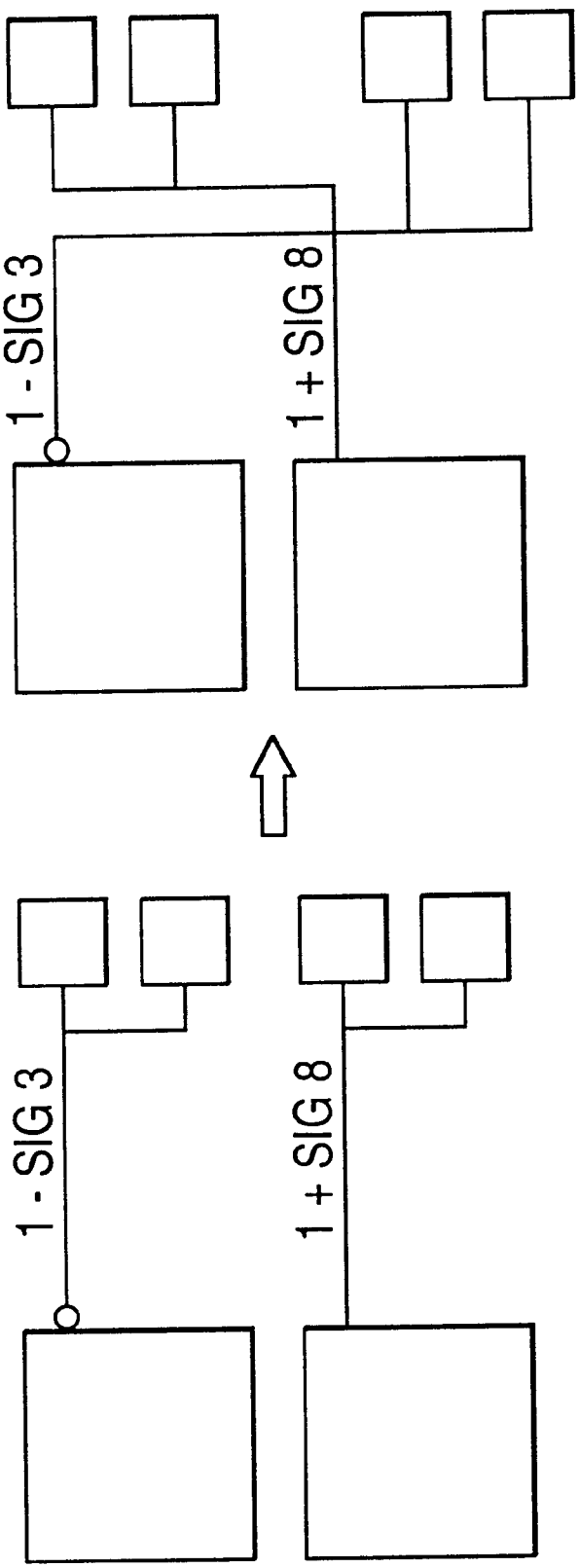
FIG. 25 is a diagram explaining a specific example of fan-out interchange processing.

FIG. 25 shows a specific example of fan-out interchange processing. In FIG. 25, the fan-out destinations connected respectively to 2 macro output pins are interchanged.

If the contents of a command are judged to call for the addition of a logical block in step S11 of FIG. 6B, then logical block addition processing is performed in step S21. FIG. 26 shows an exterior view of a block that can be added onto a simulation model, that is to say, an exterior view of a macro. Among the macro names, for example the "I" at the start of "IAND" does not have any particular meaning; this name identifies the object as an AND gate. "Open" indicates whether a block of constant 0 or constant 1 is to be connected if data input is not connected. On the simulation model, the connection is changed after this kind of block is added. The exterior appearance of macros for set type and reset type latches is exactly the same.

Figure 27:
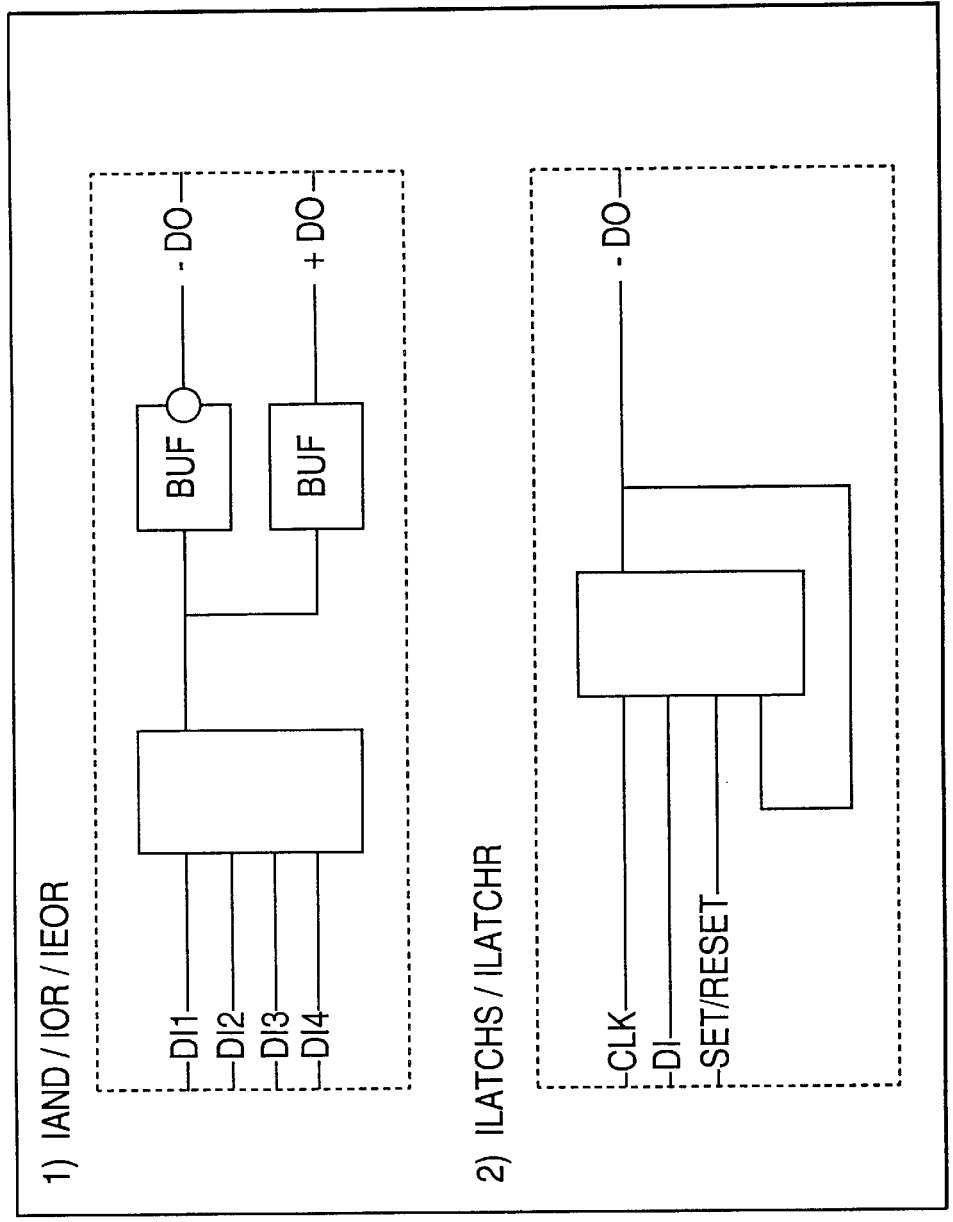
FIG. 27 is a figure showing the internal structure of a macro that can be added.

FIG. 27 shows the internal configuration of a macro. In the case of a macro which represents, for example, and AND gate, a NAND gate is formed by using a buffer for which the output has negative logic.

Figure 28:
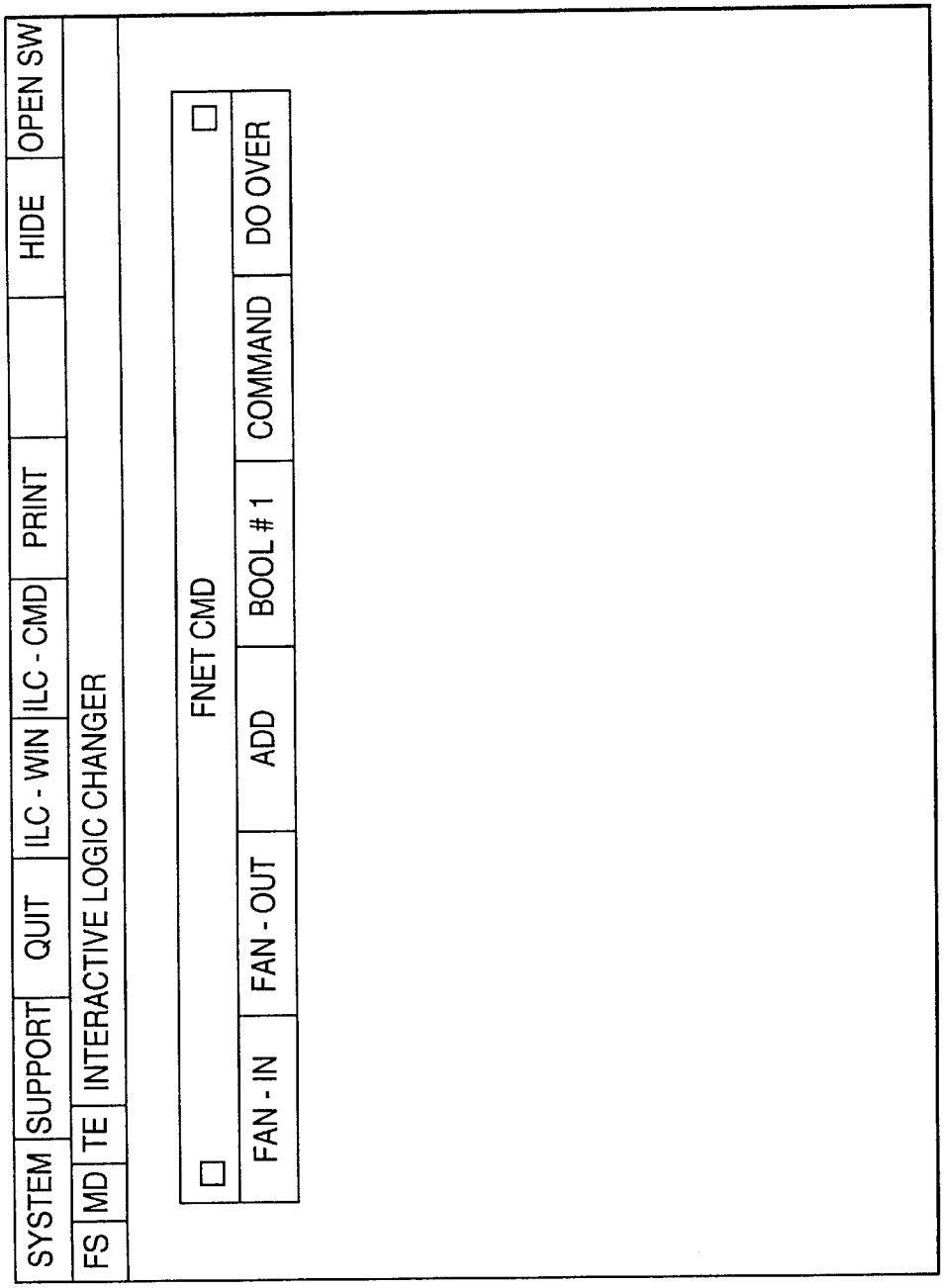
FIG. 28 is a diagram explaining the initial procedure for Boolean logic addition.

If it is judged that the contents of a command call for Boolean logic addition to be performed in step S12 of FIG. 6B, then Boolean logic addition processing is performed in step S22. FIGS. 28 to 34 are diagrams explaining this Boolean logical addition processing. FIG. 28 explains the initial procedure in which Boolean logic is defined, and the block names of blocks that are added and the numbers of input/output points, etc., are defined. When "Boole" is selected, as indicated by #1 on the FNET command menu, the block name and number of I/O pins definition menu appears.

When the block name and the numbers of I/O pins are specified on this menu, as indicated by #2 to #4, and then the ENTER key is pressed, the internal logic definition menu appears. Boolean block creation can be aborted by, for example, pressing the PF3 key.

Figure 29:
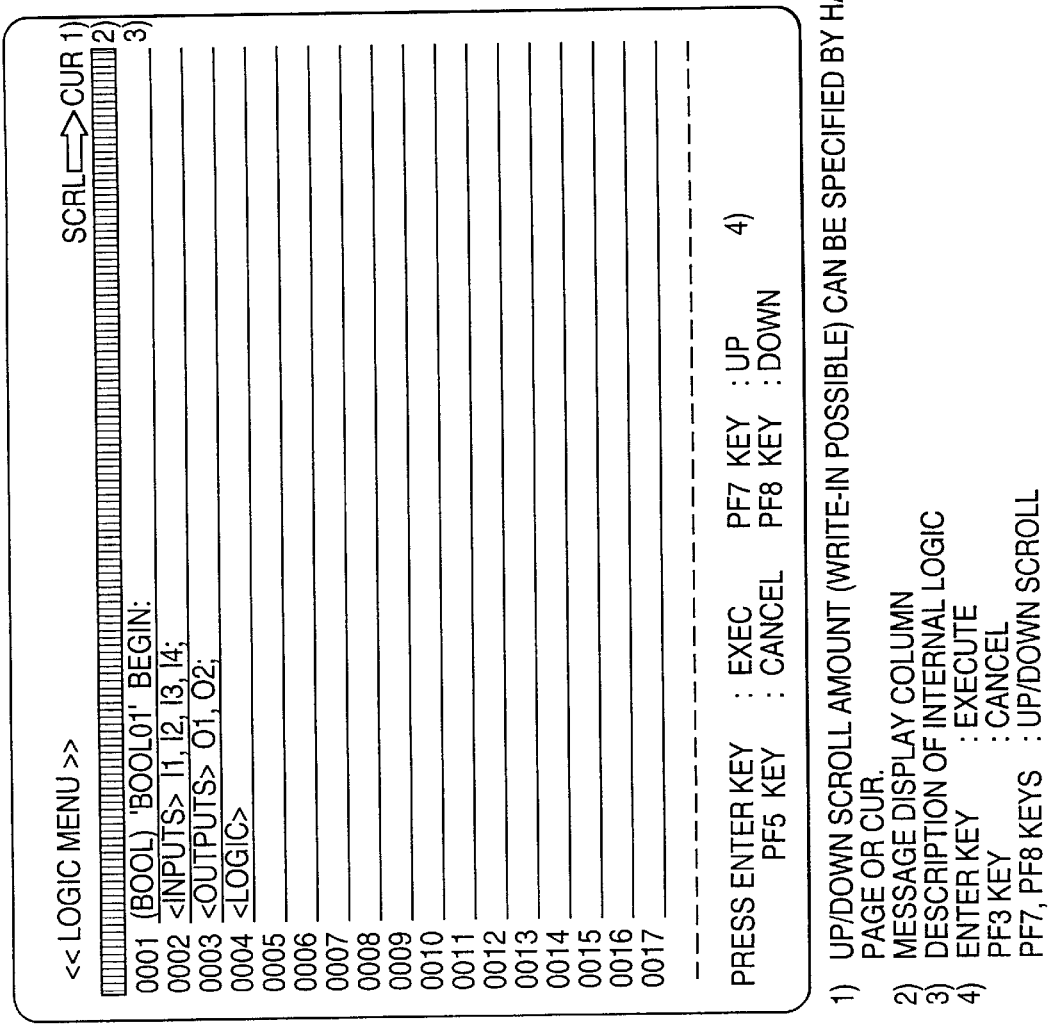
FIG. 29 is a figure showing the definition menu for the internal logic of a Boolean block.

FIG. 29 shows the Boolean block internal logic definition menu. FIG. 29 appears immediately after key input is performed for the block name and numbers of I/O pins definition menu shown in FIG. 28 and then the ENTER key is pressed. Here the Boolean block name is "BOOL01", there are 4 input pins I1 to I4 and there are 2 output pins O1 and O2. It is then sufficient for the designer to describe the logical relationship between input and output on the screen in Boolean form.

Figure 31:
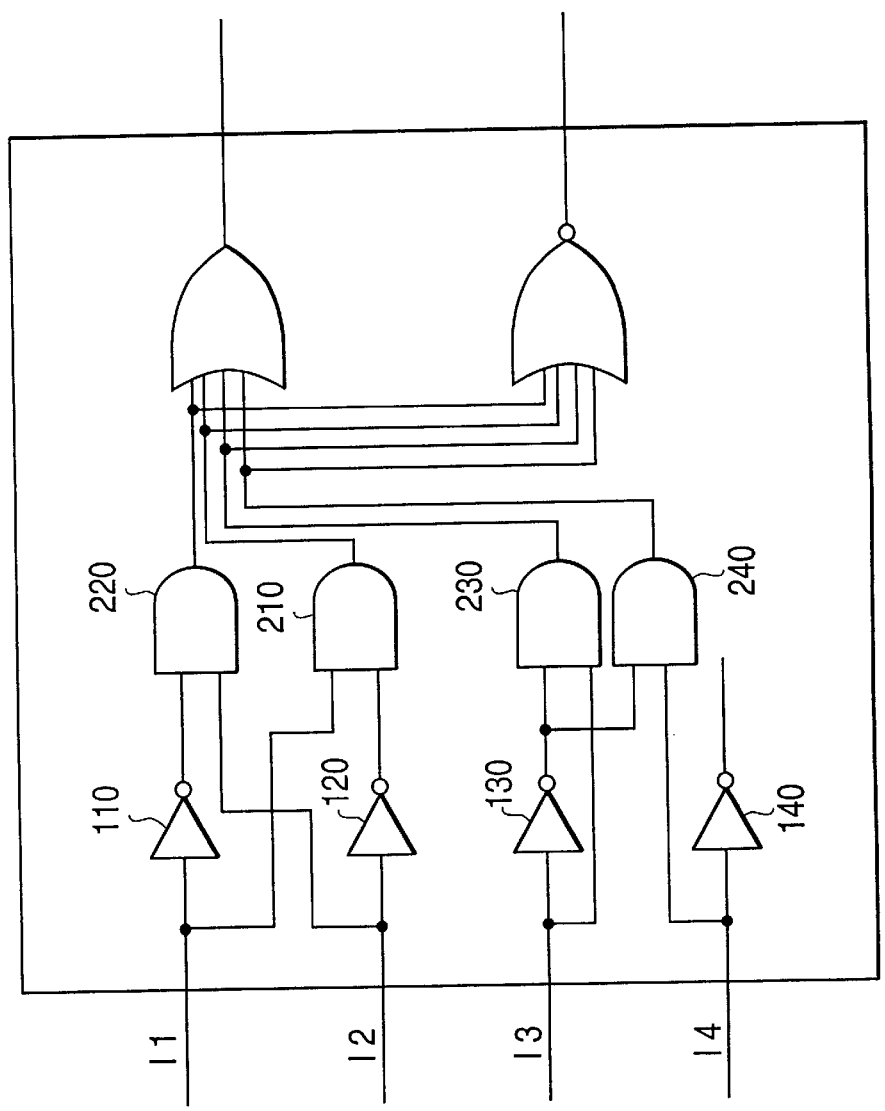
FIG. 31 is a figure showing the logical circuit corresponding to the descriptive example in FIG. 30.

FIG. 30 describes an example of the logic inside a Boolean block. FIG. 31 shows the logic circuit corresponding to this descriptive example. In the logical formula of FIG. 30, for example "110" indicates the inverter into which I1 is input in FIG. 31, and the symbol "¬" before 110 means that the logic is inverted. Logic that is defined in this way can be automatically output to the MONITOR window. That is to say, it is possible to refer to the corresponding logic with the block name as a key.

Figure 32:
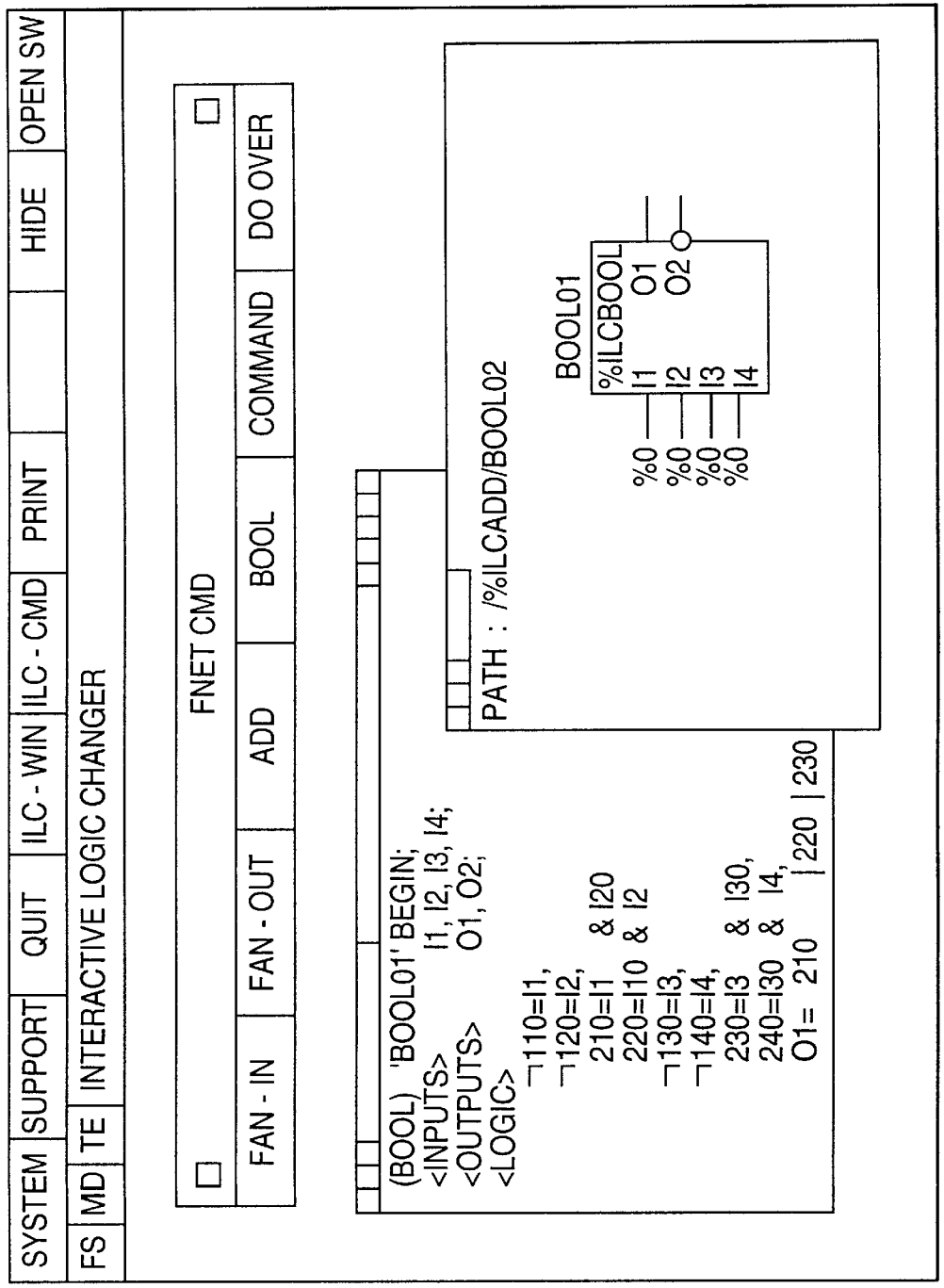
FIG. 32 is a figure showing the display in the FNET window of a defined Boolean block.

FIG. 32 shows the display of a defined Boolean block in the FNET window. This shows the contents of the window that appears after the logic is defined in FIG. 30 and then the ENTER key is pressed. Thus, for a Boolean block displayed in the FNET window, for example all of the functions that can be executed on the FNET window, such as the change between 2 fan-in points explained in FIG. 16 and FIG. 17, can be used; a change of fan-out connections can also be executed.

Figures 33A, 33B:
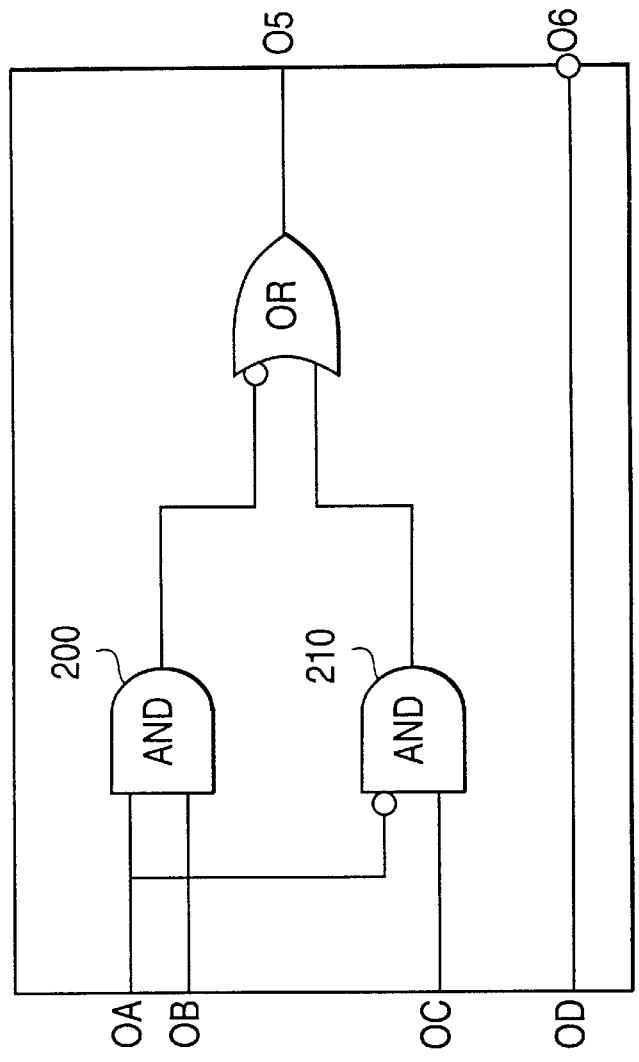
FIG. 33A is a figure showing another descriptive example of the internal logic of a Boolean block.
FIG. 33B is a figure showing the logical circuit corresponding to the descriptive example in FIG. 33A.

FIG. 33A describes another example of logic inside a Boolean block. FIG. 33A shows an example of a logical formula description; FIG. 33B shows the circuit diagram corresponding to this logical formula.

In the Boolean logical addition processing performed in step S22 of FIG. 6B, the interpretation for the Boolean block internal logic is performed automatically by the graphic screen display and change instruction section 31 in FIG. 5. FIG. 34 shows Boolean block interpretation processing, that is to say, a circuit creation algorithm. In FIG. 34, when the processing starts the Boolean syntax is analyzed in step S51; the gate corresponding to the operator on the right side of the Boolean formula is created in step S52; and the gate that has been created is named in step S53. If a name has been specified in an INPUT statement, then that name is used; otherwise the name on the left side of the Boolean formula is used. Next, if the inversion symbol "¬" appears on the left side of the Boolean formula, a circle mark is set in place to indicate that in step S54; and names are given to the connections between gates in step S55 to complete the processing.

Figure 35:
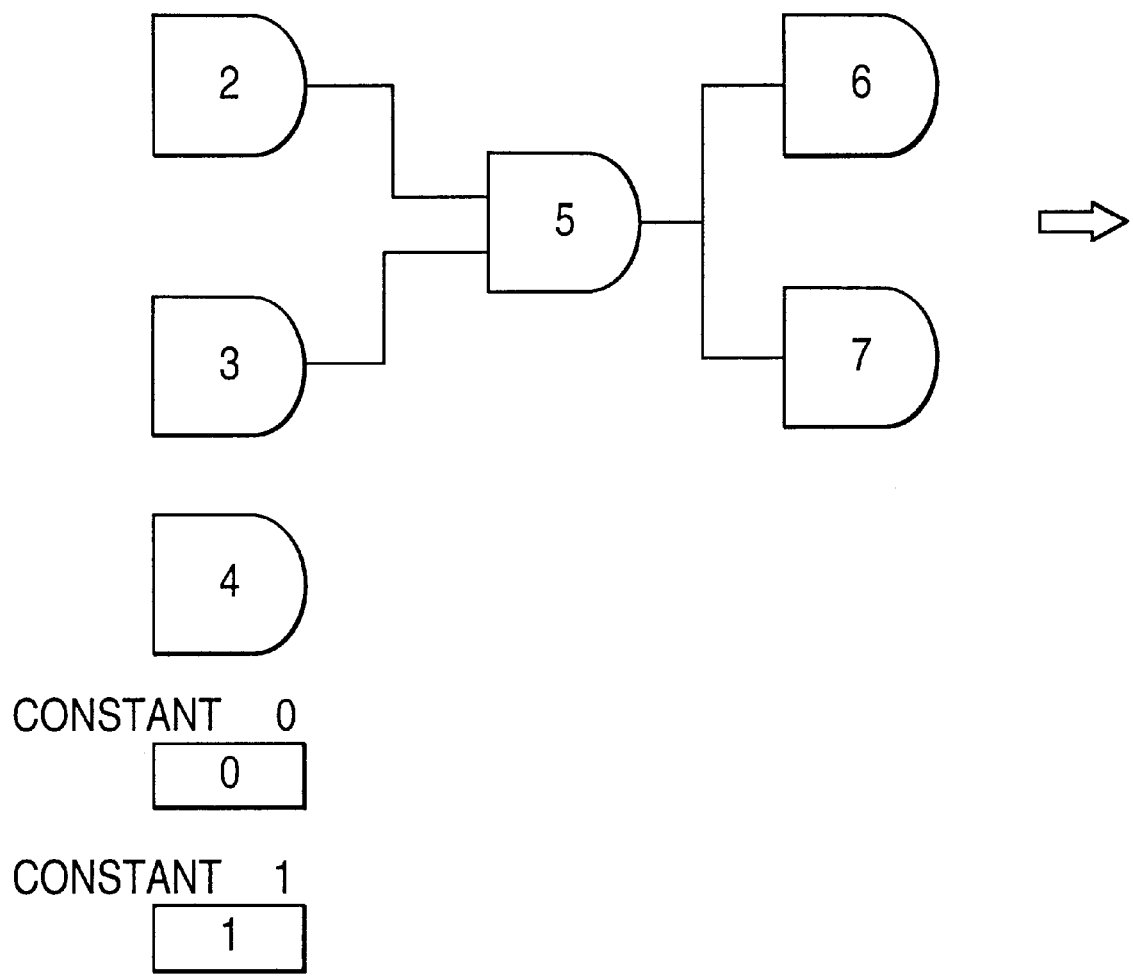
FIG. 35 is a diagram (1 of 2) explaining an example of change of a simulation model.
Figure 36:
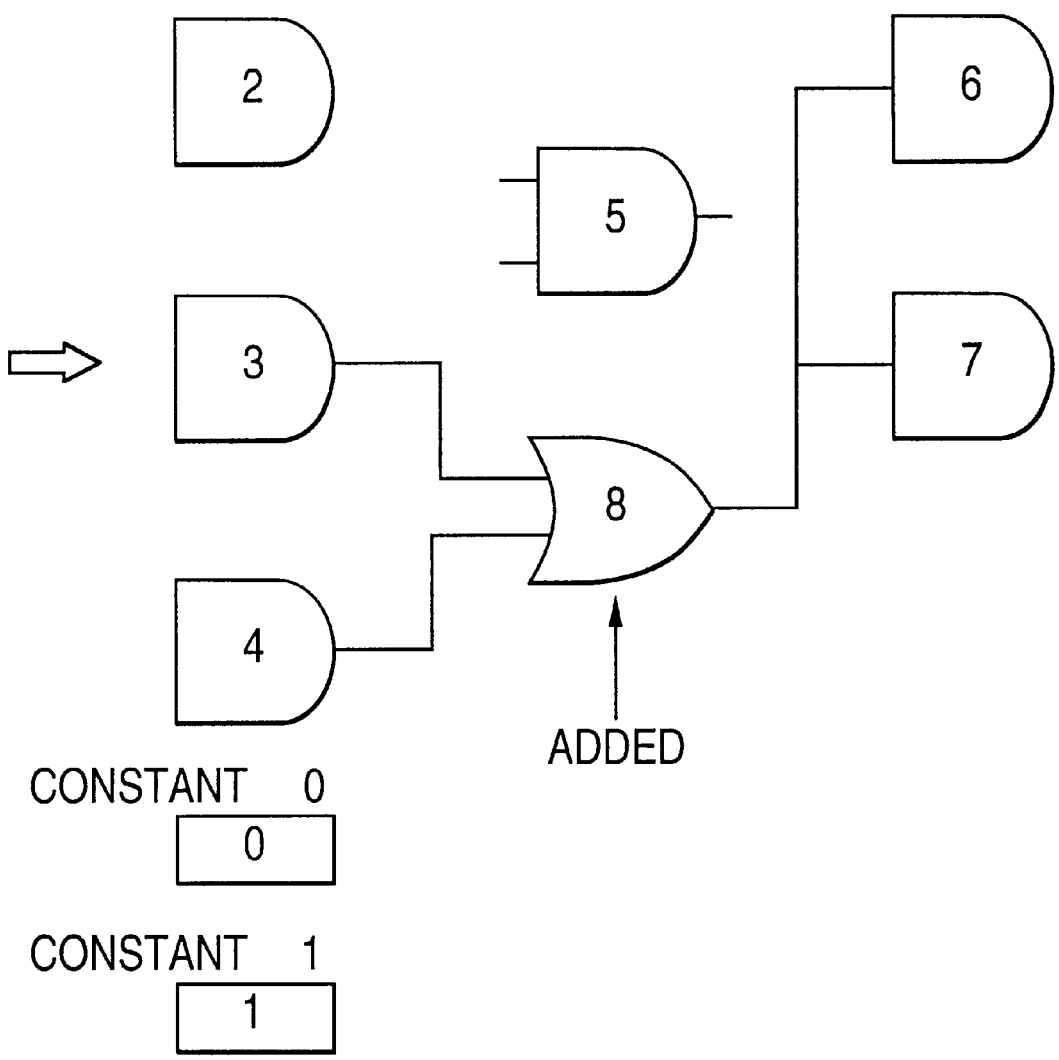
FIG. 36 is a diagram (2 of 2) explaining an example of change of a simulation model.

FIGS. 35 to 39 show how the data inside the system are changed when the simulation model is changed. In FIG. 35, the input and output of the AND gate 5 are disconnected, an OR gate is added, the outputs of the AND gates 3 and 4 are used as inputs for this OR gate, and the output of this OR gate is used as input for AND gates 6 and 7. FIG. 36 shows the circuit diagram after the change. OR gate 8 is the one that was added. The gate numbers are assigned consecutively, so this OR gate 8 is the 8th gate.

FIG. 37 shows the format of the table in which data expressing the simulation model are stored. This format is common to the simulation model files stored in the simulation model storage section 14 in FIG. 4, the software simulator 21, and the internal tables of the specialized simulation hardware 16, and can be used in common for all of the logical correction algorithms.

In this table, the gate number is the same as the gate number discussed above; information as to gate type, such as AND or OR, is coded and stored in the gate type column. Among the gate types, "CONST0", for example, is the constant 0 block reference to above. Fan-in–1 to 4 gives the gate number of the gate connected to the fan-in side; among these, "0" indicates that nothing is connected, and "1" indicates that a constant 1 block is connected. In this example the number of fan-ins is fixed at 4.

Information concerning fan-out consists of a fan-out pointer and a fan-out memory. This is because the number of fan-outs for one gate is not fixed. The fan-out pointer is a pointer that gives the fan-out memory address; the numbers of the gates that become fan-outs for that gate are stored consecutively starting from the location indicated by this pointer, and there is an end bit 1 at the last position of the target data.

Figure 38:
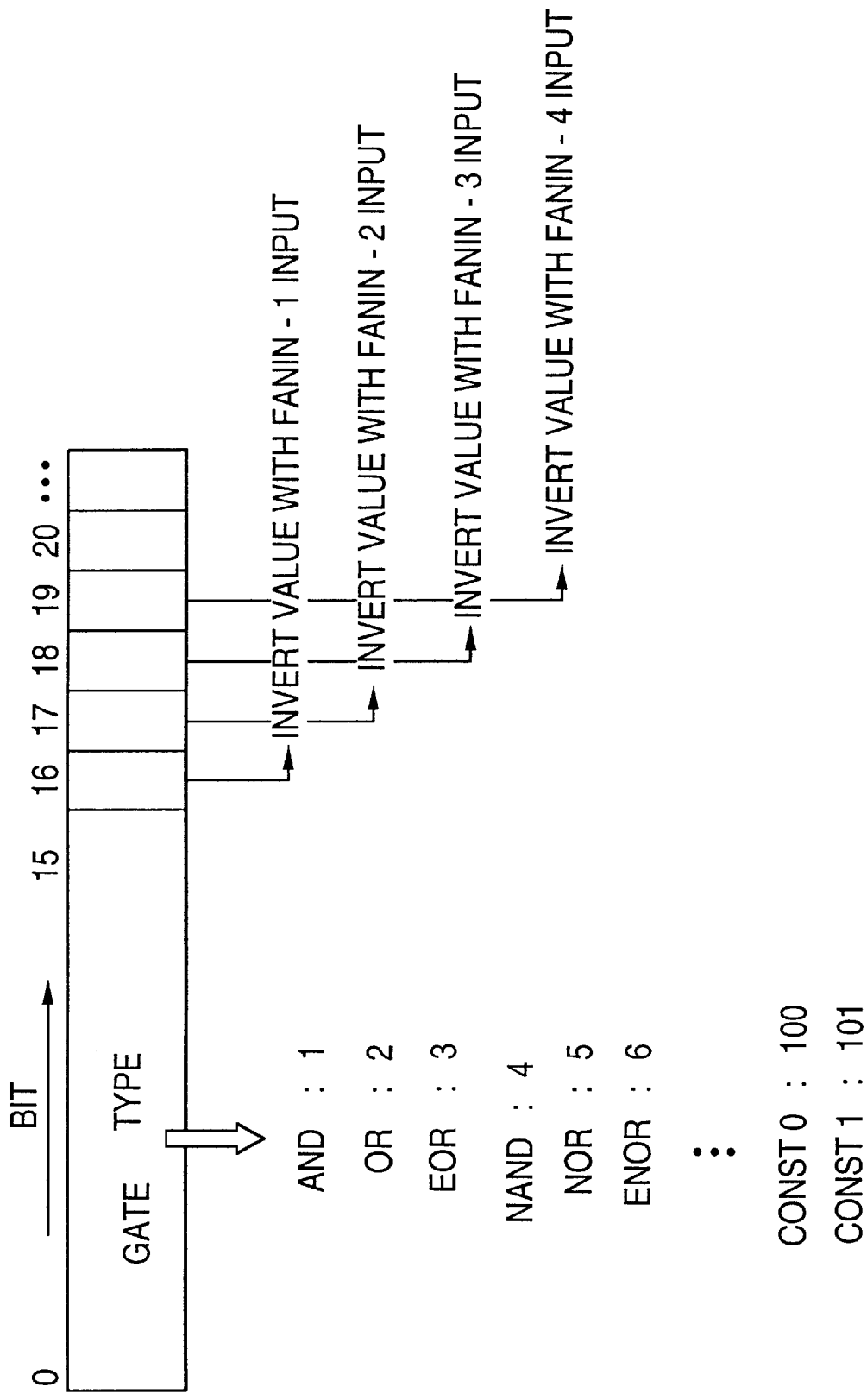
FIG. 38 is a diagram explaining the attribute flag storage location.

Although not shown in FIG. 37, various attribute flags are stored after the gate type. FIG. 38 explains these attribute flag storage locations. In FIG. 38, the 16 bits from the 0th bit to the 15th bit indicate the gate type. The following 16th through 19th bits store flags that indicate whether or not the values on the input side of FANIN–1 to 4 are to be inverted. Thus, the various attribute flags are stored immediately after the gate type.

FIG. 39 shows the changes in the stored table contents when the simulation model undergoes the change from FIG. 35 to FIG. 36. Comparing FIG. 39 to FIG. 37, the fan-out pointer value corresponding to AND gate No. 3 becomes "4"; corresponding to this the gate number "8" is stored at the fan-out memory address 4, and the end bit becomes "1". The same is true regarding gate No. 4. For AND gate No. 5, the inputs and outputs are all disconnected, so the values of FANIN –1 and 2 become "1", and the fan-out pointer value becomes "0". For AND gate Nos. 6 and 7, the FANIN –1 value becomes "8". In addition, OR gate No. 8 has been added, and the FANIN value and the fan-out pointer value corresponding to FIG. 36 are stored.

Thus, simulation model corrections are executed by rewriting data for gates stored on a table, and adding data to the table as necessary. Consequently, if this kind of table is loaded onto the main memory or specialized hardware memory, then, by setting an area aside in the table from the start, the simulation model can be easily modified. Since the data do not have to be reordered when the change is made this way, the simulation model change processing can be executed very rapidly.

Figure 40:
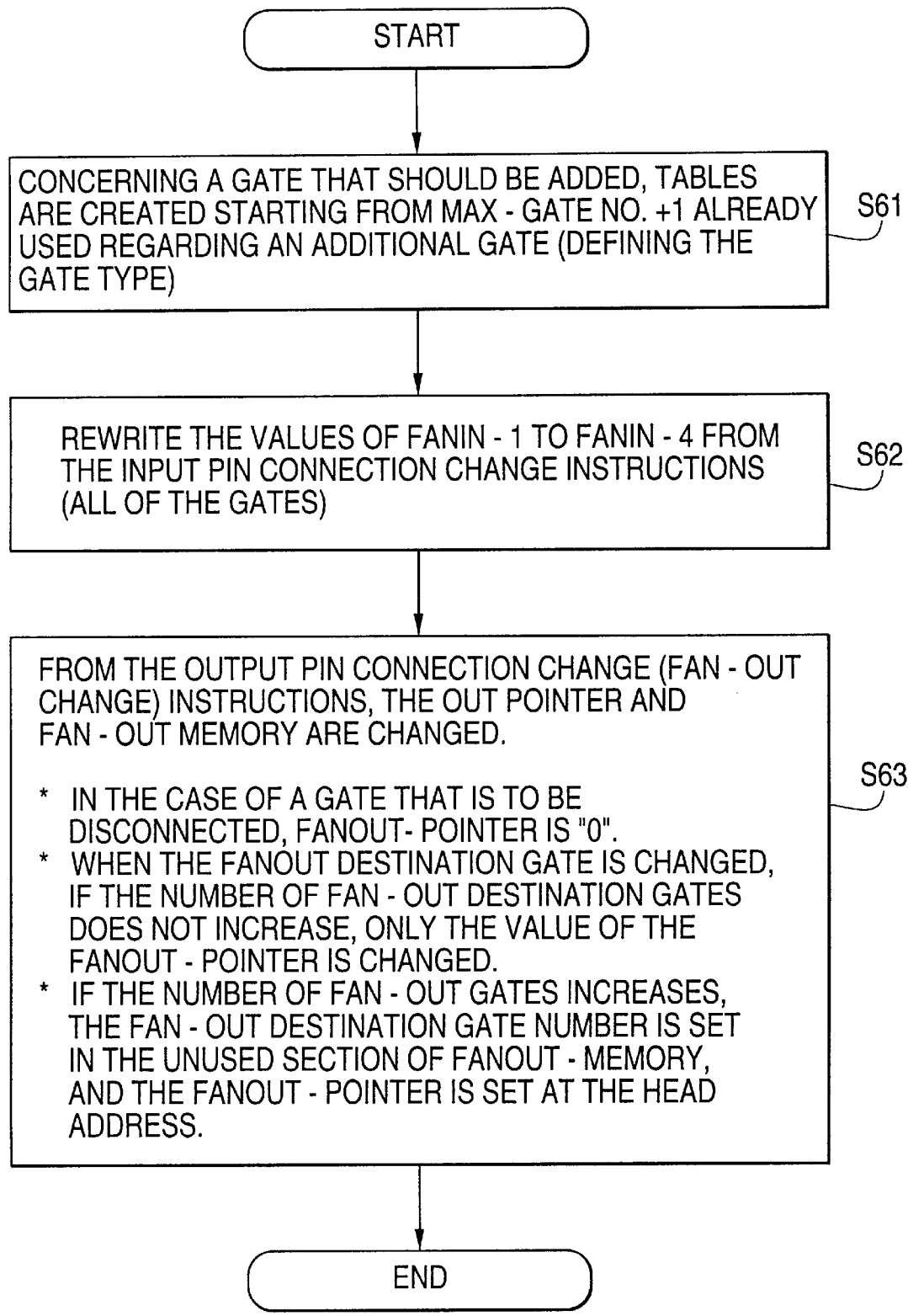
FIG. 40 is a flow chart of logical change data creation processing.

The change of the table data that accompanies a change of the simulation model explained in FIG. 37 and FIG. 39 is, naturally, performed automatically by the system, without the designer having to be conscious of it. This processing corresponds to the logical change data creation processing in step S31 in FIG. 6C. FIG. 40 is a detailed flow chart of this logical change data creation processing. In FIG. 40, when the processing starts, first, if there are gates to be added in step S61, the table creation starts by defining the gate type etc. starting from the unused table area corresponding to that gate, that is, the location of the next gate number after the largest gate number of the gate in which data are already stored.

Next, in step S62, the values of FANIN–1 to 4 are rewritten to correspond to the input pin connection change instructions, with all of the gates which are objects of the change also being objects of the rewriting. In step S63, the fan-out pointer and fan-out memory contents are changed based on the output pin connection changes, that is, the fan-out change instructions. In this processing, if a gate is disconnected, the value of the fan-out pointer is taken to be "0". Even when the fan-out destination gate is changed, as long as the number of fan-out destination gates does not change, only the value of the fan-out pointer changes. If the number of fan-out destination gates increases, new fan-out destination gate numbers are set in the unused fan-out memory area, then the first (head) address among those is set as the fan-out pointer value to complete the processing.

In the above discussion, the various types of processing corresponding to the command read in step S2 corresponding to FIG. 6A and FIG. 6B were explained in detail. If, for example, hierarchical name display processing is carried out in step S13, the name search screen explained in FIG. 10 appears. In this screen, if for example the position of "CMD" is indicated by the cursor, the command input field is displayed; then macros can be displayed and connection change commands can be input. Also, as is for example explained in FIG. 14, after a back trace is performed logical addition processing can, for example, be performed by Boolean formulas by specifying the command "BOOL". Thus, other processing can be called from any window by hitting the command menu or by inputting a command into the command input field. In this case, the new window needed by that processing is automatically created.

Next, an embodiment is described in which a simulation model read onto main memory by the software simulator 21 is changed directly.

Figure 41:
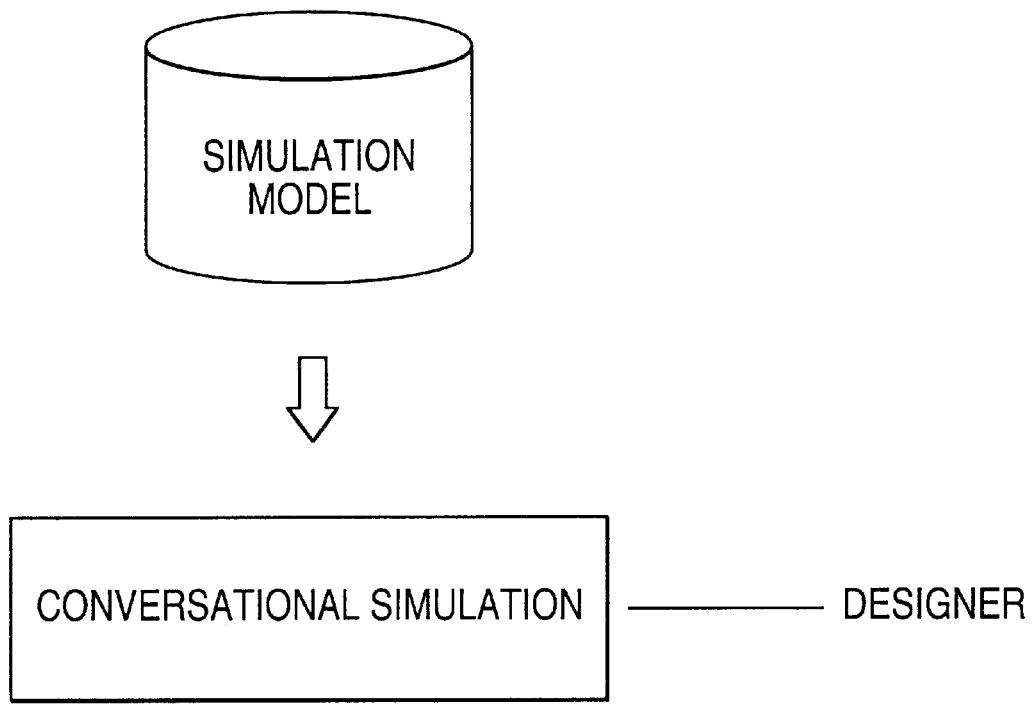
FIG. 41 is a figure showing the conversational type simulation in one embodiment of this invention.

FIG. 41 shows the concept of conversational simulation. In FIG. 41, the simulator executes the logic circuit simulation while conversing with the designer. If the design is to be changed while a simulation is in progress, the circuit data information, which is an example of the simulation model read onto the main memory, is changed on the spot while the simulation continues. The contents of the circuit data information are the same as the contents of the simulation model stored in the simulation model storage section 14. However, the circuit data information only exists on main memory while the simulation is being executed; the simulation model is stored in an external memory device such as a DASD (Direct Access Storage Device) before the simulation starts. Here, the simulation model is not necessarily changed, because the circuit data information on main memory is changed directly.

Figure 42:
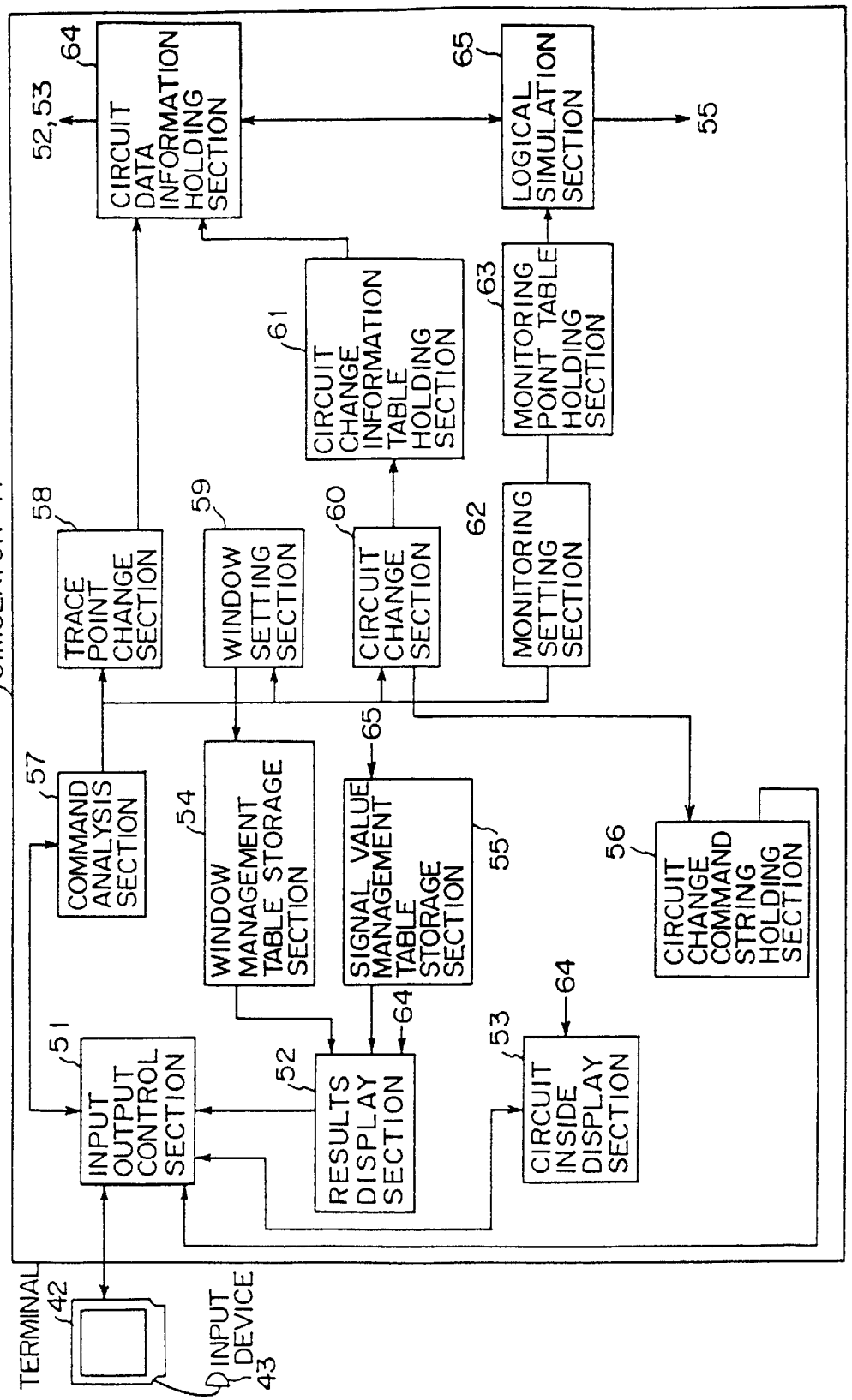
FIG. 42 is a diagram showing the structure of a conversational type simulator that can change circuit data information.

FIG. 42 shows the configuration of a conversational type simulator that can change the circuit data information while a simulation is being executed. In FIG. 42, the simulator 41 corresponds to the conversational simulator in FIG. 41. The terminal 42 corresponds to a graphic display. The input device 43 could be, for example, the keyboard and mouse of the terminal 42.

The simulator 41 includes the input/output control section 51, the results display section 52, the circuit inside display section 53, the window management table storage section 54, the signal value management table storage section 55, the circuit change command string holding section 56, the command analysis section 57, the trace point change section 58, the window setting section 59, the circuit change section 60, the circuit change information table holding section 61, the monitoring setting section 62, the monitoring point table holding section 63, the circuit data information holding section 64 and the logic simulation section 65.

The input/output control section 51 executes input/output interface processing for the interface with the terminal 42. The circuit data information holding section 64 stores circuit data information for the logic circuit that is the object of simulation. The logic simulation 65 executes the simulation using the circuit data information held in the circuit data information holding section 64. The results information is registered in the signal value management table in the signal value management table storage section 55. The signal value management table stores signal value time series data for each signal terminal comprising the signal results information.

The window setting section 59 selects 1 or more of the (arbitrary) results information display formats by means of conversation with the user, and sets these in the window management table in the window management table storage section 54. A free format display format defined by the user is stored in the window management table; management of multiple windows, etc., is performed using this. The results display section 52 displays results information on a display screen of the terminal 42 using the window management table and signal value management table data.

The circuit inside display section 53 displays the logic circuit interior on the display of terminal 42 using the circuit data information in the circuit data information holding section 64. Circuit changes indicated by the user on the displayed logic circuit screen are held as a circuit change command string in the circuit change command string holding section 56.

The command analysis section 57 receives commands from the user through the input/output control section 51, and analyzes them. If a command is a circuit change command that instructs a circuit change, control passes to the circuit change section 60. The circuit change section 60 stores the circuit change commands in the circuit change command string holding section 56, and creates a circuit change information table in the circuit change information table holding section 61. Then the circuit change section 60 uses the circuit change information table to correct the logic circuit by rewriting the circuit data information in the circuit data information holding section 64.

After that, the logic simulation section 65 continues the simulation using the changed circuit data information. In addition, the circuit inside display section 53 displays the corrected logic circuit, referring to the changed circuit data information. The circuit change command string can be output to, for example, a file through the input/output control section 51, so that its contents can later be reflected in the data base.

The trace point change section 58 obtains signal terminal information for starting or ending a trace (trace information) by conversation with the user, and adds it to the circuit data information. The logic simulation section 65 changes the trace point by adding or deleting signal terminal values within the signal value management table in accordance with the trace information. Here, "trace point" means a signal terminal simulation results on which are saved and displayed. Even when a new circuit is added in accordance with the circuit change information table, the added circuit can be traced by adding the corresponding trace information.

The monitoring setting section 62 creates a monitoring point table in which the measurement conditions of the monitored points, monitored timing, etc. are set in the monitoring point table holding section 63 by conversation with the user. The logic simulation section 65 executes the simulation while referring to the monitoring point table, thus permitting unstable states of the logic circuit to be detected.

Figure 43:
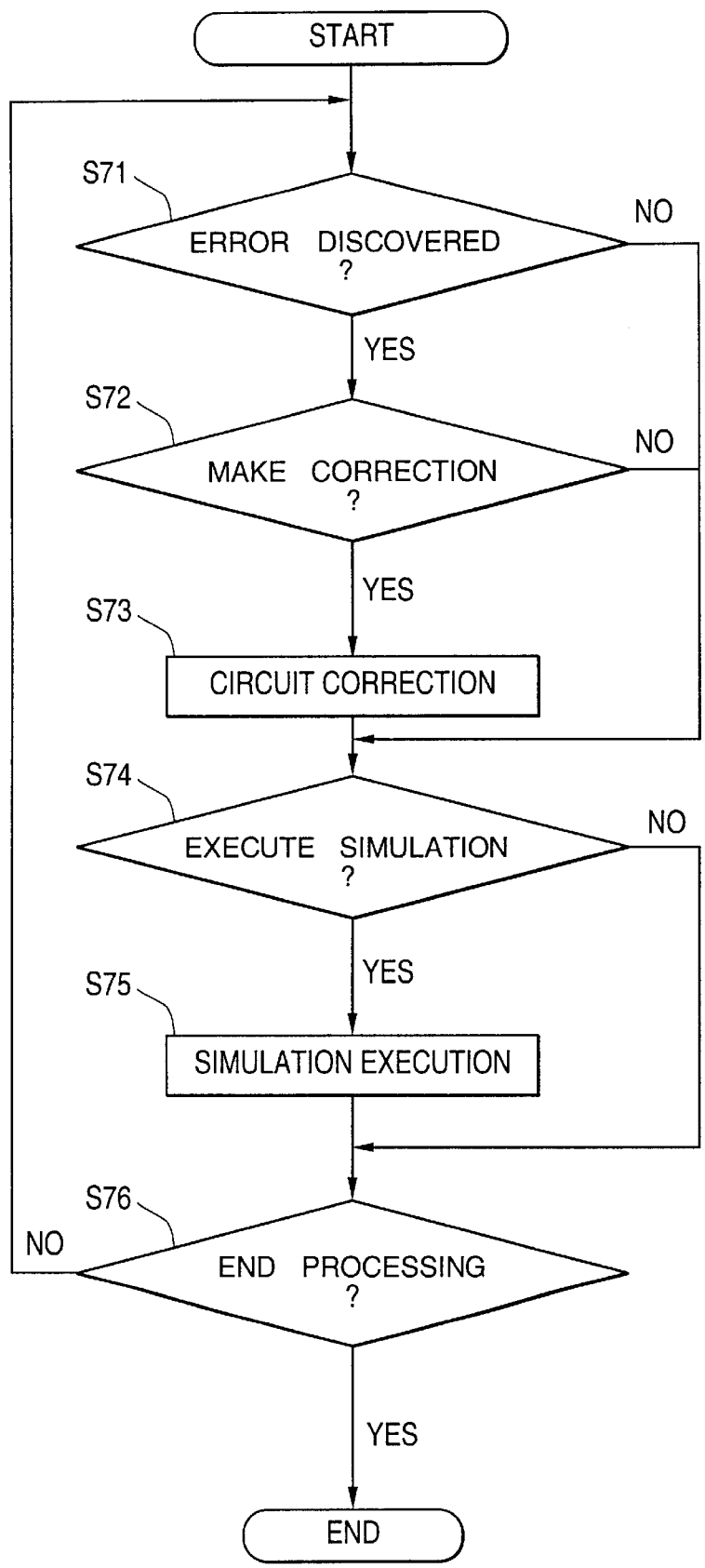
FIG. 43 is a flow chart of the conversational type simulator in this embodiment.

FIG. 43 is a flow chart of conversational simulation by the simulator 41. In FIG. 43, when the simulation is started, the user investigates whether or not there is an error in the circuit (step S71); if an error is discovered, that fact is input using the input section 43 by the user. When this is done, the input/output control section 51 asks the user whether or not the circuit is to be corrected (step S72); if the answer is YES, the simulation is temporarily halted. Then the circuit change section 60 changes the circuit data information in accordance with the circuit change commands input by the user (step S73).

Next, the input/output control section 51 asks the user whether or not the simulation is to be resumed (step S74). If the answer is YES, the simulation of the corrected circuit is executed (step S75). Then, when there is an instruction to end the simulation (step S76, YES), the processing is ended.

If an error is discovered in step S71, and when a correction is not made in step S72, the processing resumes from step S74; if the answer in step S74 is NO, then the processing continues with step S76 and subsequent steps. If there is not an END instruction in step S76, then the processing starting with step S71 is repeated.

Figure 44:
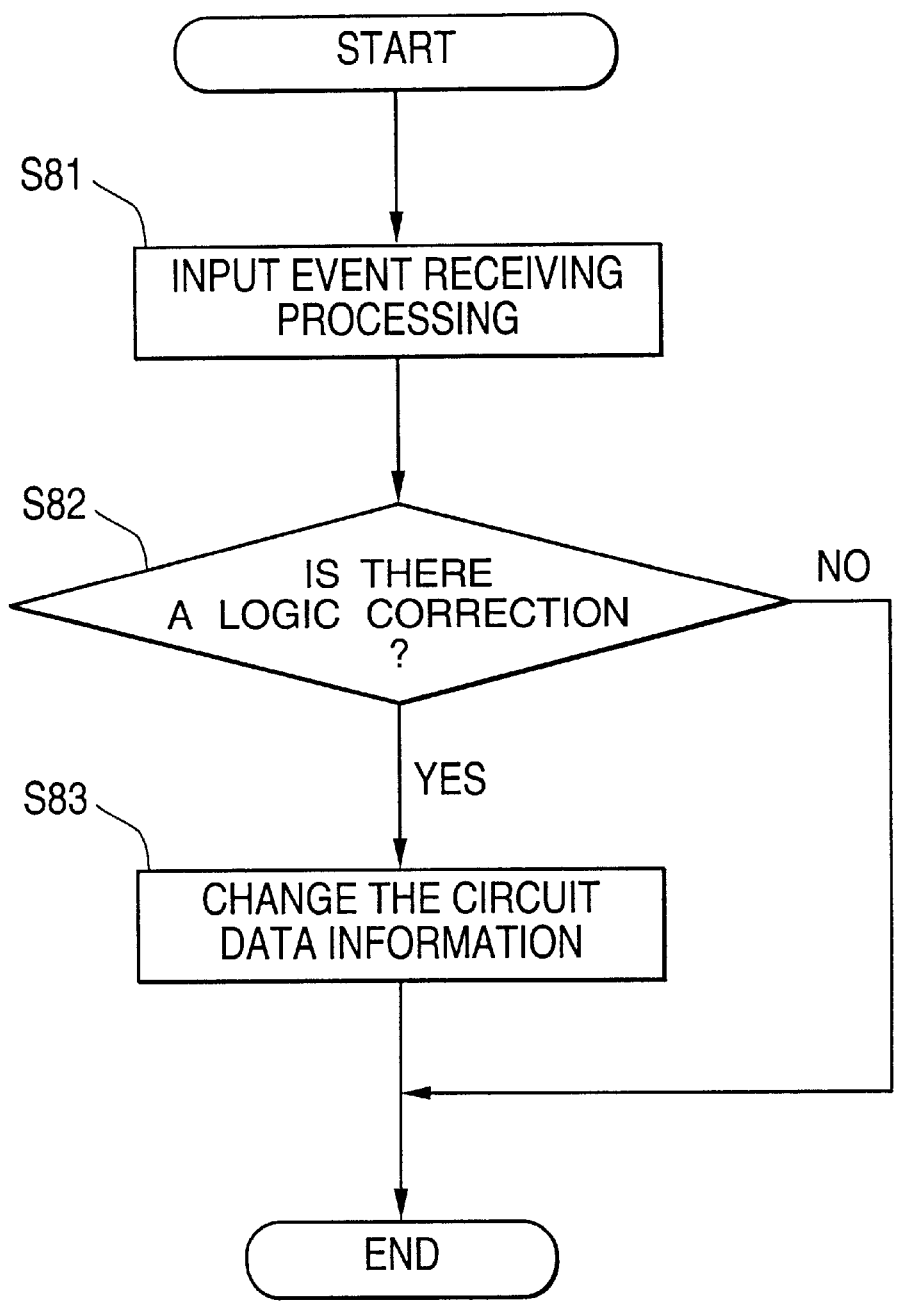
FIG. 44 is a flow chart of circuit modification processing.

FIG. 44 is a flow chart of the circuit correction processing in step S73 in FIG. 43. When the processing shown in FIG. 44 starts, first the input/output control section 51 receives the circuit change command (input event) (step S81), and stores it in the circuit change command holding section 56. The circuit change section 60 investigates whether or not a logic correction is called for in the circuit change command that was input (step S82). If a correction is not necessary, then the processing ends at that point. If a circuit change is necessary, then a circuit change information table is created, the circuit data information is changed (step S83), and the processing ends.

Thus, if the circuit data information is changed directly, the circuit can be corrected during the simulation and its action is checked immediately, shortening the time used for circuit design.

Next, let us explain a specific example of circuit correction, referring to FIGS. 45 through 53.

Figure 45:
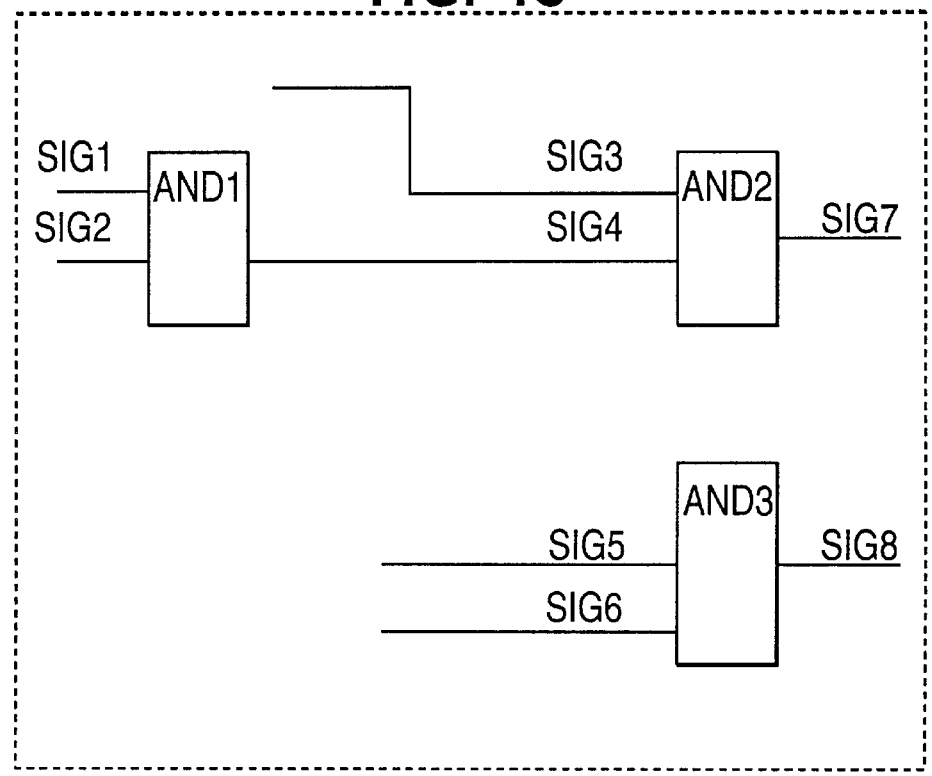
FIG. 45 A diagram showing an example of a logic circuit.
Figure 46:
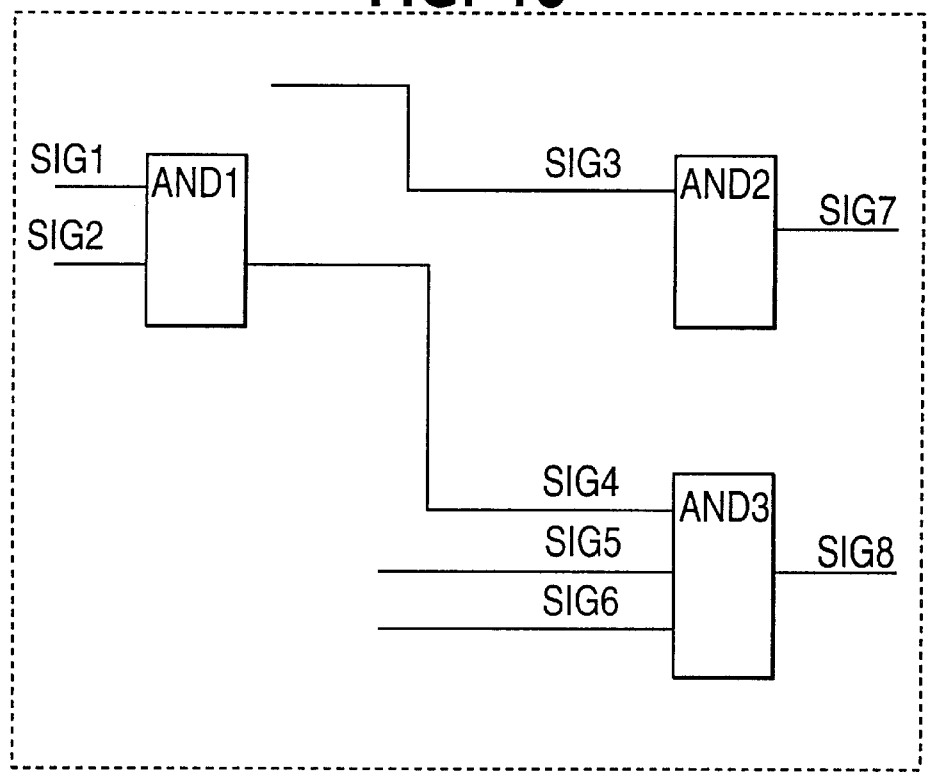
FIG. 46 A diagram showing a logic circuit after change.

FIG. 45 shows one example of a logic circuit that is the object of a simulation. FIG. 46 shows an example of a logic circuit changed from the one shown in FIG. 45. In FIG. 45 and FIG. 46, AND1, AND2, and AND3 show the AND circuit; SIG1, SIG2, SIG3, SIG4, SIG5, SIG6, SIG7 and SIG8 are the respective input signals or output signals of the AND circuit.

In FIG. 45, AND1 receives the inputs SIG1 and SIG2, and outputs SIG4 to AND2. AND2 receives SIG3 and SIG4 as inputs, and outputs SIG7. AND3 receives SIG5 and SIG6 as inputs and outputs SIG8. In FIG. 46, the circuitry has been changed so that SIG4, which is output from AND1, has been disconnected from AND2 and is input to AND3 instead. Here, SIG3 becomes the only input signal to AND2; it is also possible to add another signal as input if necessary by making the next change.

FIG. 47 shows an example of circuit data information that is held in the circuit data holding section 64 while the logic circuit shown in FIG. 45 is being simulated. Here the circuit data information concerning all of the circuitry except what is shown in FIG. 45 is omitted.

In the circuit data information in FIG. 47, the fan-in number, fan-out number, fan-in signal name and fan-out signal name are given for each of the circuit elements that make up the logic circuit. For example, since the fan-in number of AND1 is 2, it is seen that the signal names from the first to the second, which is SIG2, are fan-in signal names and the rest are fan-out signal names. The same is true for the other AND circuits. The logic simulation section 65 simulates the logic circuit in FIG. 45 referring to the circuit data information in FIG. 47.

FIG. 48 shows an example of a circuit change information table that the circuit change section 60 creates in accordance with circuit change commands input by the user. The circuit change information table in FIG. 48 is only created for the part that is changed in a format similar to that of the circuit data information. In FIG. 48, the fan-in number of AND2 has been changed from 2 to 1, and SIG4 has been deleted from the list of signal names. In addition, the fan-in number of AND3 has been changed from 2 to 3, and SIG4 has been added to the start of its signal name list. This circuit change information table corresponds to the change from the circuit shown in FIG. 45 to the circuit shown in FIG. 46.

FIG. 49 shows the circuit data information changed by the circuit change section 60 using the circuit change information table in FIG. 48. As shown in FIG. 49, in the changed circuit data information, the logical element data relevant to the change have been replaced by the contents of the circuit change information table. The circuit data information in FIG. 49 represents the logic circuit in FIG. 46. Once the circuit data information has been changed, the logic simulation section 65 automatically simulates the changed logic circuit.

Figure 50:
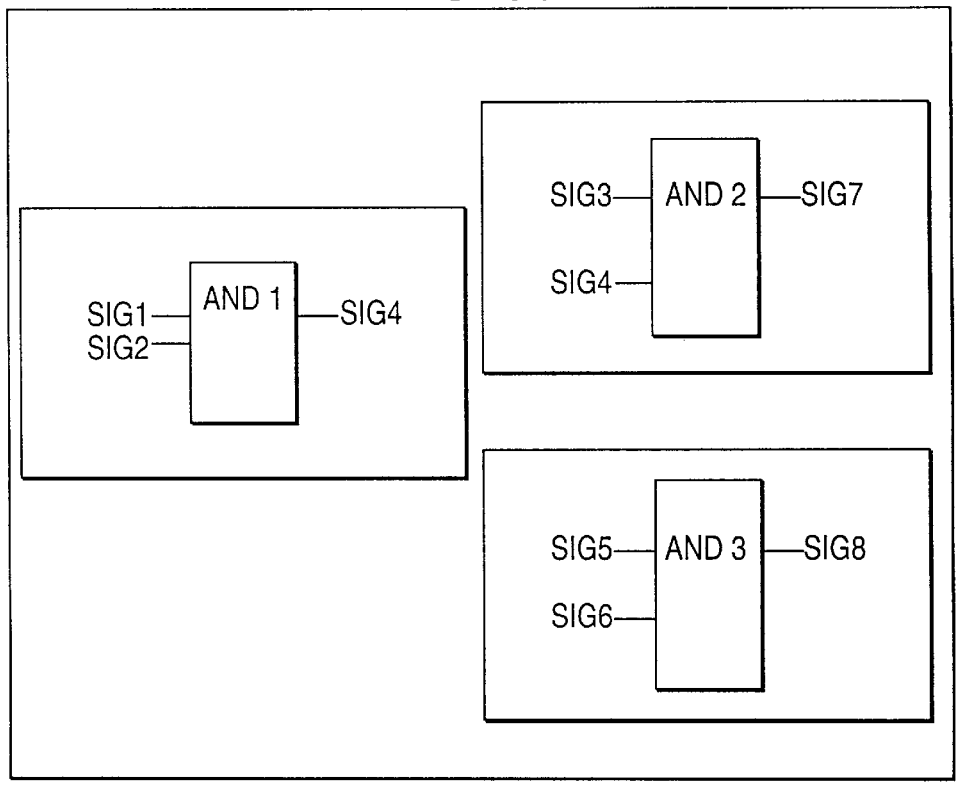
FIG. 50 A figure showing an example of a logic circuit display screen.
Figure 51:
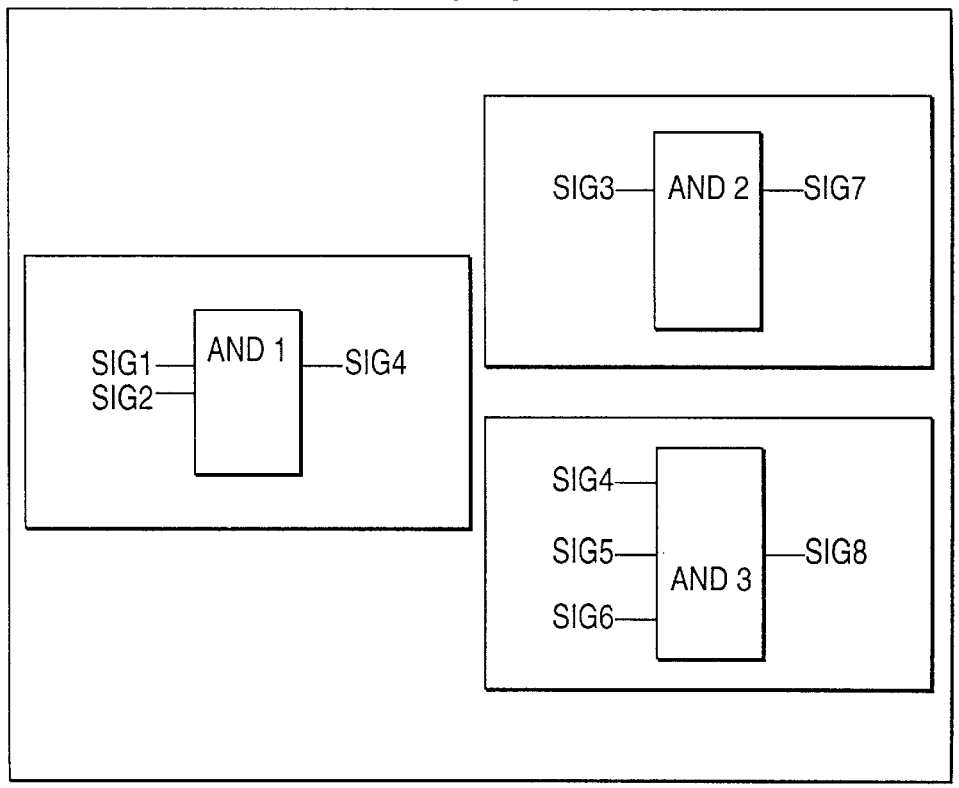
FIG. 51 A figure showing the logic circuit display screen after a change.

FIG. 50 and FIG. 51 show examples of the screen on which the circuit inside display section 53 has displayed the logic circuit referring to the circuit data information. FIG. 50 shows the screen on which the display is based on the circuit data information of FIG. 47; FIG. 51 shows the screen on which the display is based on the circuit data information of FIG. 49, after the change. In FIG. 50 and FIG. 51, the input signal and the output signal for each logical element are shown.

FIG. 52 and FIG. 53 show examples of screens on which the results display section displays the simulation results, referring to the window management table, the signal value management table and the circuit data information. On the upper part in FIG. 52 and FIG. 53, CLK indicates the clock count and LVL indicates the observation timing within one clock cycle. The lower part gives the observed values, logic 0 or logic 1, of SIG1, SIG2, SIG3, SIG4, SIG5, SIG6, SIG7 and SIG8 for each clock.

FIG. 52 shows the simulation results up to CLK=02 in the logic circuit of FIG. 45. At this time, if the object of simulation is assumed to have changed as shown in FIG. 46, then the next display will be as shown in FIG. 53. Comparing the signal values up to CLK=02 with the ones from CLK=03 (the position marked by *) in FIG. 53, the values of SIG1, SIG2, SIG3, SIG4, SIG5 and SIG6 are unchanged, but the values of SIG7 and SIG8 have changed because the inputs to AND2 and AND3 have been changed.

Next, let us explain an example of change of the trace point, referring to FIGS. 54 to 57.

Figure 54:
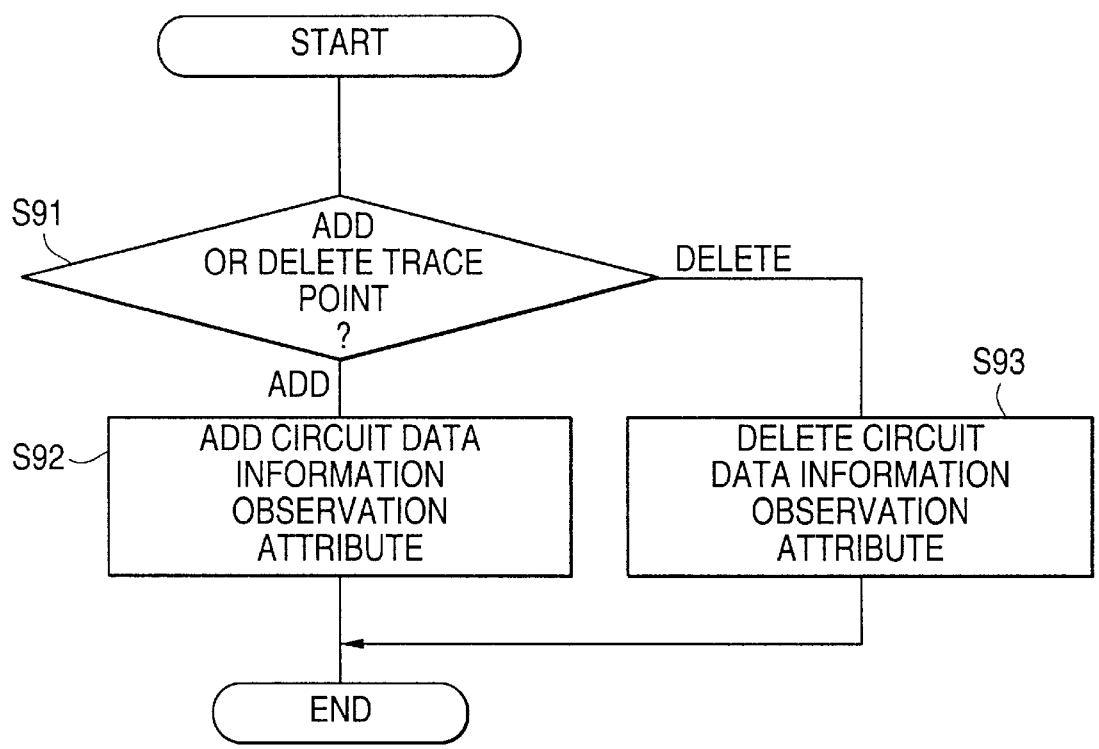
FIG. 54 A flow chart of trace point change processing.

FIG. 54 is a flow chart of the trace point change processing. In FIG. 54, when the processing starts, the trace point change section 58 judges whether a trace point is to be added or deleted according to the analysis result received from the command analysis section 57 (step S91). If a trace point is to be added, a new trace point is added to the observed attributes of the circuit data information held by the circuit data information holding section 64 (step S92), and the processing ends. If a trace point is to be deleted, then a trace point is deleted from the observed attributes of the circuit data information (step S93), and the processing ends.

Figures 55, 56:
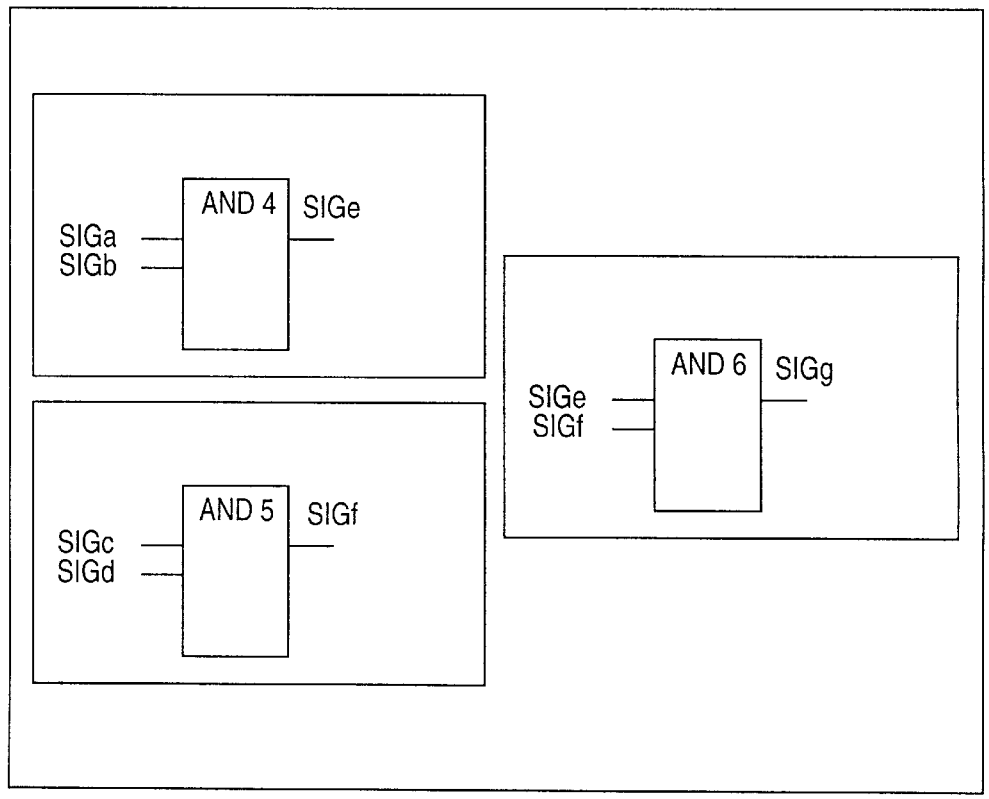
FIG. 55 A figure showing a logic circuit display screen after gate addition.
FIG. 56 A figure showing an example of a screen display of a simulation result.

FIG. 55 shows the display screen when a new gate circuit AND6 is added to the logic circuit consisting of AND4 and AND5. In FIG. 55, AND4 receives inputs SIGa and SIGb and outputs SIGe; AND5 receives inputs SIGc and SIGd and outputs SIGf; AND6 receives inputs SIGe and SIGf and outputs SIGg. In other words, AND6 has been added on the output side of AND4 and AND5. At this time, a circuit change information table that shows the AND6 circuit data information is created from the input circuit change command, and the circuit data information that is the object of the simulation is changed.

FIG. 56 shows the simulation result display screen before AND6 is added. FIG. 57 shows the simulation result display screen after the addition. In FIG. 56, TRACE SIGg ON is a command input by the user after AND6 is added, instructing that SIGg, which is the output signal of AND6, is added as a new object of observation (trace point). In FIG. 56, SIGg is not observed, but in FIG. 57 SIGg has been added as a trace point, and its signal value is observed from the clock to which * has been added.

Figure 58:
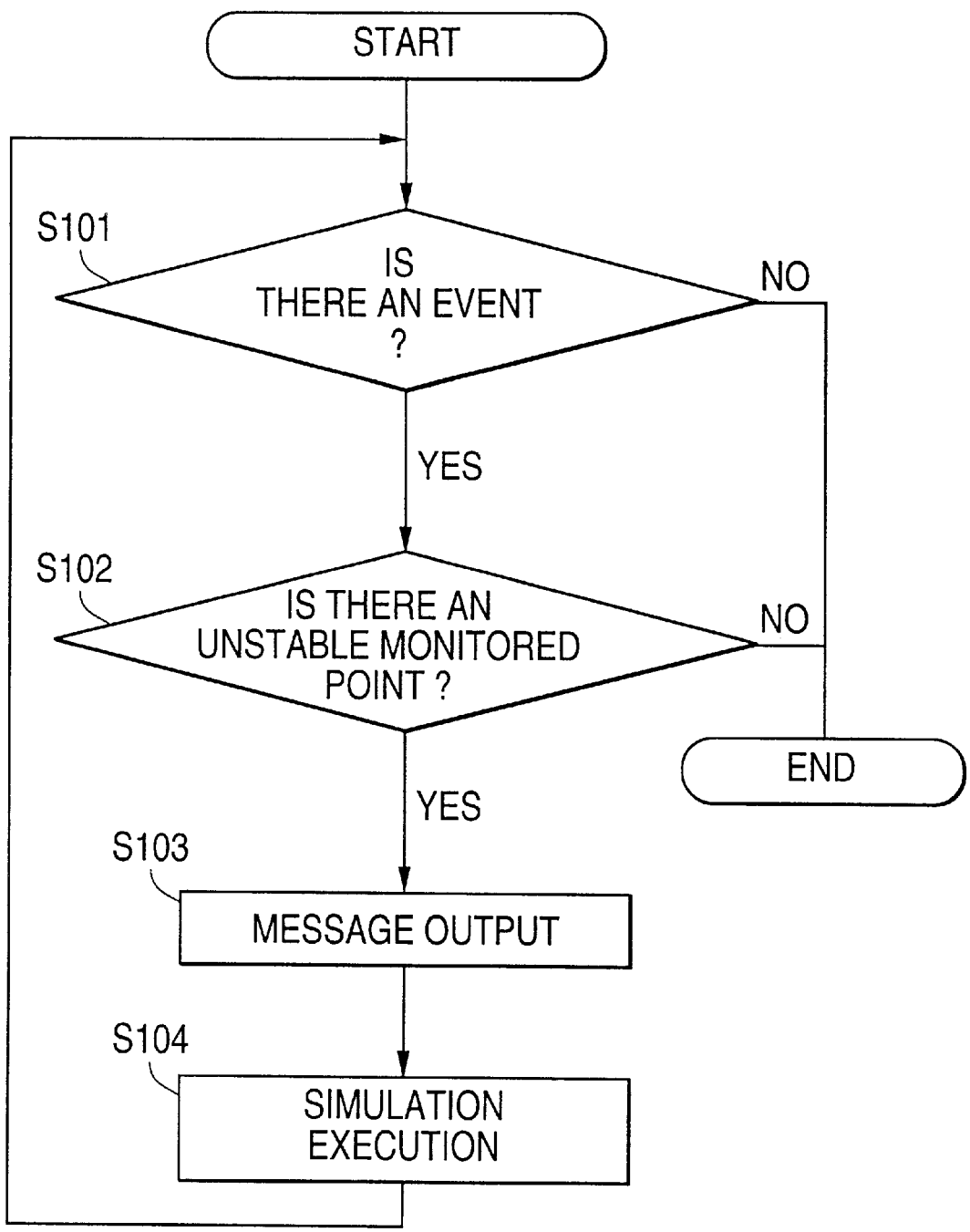
FIG. 58 A flow chart of unstable condition monitoring processing.

Next, we explain monitoring of unstable circuit states, referring to FIGS. 58 to 60.

FIG. 58 is a flow chart of the processing to monitor unstable states. In FIG. 58, when the processing starts the logical simulation section 65 judges whether or not an event has occurred during execution of the simulation (step S101). If an event has occurred, the system investigates as to whether or not that is an event at the signal terminal (monitored point) that is the object of the unstable state monitoring registered in the monitoring point table. If the event occurred at a monitored point, the results display section 64 displays a message concerning the state of that signal on the screen (step S103), the logical simulation section 65 continues the simulation (step S104) and then the processing starting with step S101 is repeated.

If an event is not found to have occurred in step S101 or of an event that has occurred is found to have been unrelated to the monitored point in step S102, then the monitoring ends.

FIG. 59 shows the screen display of the result of simulation concerning the part of the circuit consisting of AND4 and AND5 in FIG. 55. When the user inputs the command ONSTB 99 in the state shown in FIG. 59, the command analysis section 57 transmits its content to the monitoring setting section 62. The monitoring setting section 62 then sets the timing level at which the signal value is to be observed to 99 in the monitored point table.

After that, the logic simulation section 65 monitors the circuit while referring to the monitored point table. When an event that indicates an unstable state occurs at the monitored point, the results display section 64 outputs a message. Here, "unstable state at a monitored point" means a state in which, for example, a monitored signal value alternates between 0 and 1 without stabilizing.

FIG. 60 shows an example of a message that indicates that an unstable state has been detected. In FIG. 60 an unstable state was detected at the clock time where a + mark has been added, and a message has been displayed. From the message, it is learned that the monitored point SIGz is unstable and its value was logic 0 at the time LVL 99 of CLK 10. Here, SIGz corresponds to a signal other than the inputs and outputs of AND4 and AND5.

Figure 61:
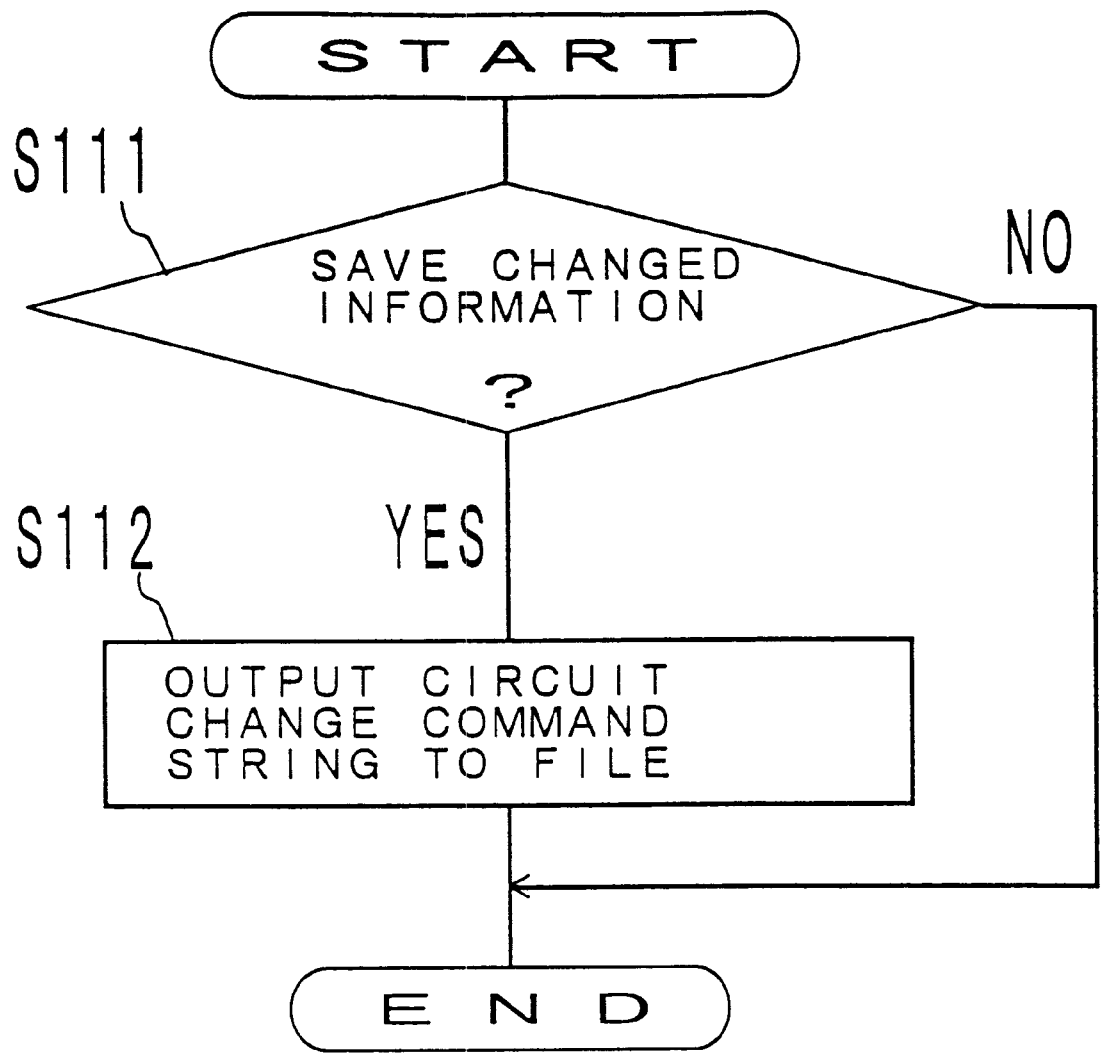
FIG. 61 A flow chart of circuit change command string output processing.

FIG. 61 is a flow chart of the output processing of the circuit change command string in the circuit change command string holding section 56. In FIG. 61, when the processing is started first the input/output control means 51 asks the user whether or not information related to the circuit change is to be saved (step S111). If the user wants the information to be saved, then the circuit change command string is read out from the circuit change command string holding section 56, and then output to a file in an external memory device (step S112) to complete the processing. If the user does not want the information to be saved, then the processing ends right there.

The data base can be changed similarly, using the circuit change command string file that is output.

The circuit change information table that is held in the circuit change information table holding section 61 can be output in place of the circuit change command string. In this case also, the changed contents can be reflected in the data base using the file that is output.

As has been explained in detail above, according to this invention it is possible to change the simulation model itself directly, making it possible to process changes in a simulation model for a large scale circuit at high speed. In this case, since the simulation model has been expanded to be flat in the AND, OR level, we obtain the advantages that the file structure becomes simple, and, at the same time, the size of a file becomes compact. In addition, it becomes possible to correct the logic tentatively, check the appropriateness of the logic change by simulation and then change the logical data base, contributing greatly to improvement of the logic circuit design efficiency.

What is claimed is:

1. A logic simulation system in a system that uses logic circuit data stored in a logic data base to generate a simulation model and performs a logic simulation, comprising:
    a macro library device to store macro level data corresponding to the logic circuit data stored in the logic data base;
    a display device to display the simulation model and to receive a change instruction for the simulation model interactively from a designer;
    a simulation model creation device to expand the logic circuit data in a hierarchical format, including a plurality of hierarchical levels, into a flat data structure, and to create the simulation model as a gate level simulation model having the flat data structure that does not have hierarchical levels based on the logic circuit data stored in the logic circuit data base and permits a simulation to be executed immediately;
    a simulation model storage device to store the simulation model; and
    a simulation model changing device to change the simulation model directly in the flat data structure in said simulation model storage device to allow a simulation for the simulation model after change when changing a part of a logic circuit corresponding to the logic circuit data, without changing the logic circuit data stored in the logic data base, including
        a graphic screen display instruction change device to receive the change instruction for the simulation model from said display device and a back trace processing request from the designer with a specified input pin, to output simulation model modification information for an old simulation model using the gate level simulation model created by said simulation model creation device and the macro level data stored in said macro library device, and to control a display process to cause said display device to display a macro level simulation model, including macro blocks, each of the macro blocks including an input pin with a specific macro block connected to the specified input pin displayed; and
        a new simulation model generating device to receive said simulation model modification information output from said graphic screen display instruction change device, to change the old simulation model, and to output a new simulation model.

2. A logic simulation system in a system that uses logic circuit data stored in a logic data base to generate a simulation model and performs a logic simulation, comprising;

a macro library device to store macro level data corresponding to the logic circuit data stored in the logic data base, a display device to display the simulation model and to receive a change instruction for the simulation model interactively from a designer;

a simulation model creation device to expand the logic circuit data in a hierarchical format, including a plurality of hierarchical levels, into a flat data structure, and to create the simulation model as a gate level simulation model having the flat data structure that does not have hierarchical levels based on the logic circuit data stored in the logic circuit data base and permits a simulation to be executed immediately;

a simulation model storage device to store the simulation model; and a simulation model changing device to change the simulation model directly in the flat data structure in said simulation model storage device to allow a simulation for the simulation model after change when changing a part of a logic circuit corresponding to the logic circuit data, without changing the logic circuit data stored in the logic data base, including a graphic screen display instruction change device to receive the change instruction for the simulation model from said display device and a forward trace processing request from the designer with a specified output pin, to output simulation model modification information for an old simulation model using the gate level simulation model created by said simulation model creation device and the macro level data stored in said macro library device, and to control a display process t6 cause said display device to display a macro level simulation model, including macro blocks, each of the macro blocks including an output pin with a specific macro block connected to the specified output pin displayed; and a new simulation model generating device to receive said simulation model modification information output from said graphic screen display instruction change device, to change the old simulation model, and to output a new simulation model.

3. A logic simulation system in a system that uses logic circuit data stored in a logic data base to generate a simulation model and performs a logic simulation, comprising:

a macro library device to store macro level data corresponding to the logic circuit data stored in the logic data base;

a display device to display the simulation model and to receive a change instruction for the simulation model interactively from a designer;

a simulation model creation device to expand the logic circuit data in a hierarchical format, including a plurality of hierarchical levels, into a flat data structure, and to create the simulation model as a gate level simulation model having the flat data structure that does not have hierarchical levels based on the logic circuit data stored in the logic circuit data base and permits a simulation to be executed immediately;

a simulation model storage device to store the simulation model; and a simulation model changing device to change the simulation model directly in the flat data structure in said simulation model storage device to allow a simulation for the simulation model after change when changing a part of a logic circuit corresponding to the logic circuit data, without changing the logic circuit data stored in the logic data base, including a graphic screen display instruction change device to receive the change instruction for the simulation model from said display device and an output pin connection change request from the designer with a specified first output pin of a first macro block and a specified second output pin of a second macro block, to separate a specific connecting circuit connected to the specified first output pin from the specified first output pin, to connect the specific connecting circuit to the specified second output pin, to output simulation model modification information for an old simulation model using the gate level simulation model created by said simulation model creation device and the macro level data stored in said macro library device, and to cause said display device to display a macro level simulation model with macro blocks, each of the macro blocks including an output pin, and a connecting circuit connected to the output pin; and a new simulation model generating device to receive said simulation model modification information output from said graphic screen display instruction change device, to change the old simulation model, and to output a new simulation model.

4. A logic simulation system in a system that uses logic circuit data stored in a logic data base to generate a simulation model and performs a logic simulation, comprising:

a macro library device to store macro level data corresponding to the logic circuit data stored in the logic data base;

a display device to display a macro level simulation model with macro blocks, each of the macro blocks including an output pin and a connecting circuit connected to the output pin, and to receive a change instruction for the simulation model interactively from a designer;

a simulation model creation device to expand the logic circuit data in a hierarchical format, including a plurality of hierarchical levels, into a flat data structure, and to create the simulation model as a gate level simulation model having the flat data structure that does not have hierarchical levels based on the logic circuit data stored in the logic circuit data base and permits a simulation to be executed immediately;

a simulation model storage device to store the simulation model; and a simulation model changing device to change the simulation model directly in the flat data structure in said simulation model storage device to allow a simulation for the simulation model after change when changing a part of a logic circuit corresponding to the logic circuit data, without changing the logic circuit data stored in the logic data base, including a graphic screen display instruction change device to receive the change instruction for the simulation model from said display device and an output pin connection change request from the designer with a specified first output pin of a first macro block and a specified second output pin of a second macro block, to interchange the connecting circuit connected to the specified first output pin with the connecting circuit connected to the specified second output pin, to output simulation model modification information for an old simulation model using the gate level simulation model created by said simulation model creation device a nd the macro level data stored in said macro library device, and to cause said display device to display the macro level simulation model; and a new simulation model generating device to receive said simulation model modification information output from said graphic screen display instruction change device, to change the old simulation model, and to output a new simulation model.

\* \* \* \* \*

UNITED STATES PATENT AND TRADEMARK OFFICE
CERTIFICATE OF CORRECTION

PATENT NO. : 6,154,719
DATED : November 28, 2000
INVENTOR(S) : Minoru Saitoh, et al.

Page 1 of 1

It is certified that error appears in the above-identified patent and that said Letters Patent is hereby corrected as shown below:

Column 23,
Line 38, change "t6" to -- to --.

Column 25,
Line 9, change "a nd" to -- and --.

Signed and Sealed this

Twenty-fifth Day of September, 2001

Attest:

*Nicholas P. Godici*

NICHOLAS P. GODICI
*Attesting Officer*    *Acting Director of the United States Patent and Trademark Office*